(12) United States Patent
Watanabe

(10) Patent No.: US 12,519,013 B2
(45) Date of Patent: Jan. 6, 2026

(54) SEMICONDUCTOR DEVICE HAVING EDGE SEAL AND METHOD OF MAKING THEREOF WITHOUT METAL HARD MASK ARCING

(71) Applicant: SANDISK TECHNOLOGIES LLC, Addison, TX (US)

(72) Inventor: Kazuto Watanabe, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 595 days.

(21) Appl. No.: 17/932,887

(22) Filed: Sep. 16, 2022

(65) Prior Publication Data
US 2024/0096694 A1    Mar. 21, 2024

(51) Int. Cl.
*H01L 21/768* (2006.01)
*H01L 21/311* (2006.01)

(52) U.S. Cl.
CPC .. *H01L 21/76831* (2013.01); *H01L 21/31144* (2013.01); *H01L 21/76805* (2013.01); *H01L 21/76843* (2013.01)

(58) Field of Classification Search
CPC ......... H01L 21/76831; H01L 21/31144; H01L 21/76805; H01L 21/76843; H10B 43/10; H10B 43/27; H10B 43/50
See application file for complete search history.

(56) References Cited

U.S. PATENT DOCUMENTS

| | | |
|---|---|---|
| 10,115,681 B1 | 10/2018 | Ariyoshi |
| 10,319,635 B2 | 6/2019 | Nosho et al. |
| 10,381,373 B2 | 8/2019 | Okizumi et al. |
| 10,475,804 B1 | 11/2019 | Nishikawa et al. |
| 10,600,800 B2 | 3/2020 | Nishikawa et al. |
| 10,665,607 B1 | 5/2020 | Sugiura et al. |
| 11,069,707 B2 | 7/2021 | Tanabe et al. |
| 11,289,388 B2 | 3/2022 | Tanamachi et al. |

(Continued)

OTHER PUBLICATIONS

ISR—Notification of Transmittal of the International Search Report and Written Opinion of the International Searching Authority for International Patent Application No. PCT/US2023/025856, mailed Aug. 29, 2023, 13 pages.
Sano, M. et al., "Semiconductor Device Having Edge Seal and Method of Making Thereof Without Metal Hard Mask Arcing," U.S. Appl. No. 17/932,907, filed Sep. 16, 2022.
IPRP-WO—Notification Concerning Transmittal of International Preliminary Report on Patentability and Written Opinion of the International Searching Authority for International Patent Application No. PCT/US2023/025856, mailed Mar. 27, 2025, 10 pages.

(Continued)

*Primary Examiner* — Patricia D Valenzuela
(74) *Attorney, Agent, or Firm* — THE MARBURY LAW GROUP PLLC

(57) ABSTRACT

A conductive hard mask layer can be patterned with peripheral discrete openings. An anisotropic etch process can be performed to form peripheral discrete via cavities, which are subsequently expanded to form a continuous moat trench. An edge seal structure can be formed in the continuous moat trench. Alternatively, a conductive bridge structure may be formed prior to formation of a patterned conductive hard mask layer, and a moat trench can be formed around a periphery of the semiconductor die while the conductive bridge structure provides electrical connection between an inner portion and an outer portion of the conductive hard mask layer. The entire conductive hard mask layer can be electrically connected to a semiconductor substrate to reduce or prevent arcing during an anisotropic etch process that forms the peripheral discrete via cavities or the moat trench.

12 Claims, 84 Drawing Sheets

(56) References Cited

U.S. PATENT DOCUMENTS

| | | |
|---|---|---|
| 11,289,504 B2 | 3/2022 | Yang et al. |
| 11,322,466 B2 | 5/2022 | Okina |
| 11,342,286 B2 | 5/2022 | Kaminaga et al. |
| 12,137,553 B2 | 11/2024 | Gupta et al. |
| 12,283,544 B2 | 4/2025 | Tachi |
| 2010/0250542 A1 | 9/2010 | Fujimaki |
| 2016/0155659 A1 | 6/2016 | Yang |
| 2018/0342455 A1 | 11/2018 | Nosho et al. |
| 2018/0366487 A1 | 12/2018 | Okizumi et al. |
| 2020/0006358 A1 | 1/2020 | Nishikawa et al. |
| 2020/0402992 A1* | 12/2020 | Otsu .................. H10B 43/10 |
| 2020/0411542 A1* | 12/2020 | Yang .................. H10B 41/27 |
| 2021/0126008 A1 | 4/2021 | Tanabe et al. |
| 2022/0352146 A1 | 11/2022 | Ting et al. |

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 17/126,504, filed Dec. 18, 2020, SanDisk Technologies LLC.

U.S. Appl. No. 17/807,819, filed Jun. 20, 2022, SanDisk Technologies LLC.

USPTO Office Communication, Notice of Allowance for U.S. Appl. No. 17/932,907, mailed May 20, 2025, 17 pages.

USPTO Office Communication, Notice of Allowance for U.S. Appl. No. 17/932,907, mailed Jul. 2, 2025, 11 pages.

* cited by examiner

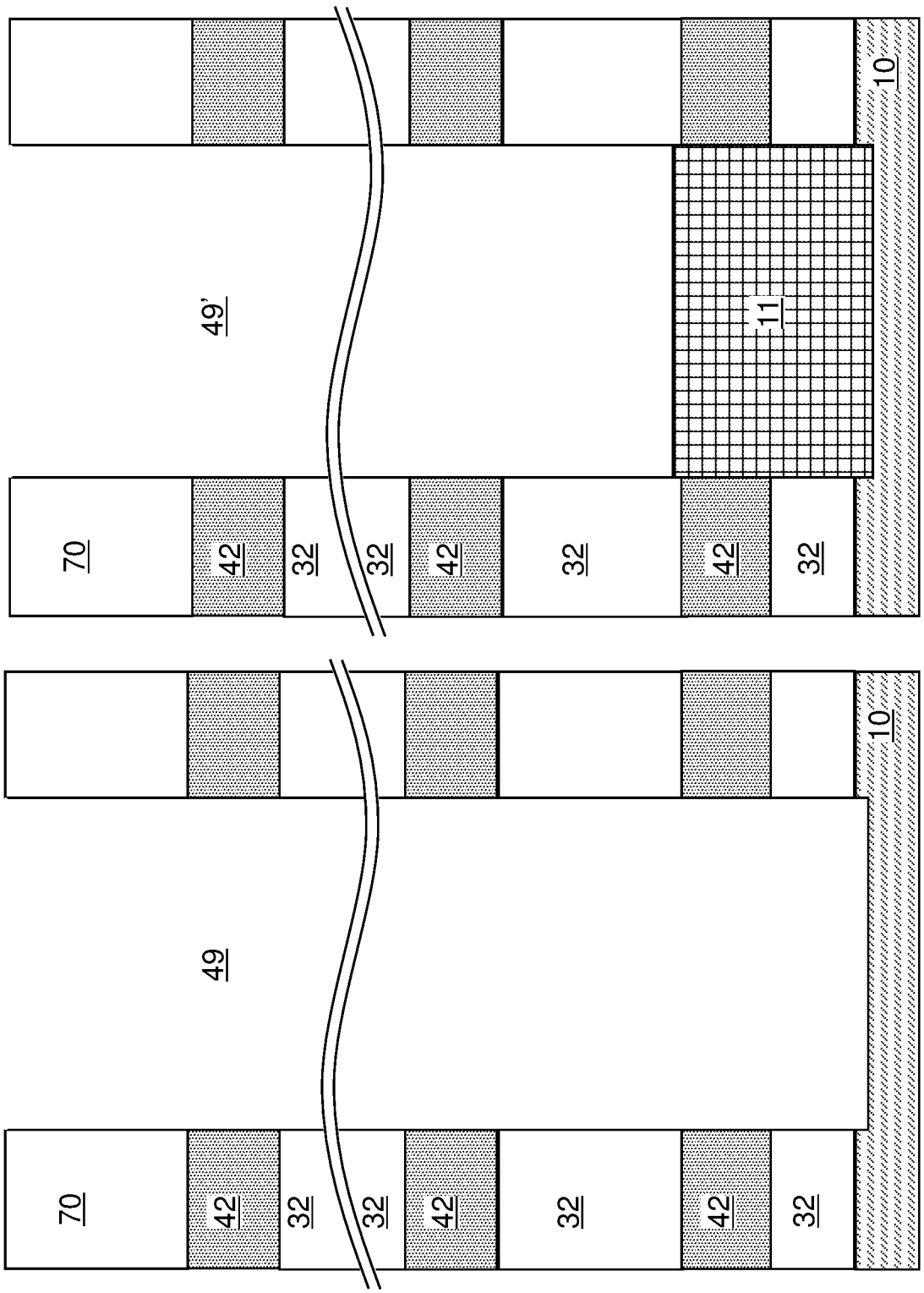

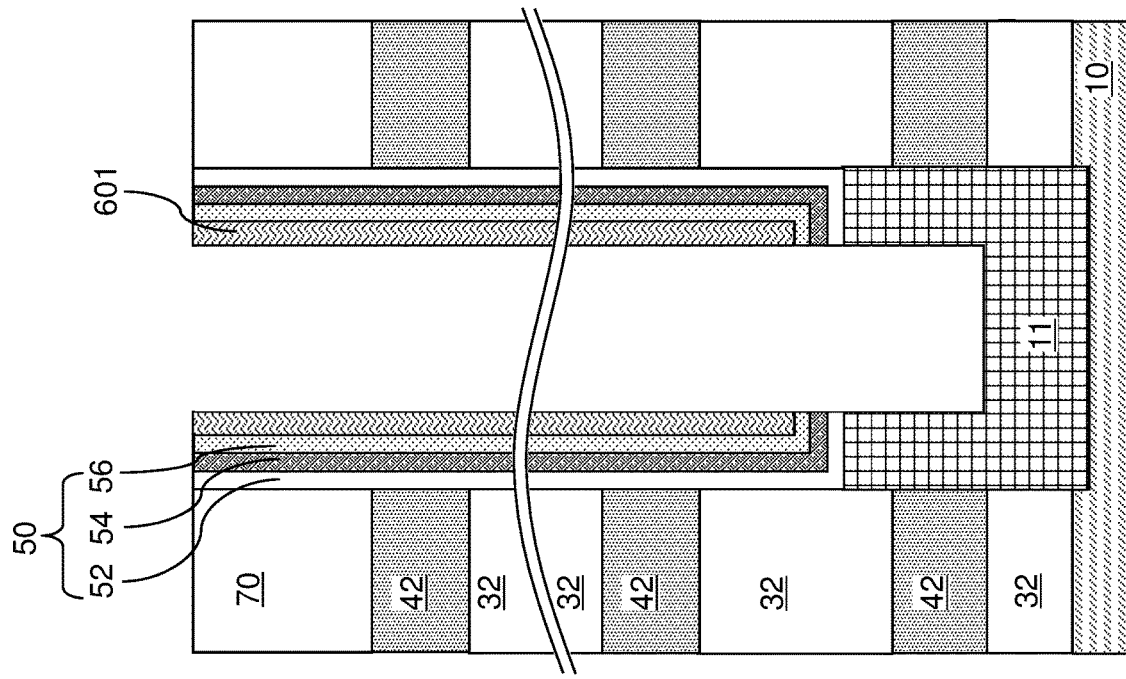
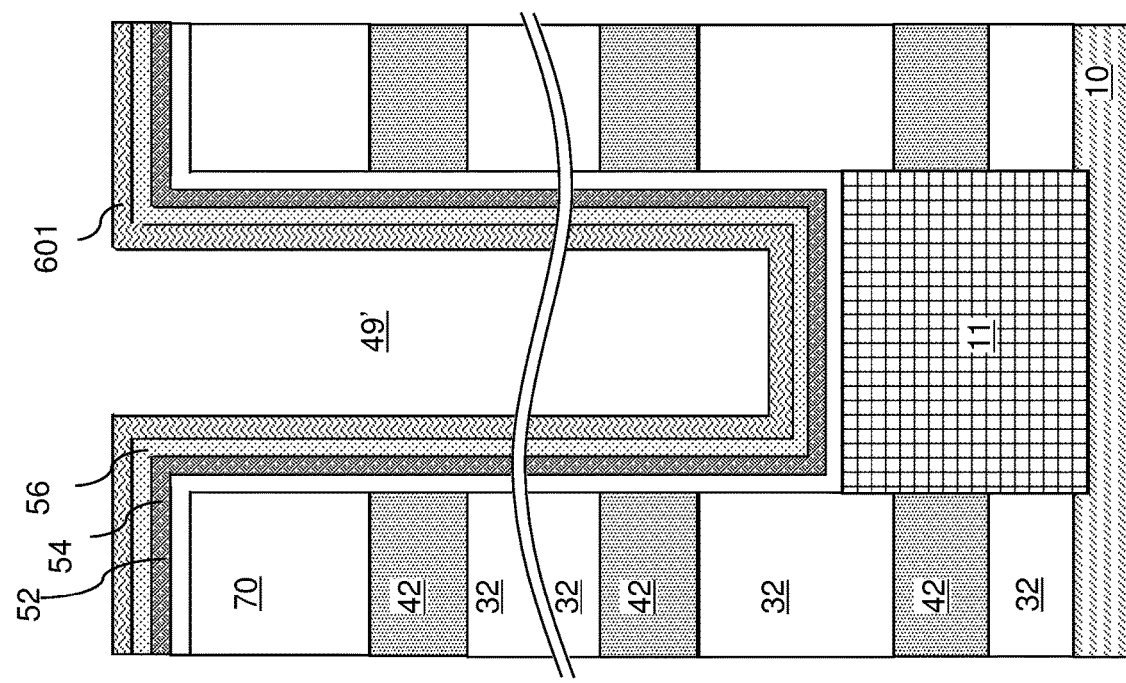

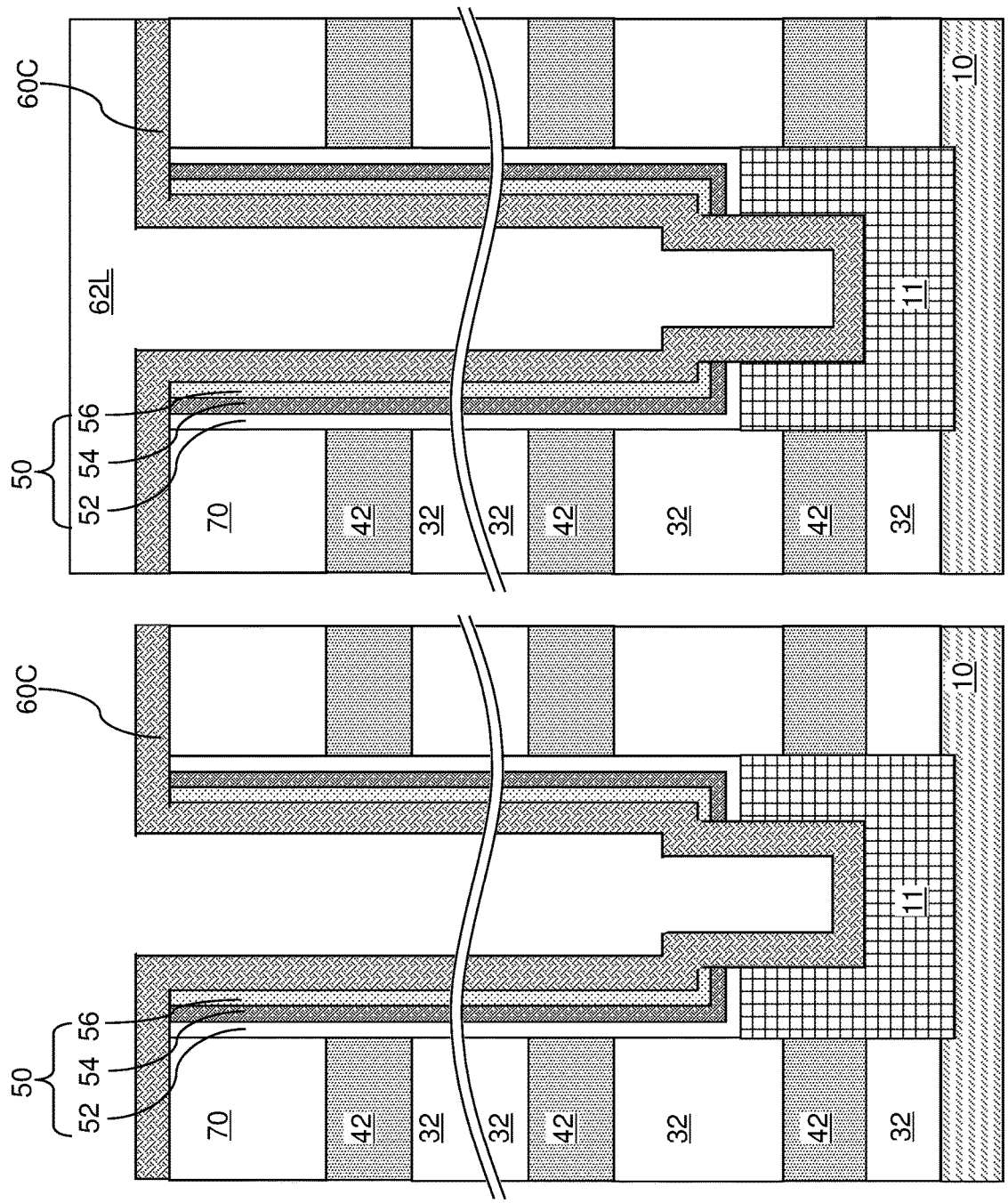

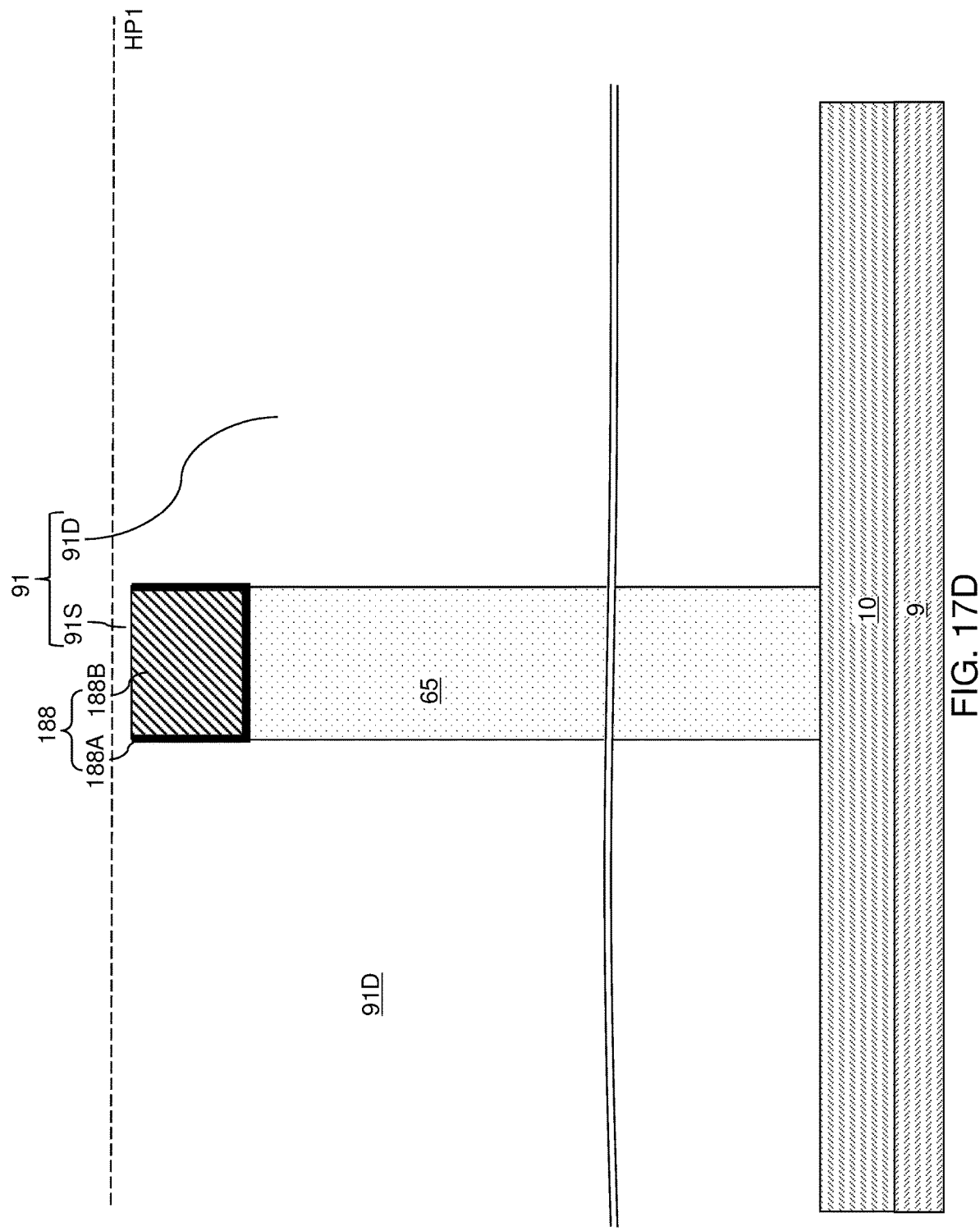

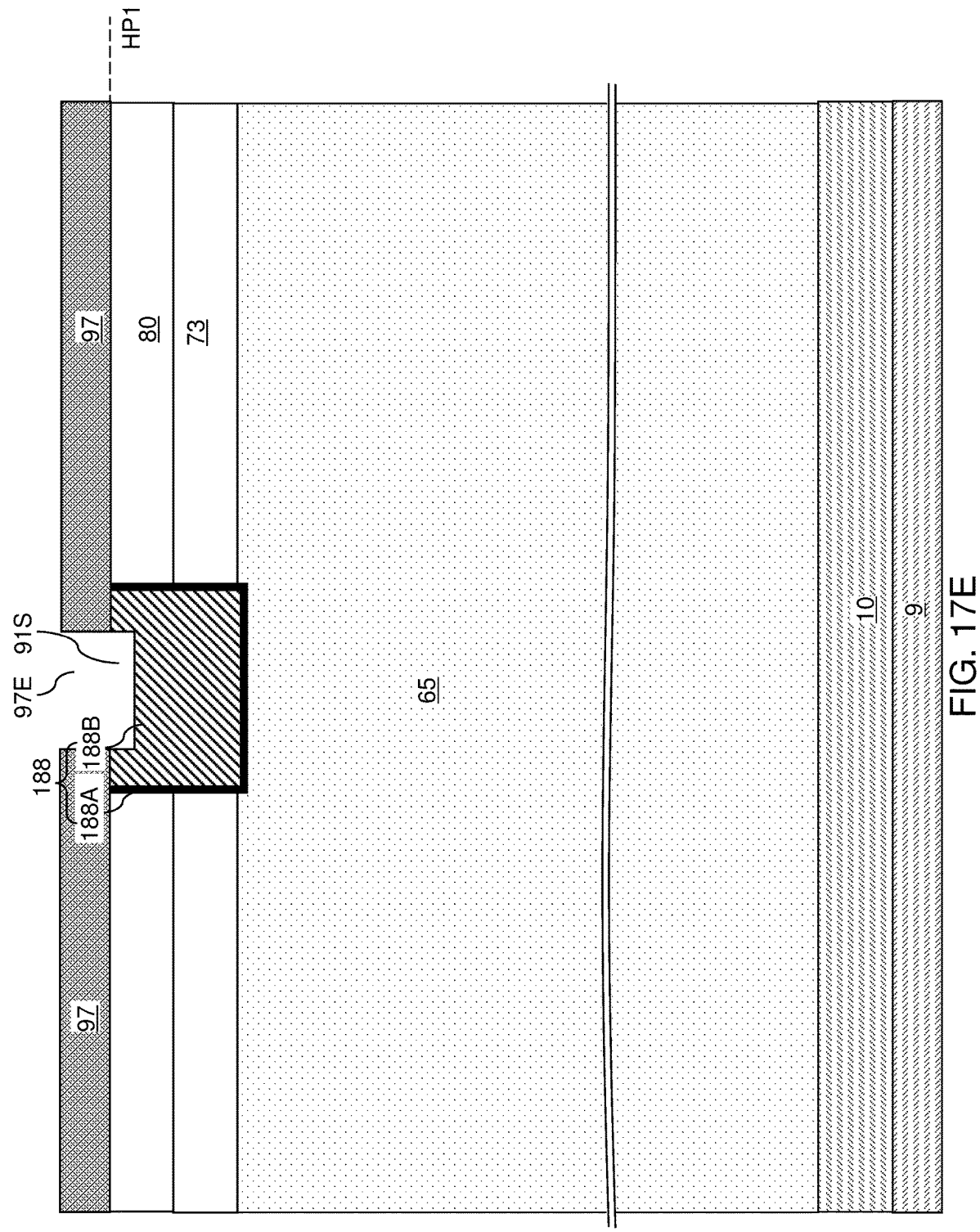

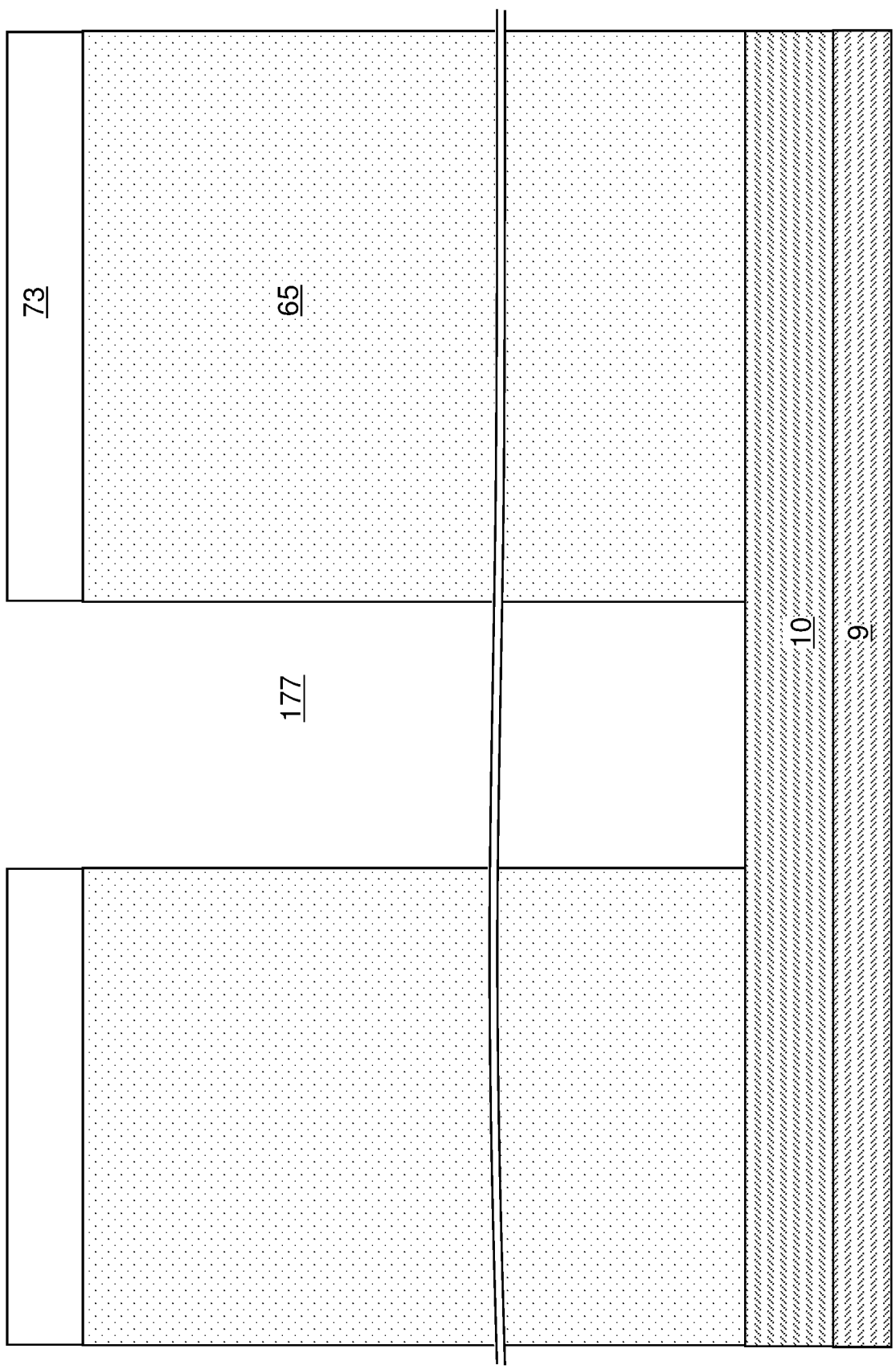

SEMICONDUCTOR DEVICE HAVING EDGE SEAL AND METHOD OF MAKING THEREOF WITHOUT METAL HARD MASK ARCING

FIELD

The present disclosure relates generally to the field of semiconductor devices, and particularly to methods for preventing metal hard mask arcing during manufacture of an edge seal for semiconductor devices, and to semiconductor devices formed employing such methods.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of making a semiconductor structure is provided, which comprises: forming a semiconductor die including semiconductor devices and a dielectric material portion over a semiconductor substrate, wherein the dielectric material portion laterally surrounds the semiconductor devices; forming a conductive hard mask layer over the semiconductor devices and the dielectric material portion; forming a set of peripheral discrete openings through the conductive hard mask layer along a periphery of the dielectric material portion; forming a set of peripheral discrete via cavities through the dielectric material portion down to a top surface of the semiconductor substrate by performing an anisotropic etch process that etches a material of the dielectric material portion underneath the set of peripheral discrete openings; forming a continuous moat trench that laterally surrounds an inner region of the dielectric material portion by isotropically expanding the set of peripheral discrete via cavities; and forming a conductive edge seal structure by filling the continuous moat trench with at least one conductive material.

According to another aspect of the present disclosure, a semiconductor die comprises semiconductor devices located over a semiconductor substrate; an inner dielectric material portion laterally surrounding the semiconductor devices; a conductive edge seal structure that laterally surrounds the inner dielectric material portion, vertically extends from the semiconductor substrate at least to a horizontal plane including a topmost surface of the inner dielectric material portion, and has laterally-undulating inner sidewalls and laterally-undulating outer sidewalls; and an outer dielectric material portion laterally surrounding the conductive edge seal structure.

According to yet another aspect of the present disclosure, a method of making a semiconductor structure comprises forming a semiconductor die including semiconductor devices and a dielectric material portion over a semiconductor substrate, wherein the dielectric material portion laterally surrounds the semiconductor devices; forming a contact-level dielectric layer over the semiconductor devices and the dielectric material portion; forming a conductive bridge structure through or underneath the contact-level dielectric layer in a peripheral region of the semiconductor die; forming a conductive hard mask layer over the contact-level dielectric layer and the conductive bridge structure; forming an edge seal opening through the conductive hard mask layer along a periphery of the dielectric material portion, wherein an inner portion of the conductive hard mask layer located within an area enclosed by an inner periphery of the edge seal opening is electrically connected to the semiconductor substrate through the conductive bridge structure and through a vertically-extending portion of the conductive hard mask layer; forming a continuous moat trench by anisotropically etching regions of the dielectric material portion that underlie the edge seal opening; and forming a conductive edge seal structure by filling the continuous moat trench with at least one conductive material.

According to still another aspect of the present disclosure, a semiconductor die comprises semiconductor devices located over a semiconductor substrate; an inner dielectric material portion laterally surrounding the semiconductor devices; a contact-level dielectric layer overlying the semiconductor devices and the inner dielectric material portion; a conductive bridge structure having at least one top surface located within a horizontal plane including a top surface of the contact-level dielectric layer; a conductive edge seal structure that laterally surrounds the inner dielectric material portion, vertically extends from the semiconductor substrate to the horizontal plane including the top surface of the contact-level dielectric layer, and extending over and contacting at least one surface of the conductive bridge structure; and an outer dielectric material portion laterally surrounding the conductive edge seal structure.

BRIEF DESCRIPTION OF THE DRAWINGS

FIGS. 5A-5H are sequential schematic vertical cross-sectional views of a memory opening within the first exemplary structure during formation of a memory stack structure, an optional dielectric core, and a drain region therein according to an embodiment of the present disclosure.

FIG. 17D is a vertical cross-sectional view of the second exemplary structure along the vertical plane D-D' of FIG. 17B.

FIG. 17E is a vertical cross-sectional view of the second exemplary structure along the vertical plane E-E' of FIG. 17B.

FIG. 19D is a vertical cross-sectional view of the third exemplary structure along the vertical plane D-D' of FIG. 19B.

DETAILED DESCRIPTION

Figure 1:
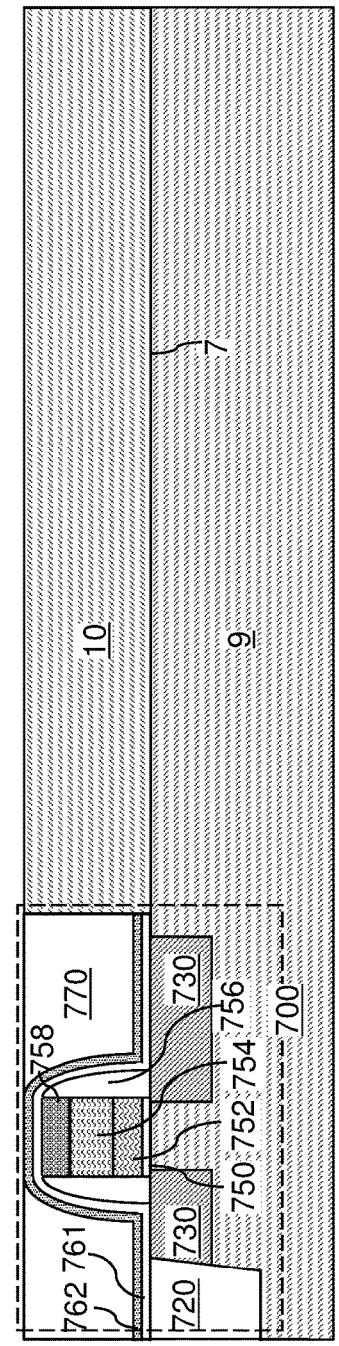
FIG. 1 is a schematic vertical cross-sectional view of a first exemplary structure after formation of at least one peripheral device and a semiconductor material layer according to an embodiment of the present disclosure.

As discussed above, the present disclosure is directed to methods for preventing metal hard mask arcing during manufacture of an edge seal for semiconductor devices, and to semiconductor devices formed employing such methods, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9, such as a silicon wafer, and an optional semiconductor material layer 10, such as a doped well in the silicon wafer or an epitaxial silicon layer grown on the silicon wafer. The substrate can have a major surface 7, which can be, for example, a topmost surface of the substrate semiconductor layer 9. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "conductive material" refers to a conductive material including at least one conductive element therein. All measurements for electrical conductivities are made at the standard condition.

At least one peripheral device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, during, or after, formation of the at least one peripheral device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one peripheral device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
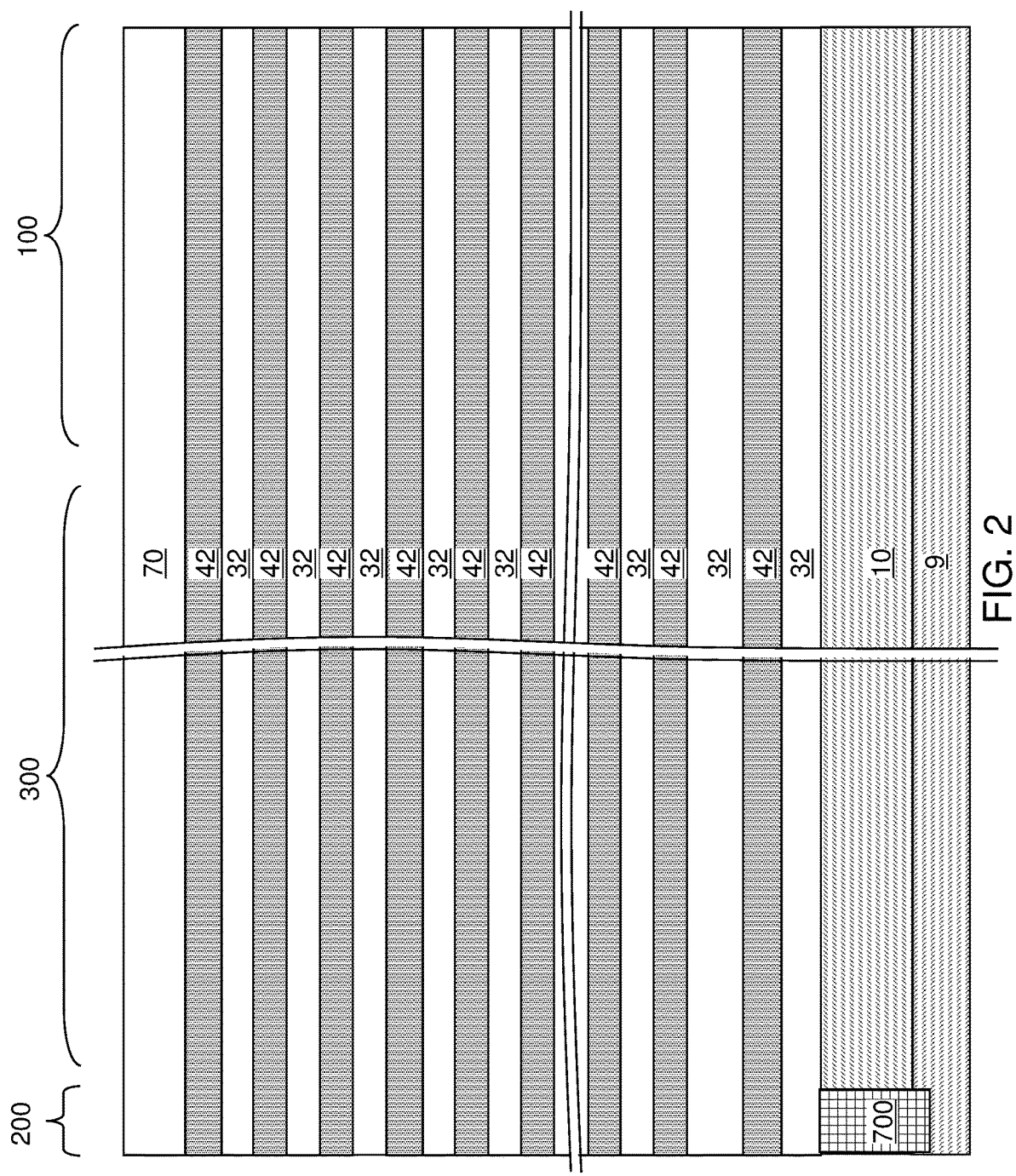
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of only silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While an embodiment is described in which the spacer material layers are sacrificial material layers 42 that are subsequently replaced with electrically conductive layers, alternative embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
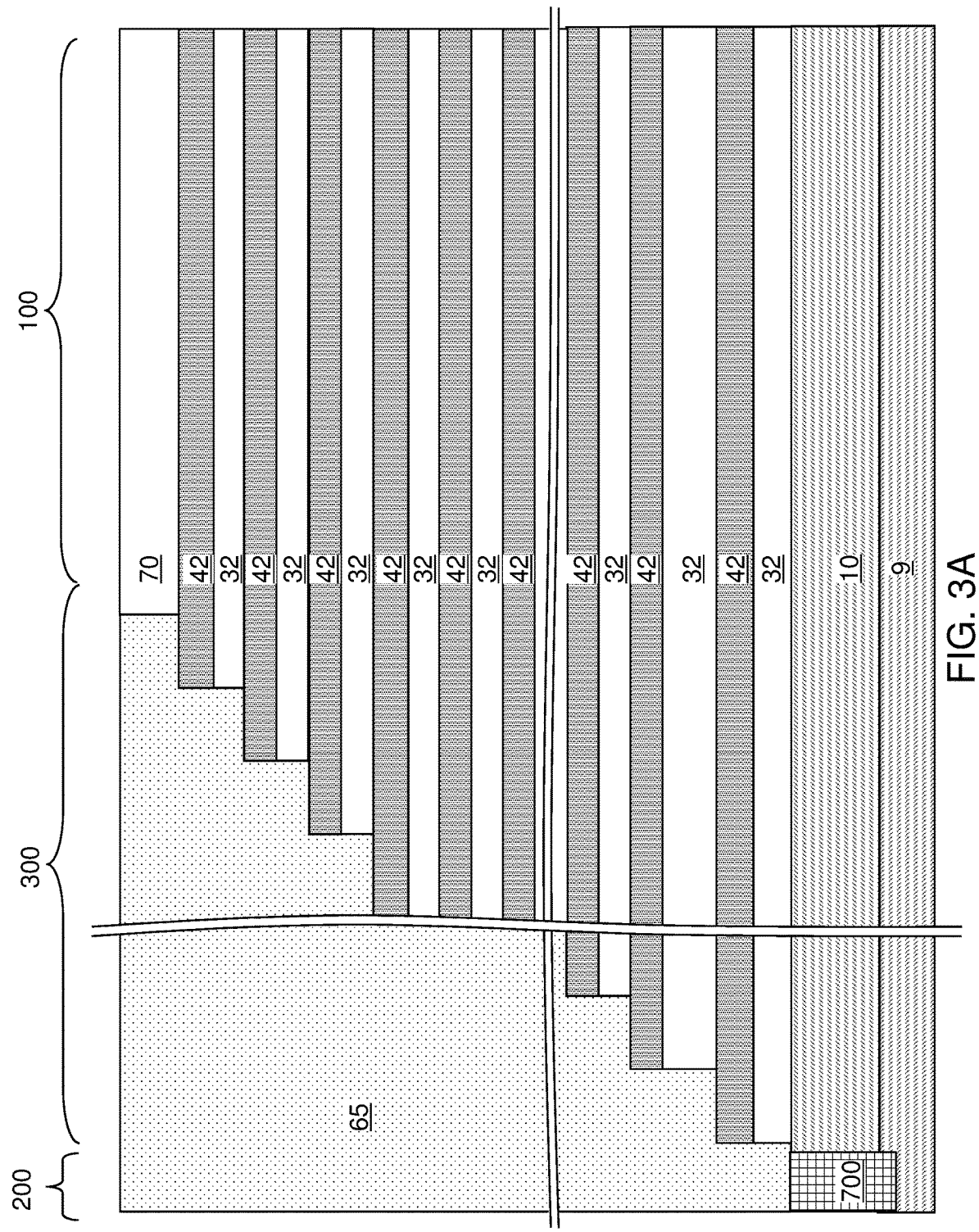
FIG. 3A is a schematic vertical cross-sectional view of the first exemplary structure after formation of stepped terraces and a dielectric material portion according to an embodiment of the present disclosure.
Figure 3B:
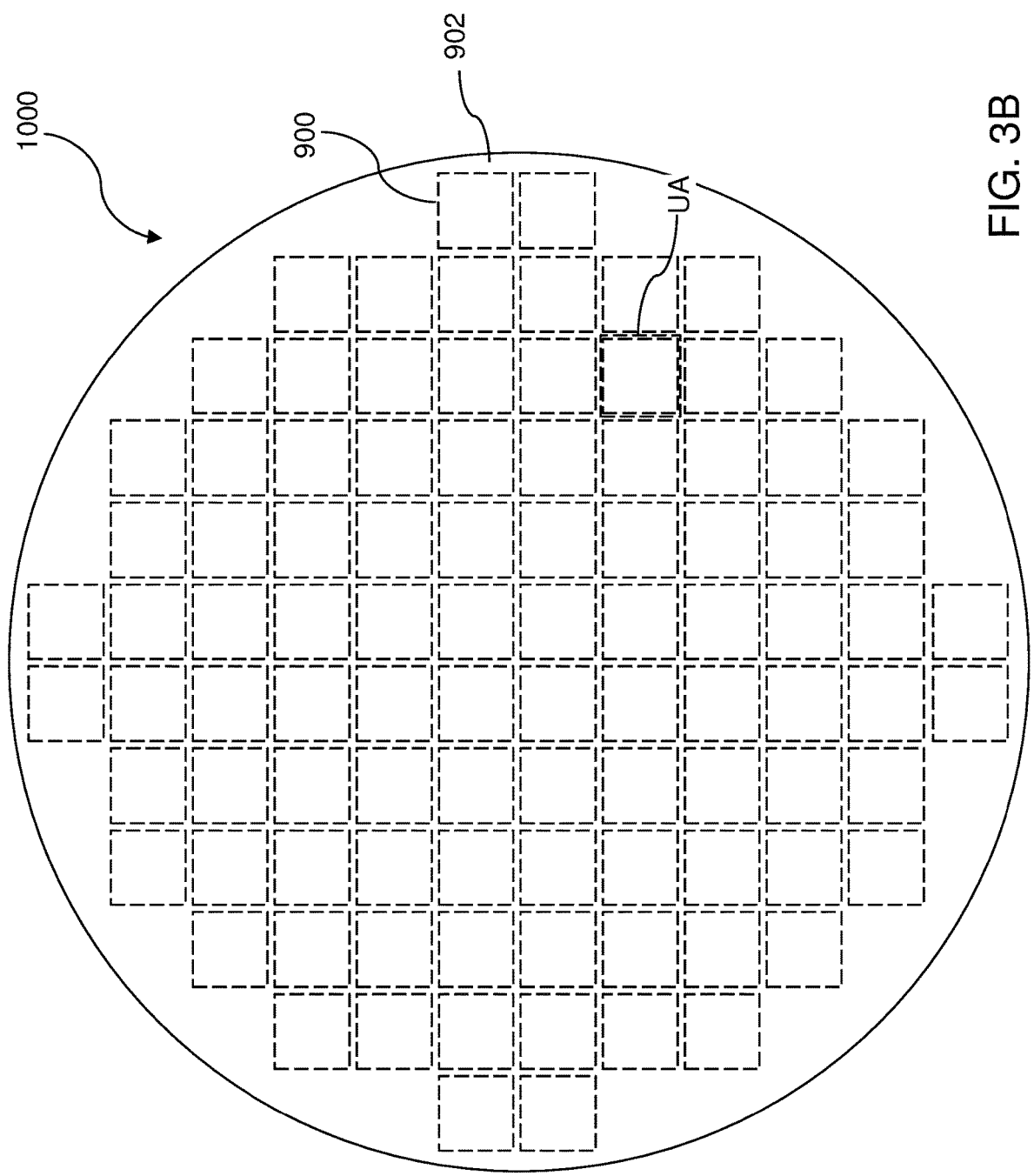
FIG. 3B is a top-down view of a wafer including a two-dimensional array of dies at the processing steps of FIG. 3A.
Figure 3C:
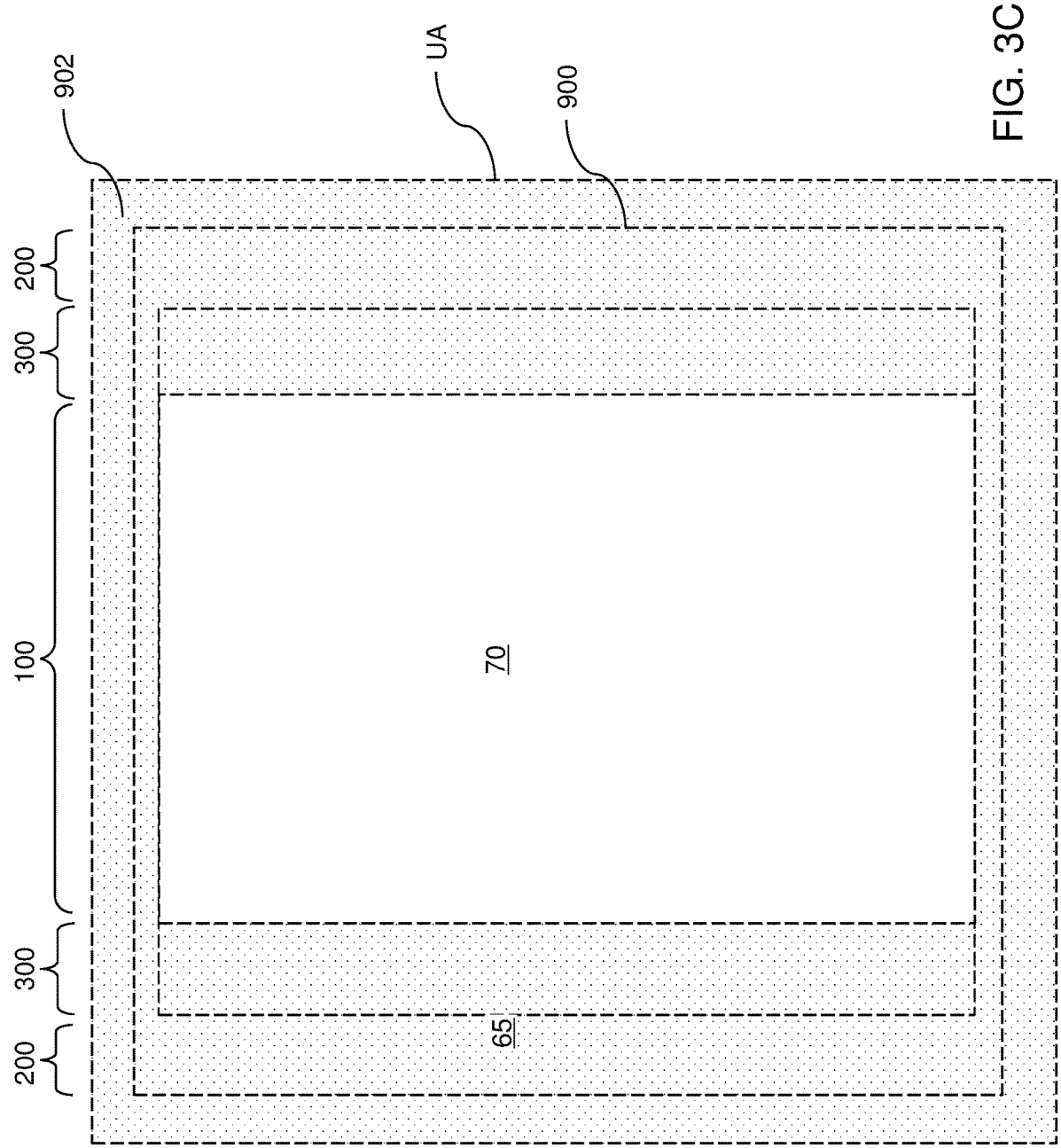
FIG. 3C is a top-down view of a unit area that is a unit of repetition in the wafer of FIG. 3B.

Referring to FIGS. 3A-3C, stepped surfaces are formed at a peripheral region of the alternating stack (32, 42), which is herein referred to as a terrace region. FIG. 3A is a schematic vertical cross-sectional view of the first exemplary structure after formation of stepped terraces and a dielectric material portion 65 according to an embodiment of the present disclosure. FIG. 3B is a top-down view of a wafer 1000 including a two-dimensional array of semiconductor dies 900 at the processing steps of FIG. 3A. The illustrated portion of the first exemplary structure in FIG. 3A may be a portion of a semiconductor die 900 located within a unit area UA within the two-dimensional array of semiconductor dies 900 illustrated in FIG. 3B. FIG. 3C is a top-down view of the unit area UA, which is repeated in the x-direction and the y-direction on the surface of the wafer 1000 of FIG. 3B. Each unit area UA includes a respective semiconductor die 900 and a kerf region 902 that laterally surrounds the respective semiconductor die 900. In one embodiment, the entirety of the kerf regions 902 may be covered with the dielectric material portion 65.

As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the dielectric material portion 65. The dielectric material portion 65 comprises stepped bottom surfaces such that the lateral extent of the dielectric material portion 65 increases with a vertical distance from the semiconductor substrate (9, 10). As such, the horizontal surface segments and the vertical surface segments of a bottom surface of the dielectric material portion has a retro-stepped profile. As used herein, a "retro-stepped" element refers to an element that has stepped surfaces and a horizontal cross-sectional area that increases monotonically as a function of a vertical distance from a top surface of a substrate on which the element is present. The dielectric material portion 65 is also referred to as a retro-stepped dielectric material portion. If silicon oxide is employed for the dielectric material portion 65, the silicon oxide of the dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
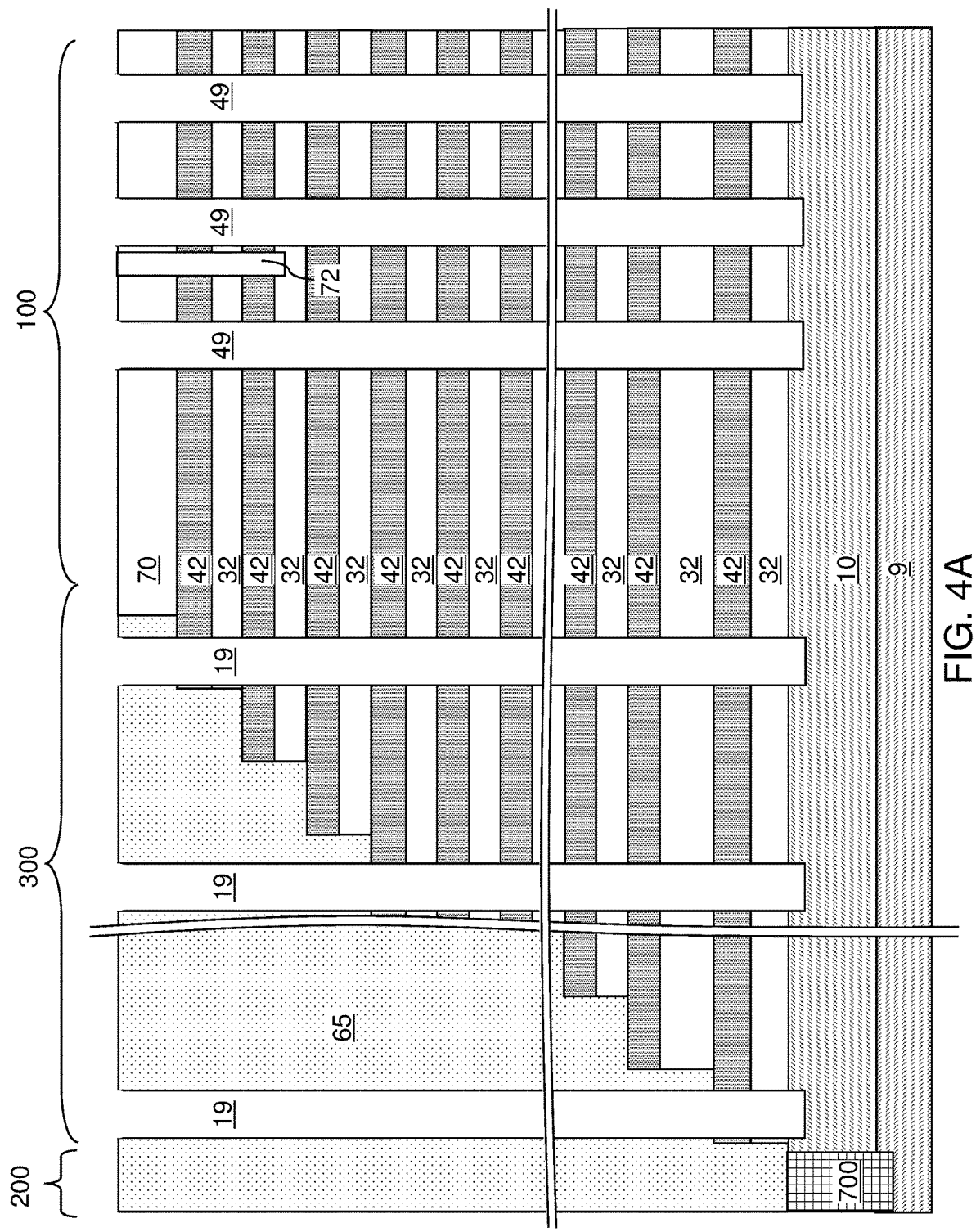
FIG. 4A is a schematic vertical cross-sectional view of the first exemplary structure after formation of memory openings and support openings according to an embodiment of the present disclosure.
Figure 4B:
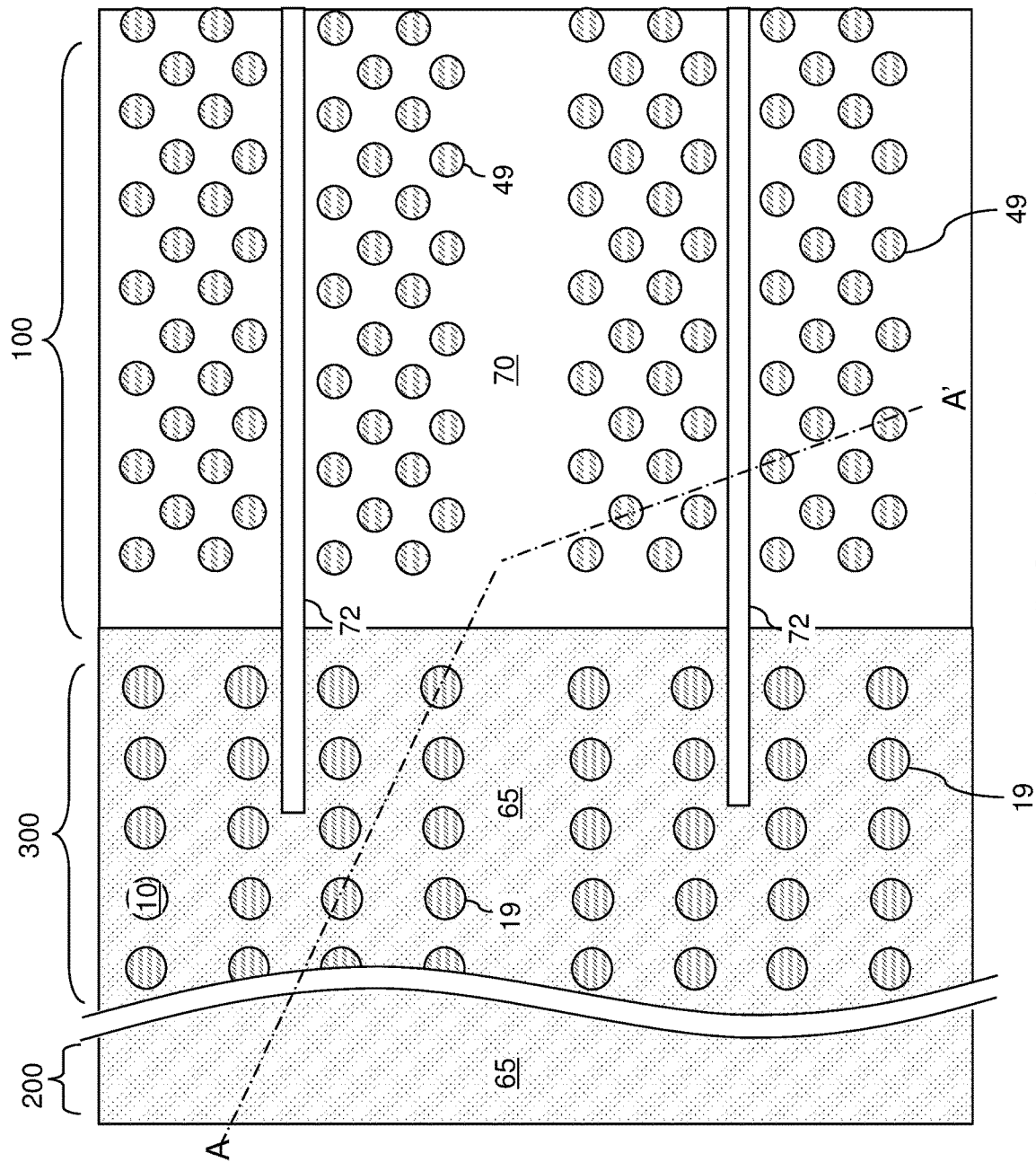
FIG. 4B is a top-down view of the exemplary structure of FIG. 4A. The vertical plane A-A' is the plane of the cross-section for FIG. 4A.
Figure 4C:
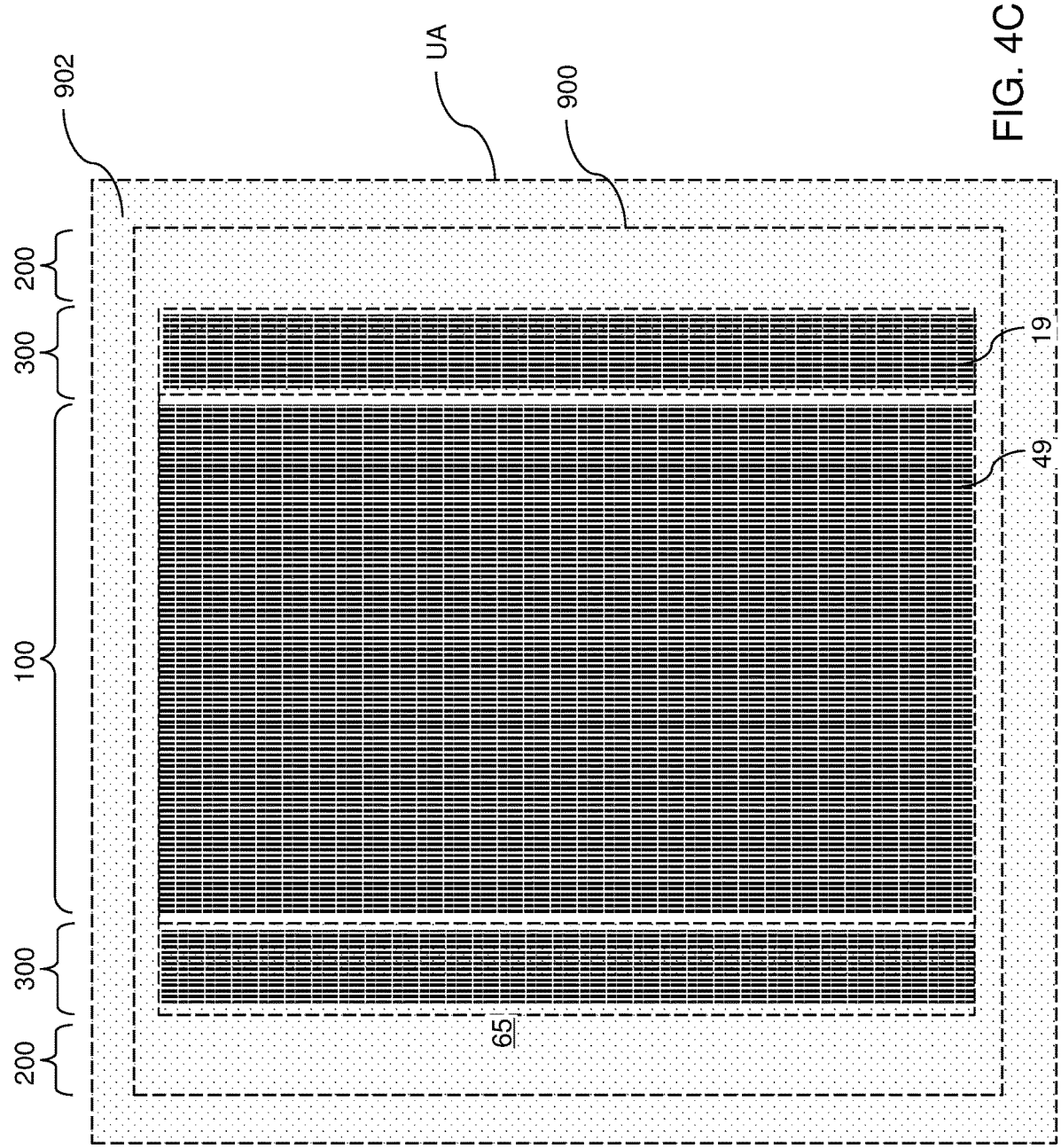
FIG. 4C is a top-down view of the unit area at the processing steps of FIGS. 4A and 4B.

Referring to FIGS. 4A-4C, a lithographic material stack (not shown) including at least a photoresist layer can be formed over the insulating cap layer 70 and the dielectric material portion 65, and can be lithographically patterned to form openings therein. FIG. 4A is a schematic vertical cross-sectional view of the first exemplary structure after formation of memory openings 49 and support openings 19 according to an embodiment of the present disclosure. FIG. 4B is a top-down view of the exemplary structure of FIG. 4A. The vertical plane A-A' is the plane of the cross-section for FIG. 4A. FIG. 4C is a top-down view of the unit area UA at the processing steps of FIGS. 4A and 4B.

The openings include a first set of openings formed over the memory array region 100 and a second set of openings formed over the contact region 300. The pattern in the lithographic material stack can be transferred through the insulating cap layer 70 or the dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, during, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a conductive material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially etched anisotropically employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
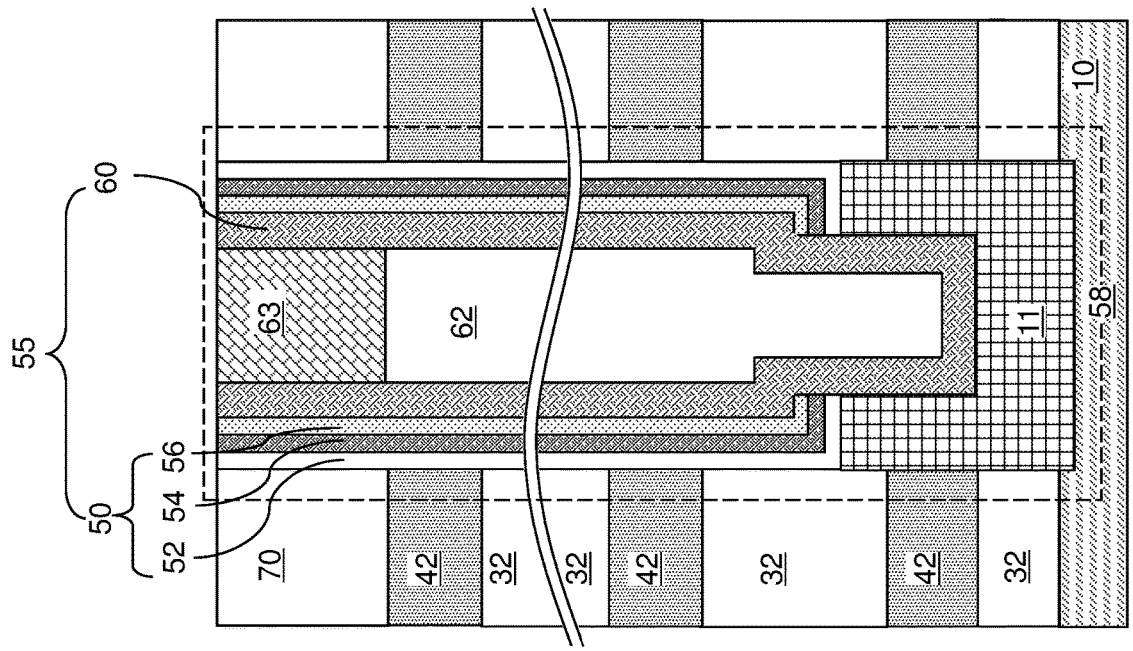

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Figure 5H:
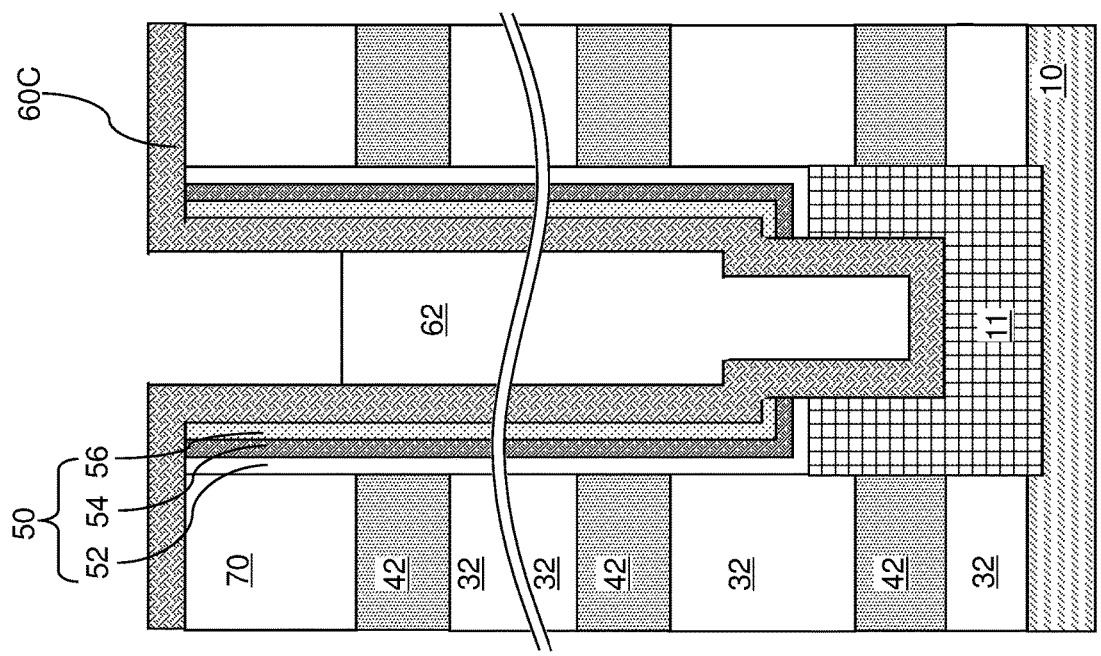

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon. Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process.

Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56. A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. The dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the sacrificial material layers 42. In case a dielectric material liner 56 is present in each memory opening fill structure 58, the dielectric material liner 56 may be formed on the vertical stack of memory elements. In one embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Figure 6:
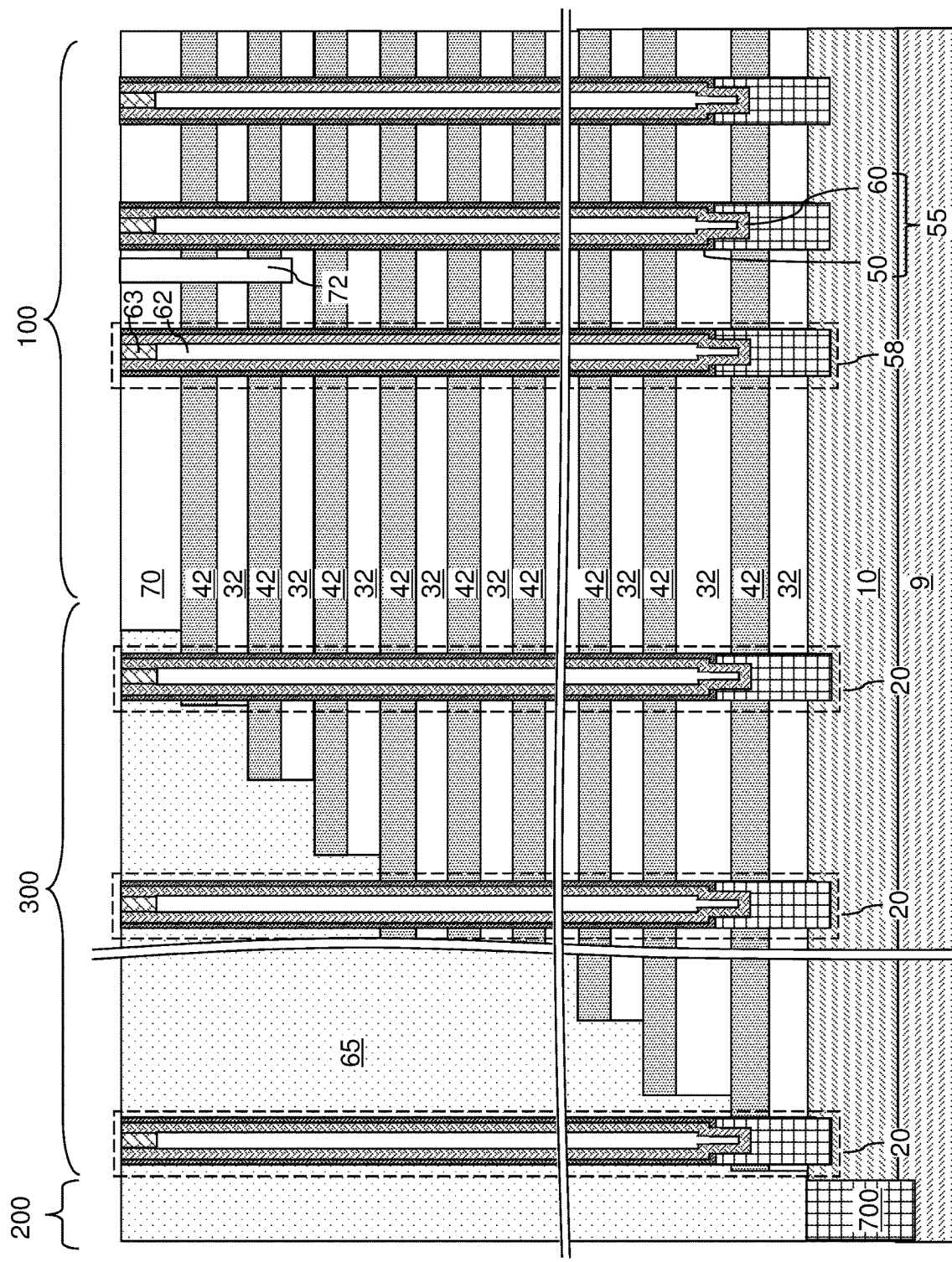
FIG. 6 is a schematic vertical cross-sectional view of the first exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A-4C.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising portions of the memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
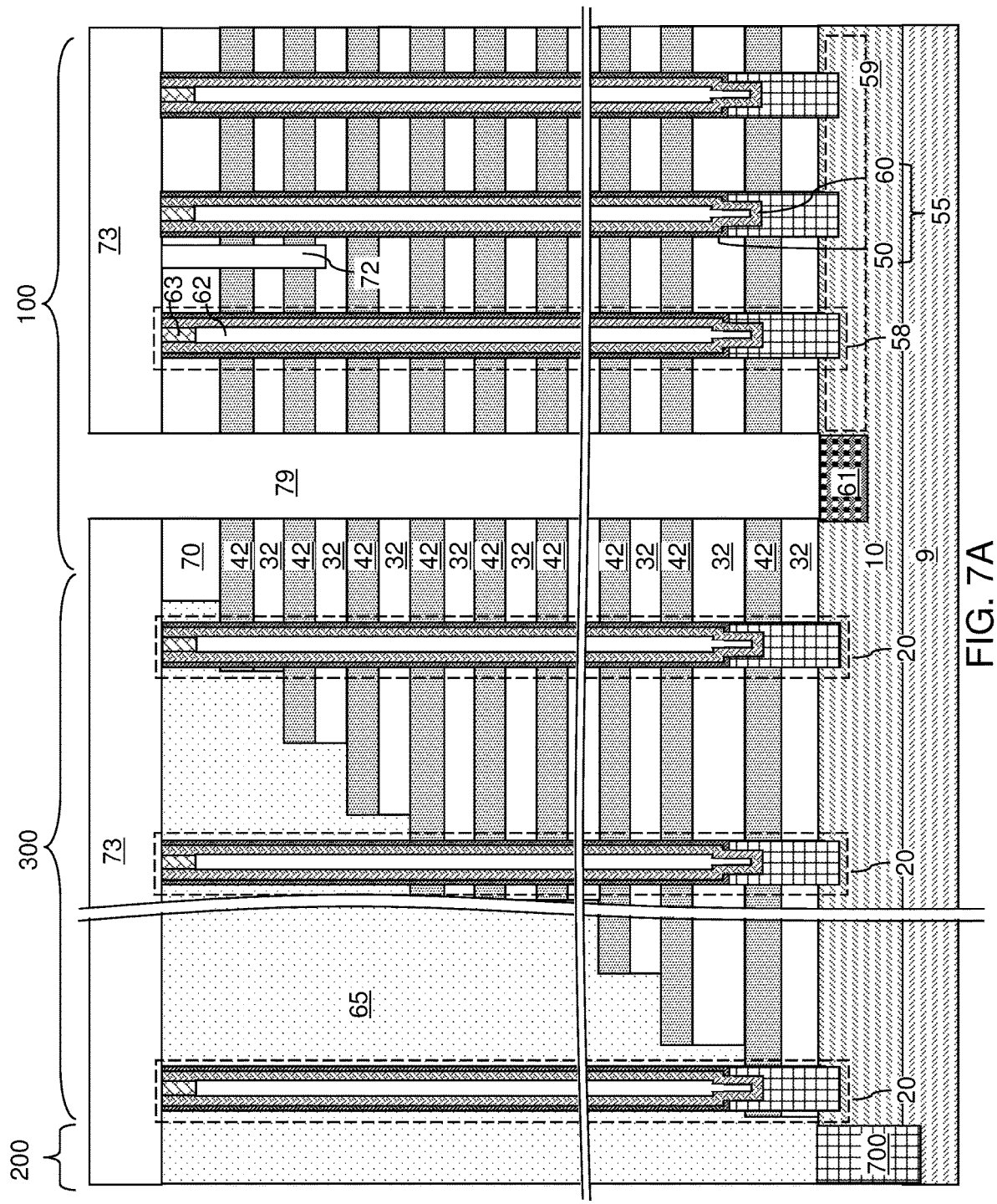
FIG. 7A is a schematic vertical cross-sectional view of the first exemplary structure after formation of backside trenches according to an embodiment of the present disclosure.
Figure 7B:
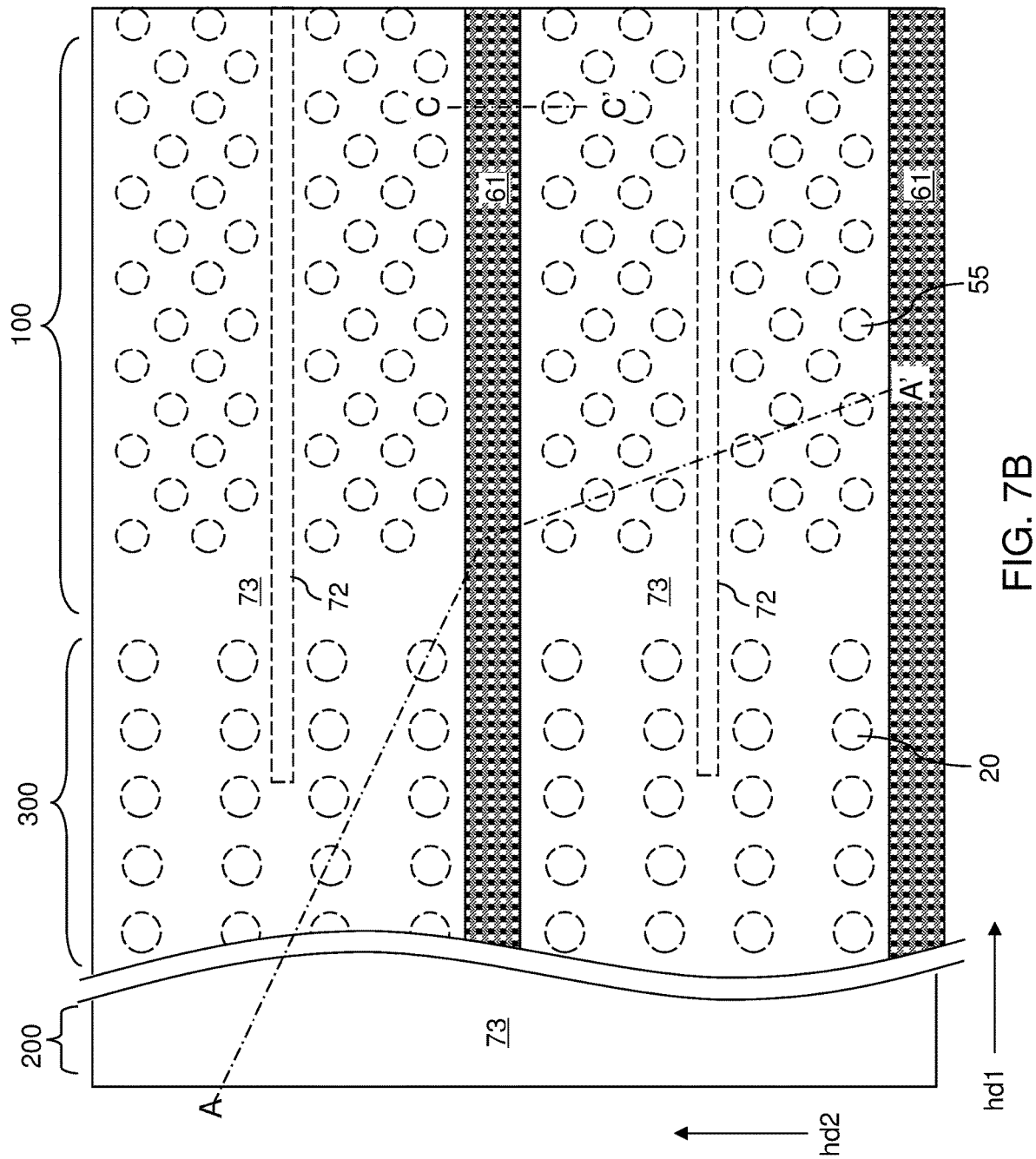
FIG. 7B is a partial see-through top-down view of the first exemplary structure of FIG. 7A. The vertical plane A-A' is the plane of the schematic vertical cross-sectional view of FIG. 7A.
Figure 7C:
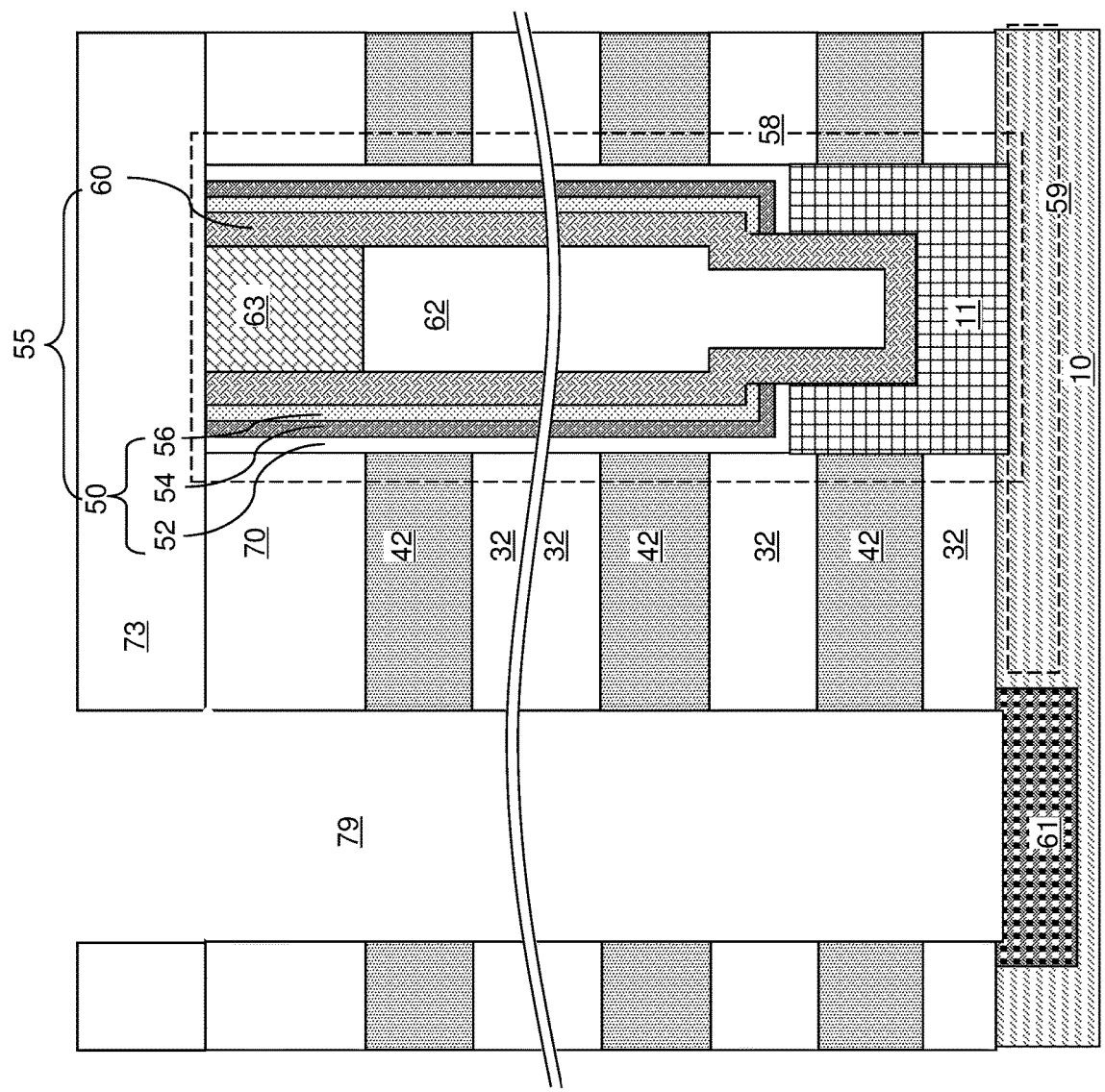
FIG. 7C is a vertical cross-sectional view of the first exemplary structure along the vertical plane C-C' of FIG. 7B.

Referring to FIGS. 7A-7C, a capping dielectric layer 73 can be formed over the alternating stack (32, 42) of insulating layer 32 and sacrificial material layers 42, and over the memory opening fill structures 58 and the support pillar structures 20. FIG. 7A is a schematic vertical cross-sectional view of the first exemplary structure after formation of backside trenches 79 according to an embodiment of the present disclosure. FIG. 7B is a partial see-through top-down view of the first exemplary structure of FIG. 7A. The vertical plane A-A' is the plane of the schematic vertical cross-sectional view of FIG. 7A. FIG. 7C is a vertical cross-sectional view of the first exemplary structure along the vertical plane C-C' of FIG. 7B.

The capping dielectric layer 73 may comprise silicon oxide, silicon nitride or silicon oxynitride. The capping dielectric layer 73 can have a thickness in a range from 50 nm to 500 nm, although lesser and greater thicknesses can also be employed.

A photoresist layer (not shown) can be applied over the capping dielectric layer 73, and is lithographically patterned to form openings in areas between clusters of memory opening fill structures 58. The pattern in the photoresist layer can be transferred through the capping dielectric layer 73, the alternating stack (32, 42) and/or the dielectric material portion 65 employing an anisotropic etch to form backside trenches 79, which vertically extend from the top surface of the capping dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 8:
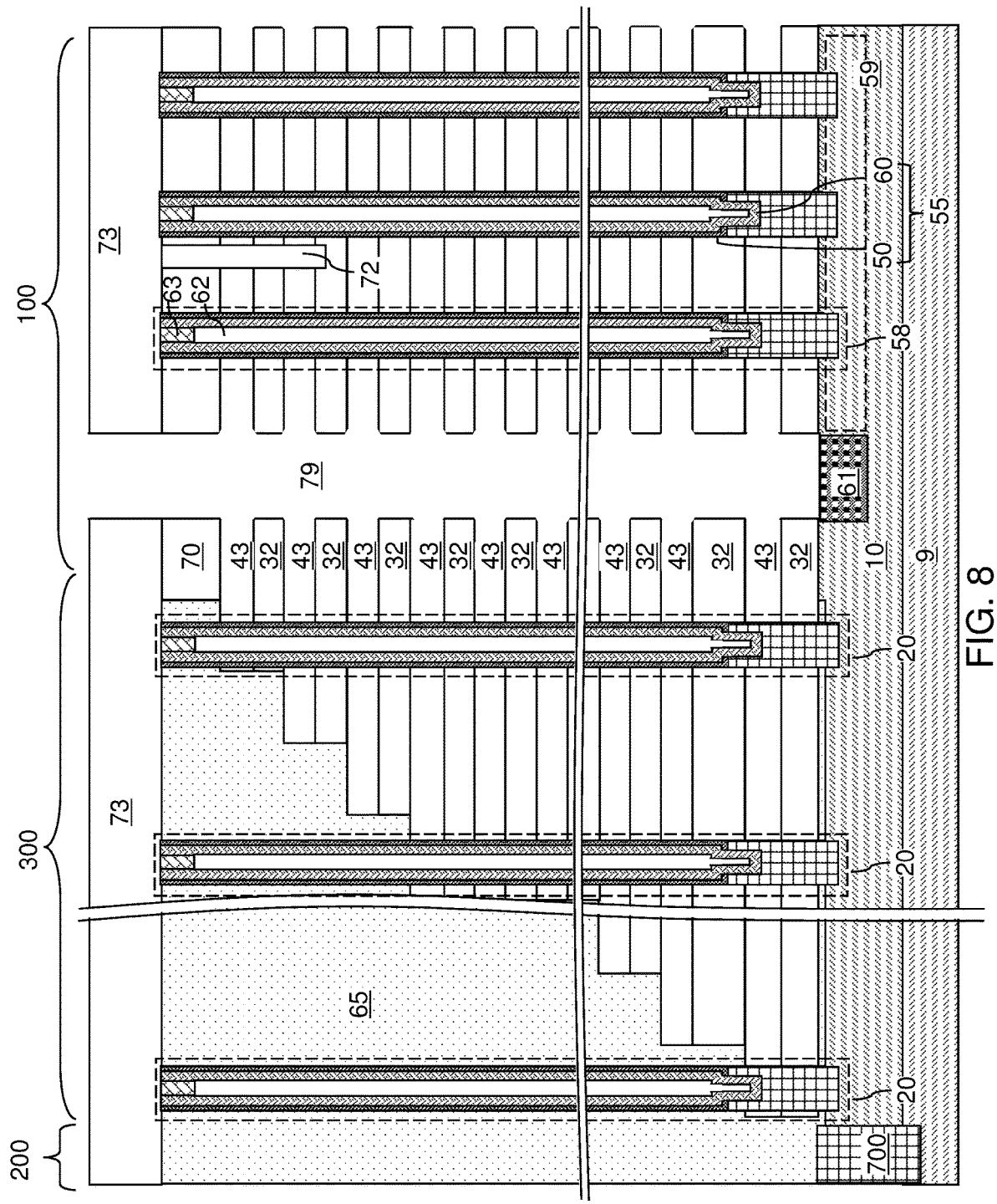
FIG. 8 is a schematic vertical cross-sectional view of the first exemplary structure after formation of backside recesses according to an embodiment of the present disclosure.
Figure 9A:
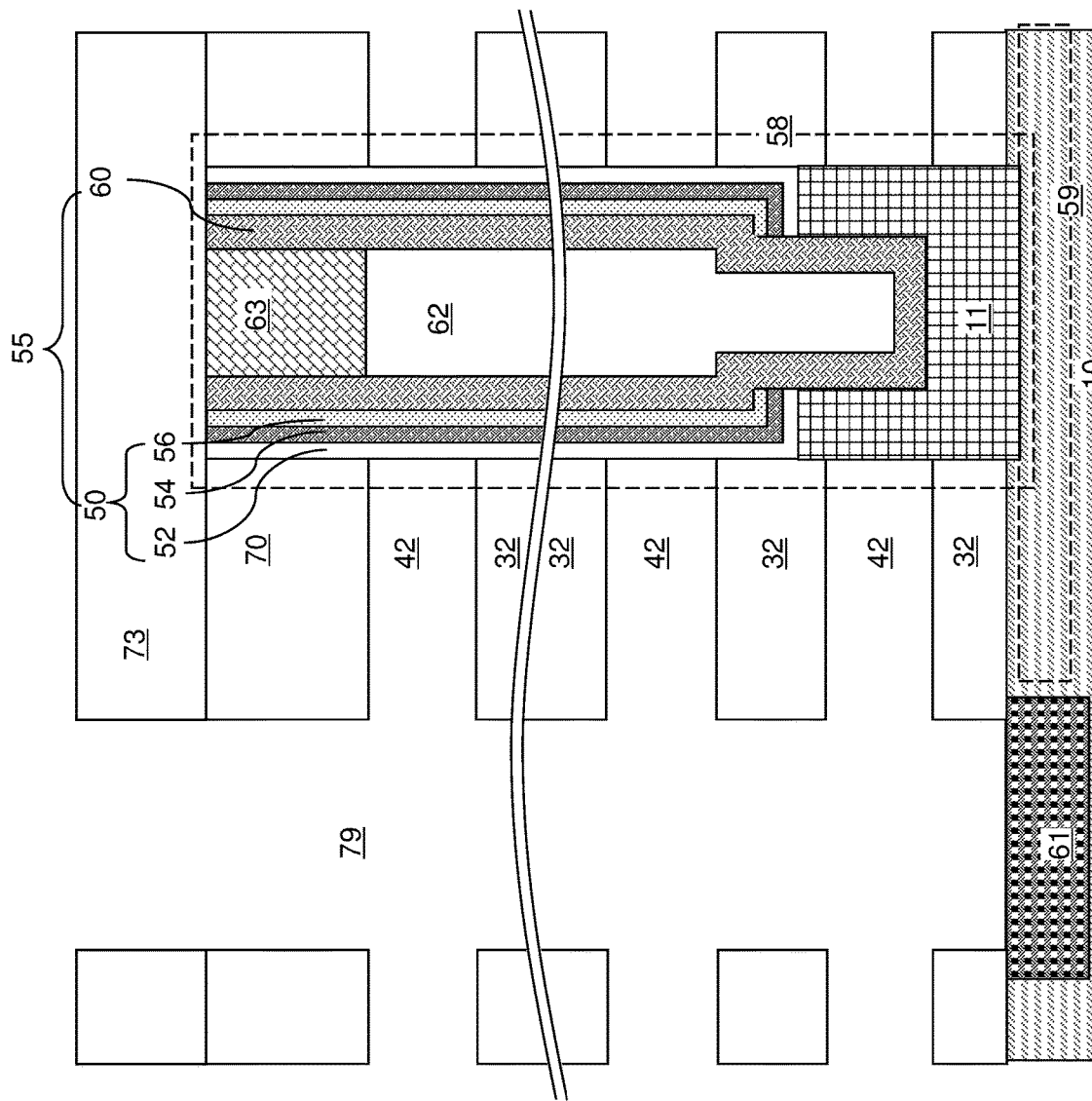
FIGS. 9A-9D are sequential vertical cross-sectional views of a region of the first exemplary structure during formation of electrically conductive layers according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-conductive element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-conductive element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9B:
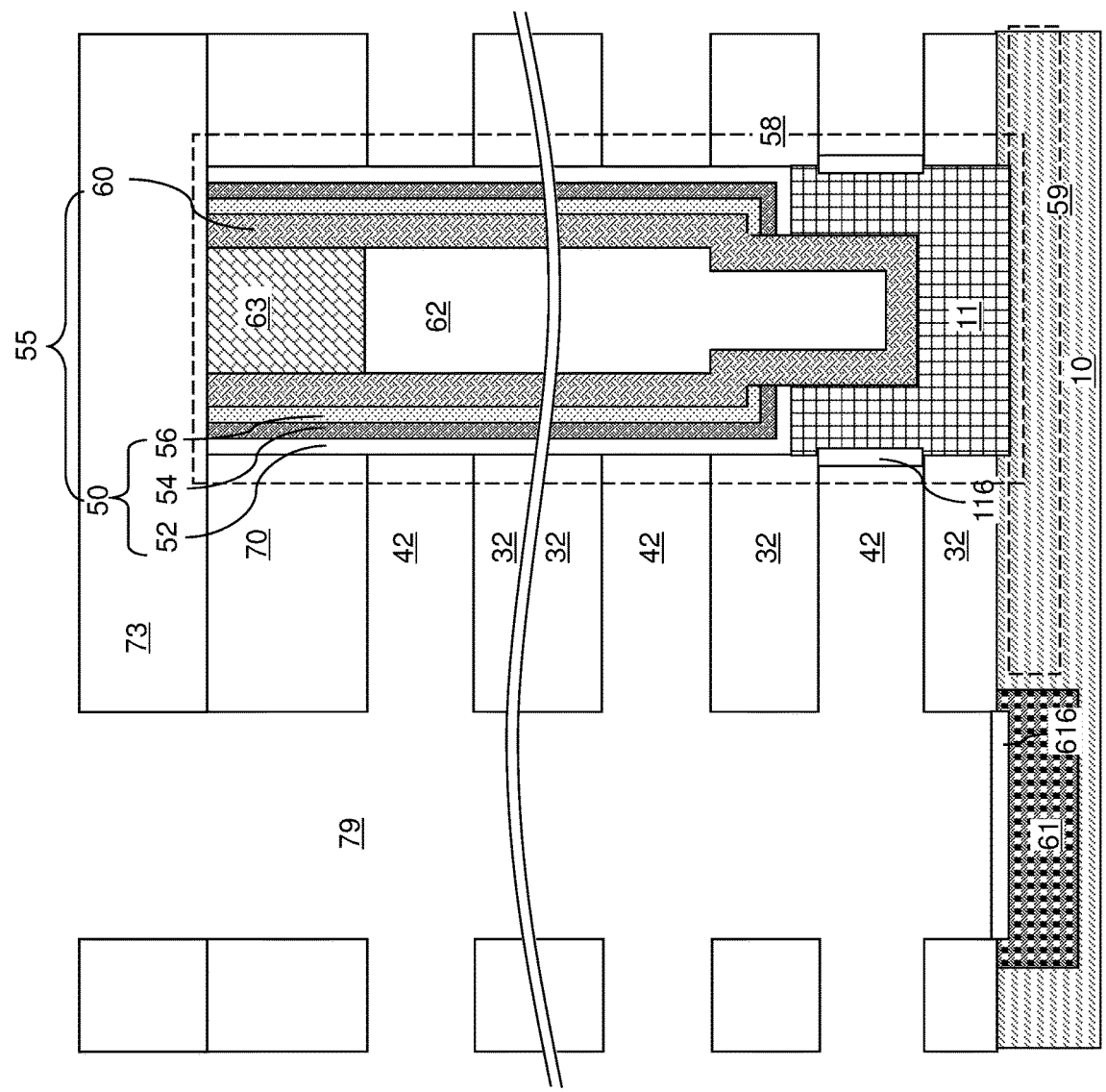

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9C:
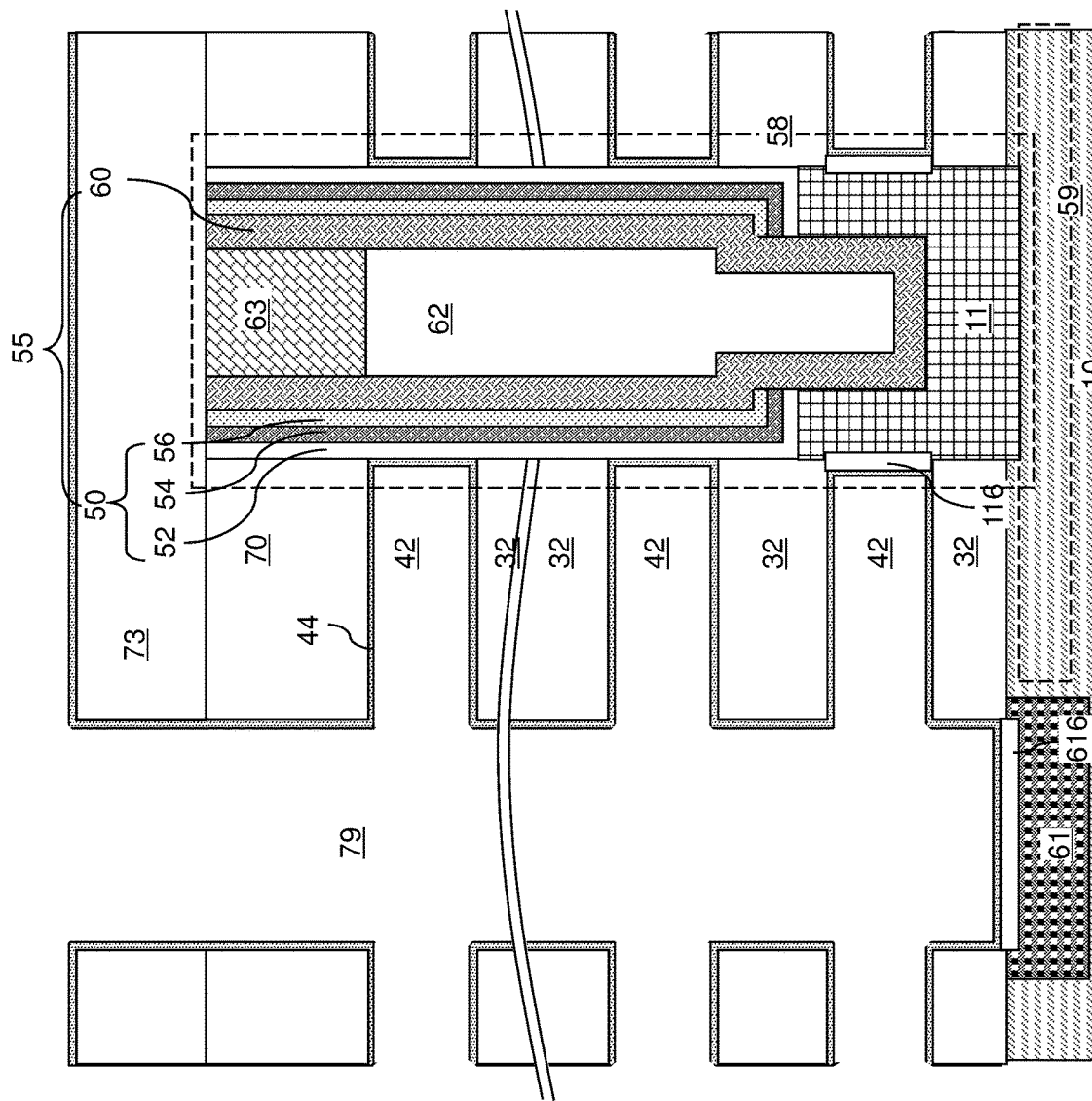

Referring to FIG. 9C, a conductive barrier layer 46A can be deposited in the backside recesses 43. The conductive barrier layer 46A includes an electrically conductive material that can function as a diffusion barrier layer and/or adhesion promotion layer for a conductive fill material to be subsequently deposited. The conductive barrier layer 46A can include a conductive nitride material such as TiN, TaN, WN, or a stack thereof, or can include a conductive carbide material such as TiC, TaC, WC, or a stack thereof. In one embodiment, the conductive barrier layer 46A can be deposited by a conformal deposition process such as chemical vapor deposition (CVD) or atomic layer deposition (ALD). The thickness of the conductive barrier layer 46A can be in a range from 2 nm to 8 nm, such as from 3 nm to 6 nm, although lesser and greater thicknesses can also be employed. In one embodiment, the conductive barrier layer 46A can consist essentially of a conductive metal nitride such as TiN.

Figure 9D:
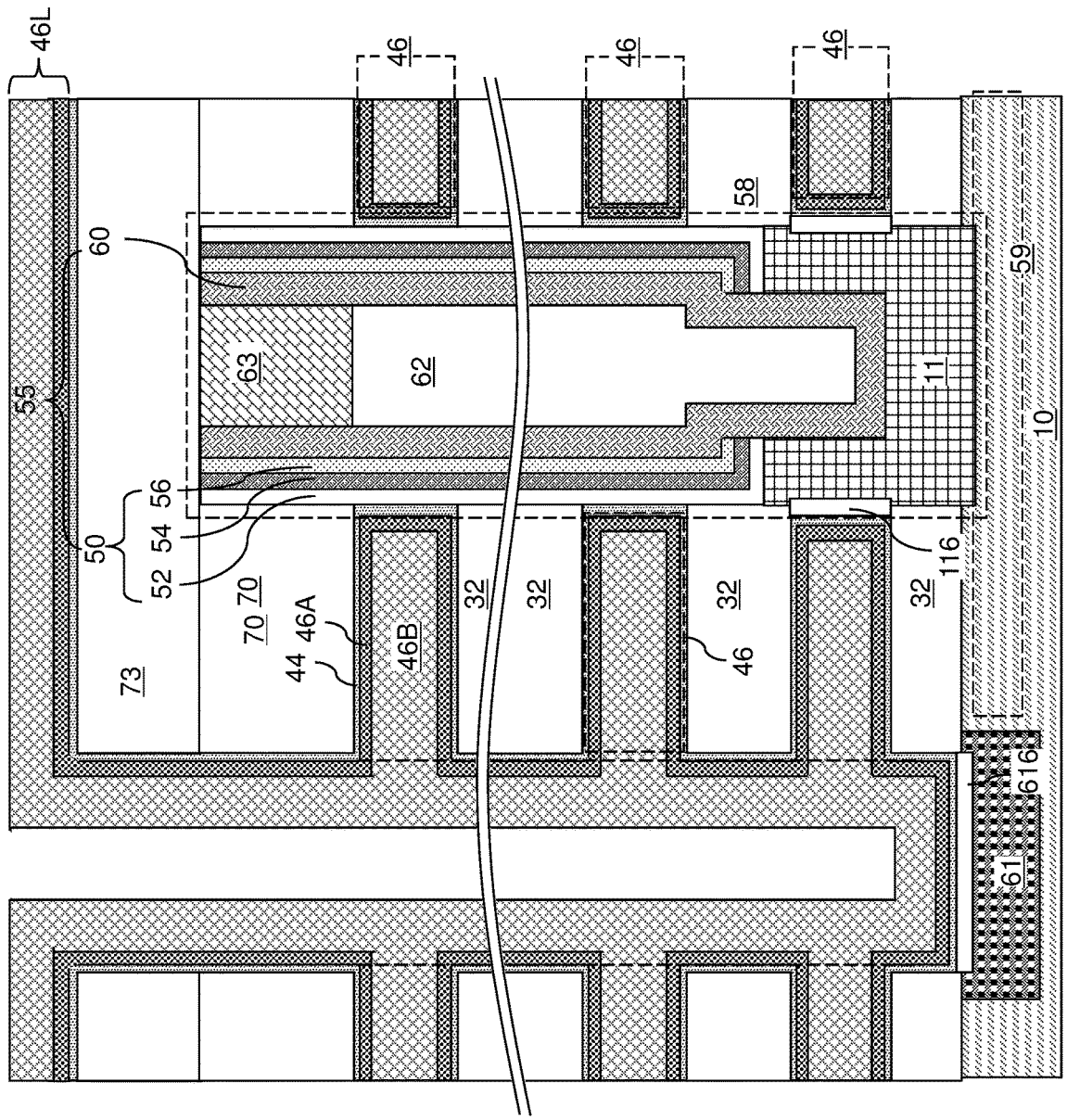

Referring to FIG. 9D, a metal fill material is deposited in the plurality of backside recesses 43, on the sidewalls of the at least one the backside trench 79, and over the top surface of the capping dielectric layer 73 to form a conductive fill material layer 46B. The conductive fill material can be deposited by a conformal deposition method, which can be, for example, chemical vapor deposition (CVD), atomic layer deposition (ALD), electroless plating, electroplating, or a combination thereof. In one embodiment, the conductive fill material layer 46B can consist essentially of at least one elemental metal. The at least one elemental metal of the conductive fill material layer 46B can be selected, for example, from tungsten, cobalt, ruthenium, titanium, and tantalum. In one embodiment, the conductive fill material layer 46B can consist essentially of a single elemental metal. In one embodiment, the conductive fill material layer 46B can be deposited employing a fluorine-containing precursor gas such as $WF_6$. In one embodiment, the conductive fill material layer 46B can be a tungsten layer including a residual level of fluorine atoms as impurities. The conductive fill material layer 46B is spaced from the insulating layers 32 and the memory stack structures 55 by the conductive barrier layer 46A, which is a conductive barrier layer that blocks diffusion of fluorine atoms therethrough.

A plurality of electrically conductive layers 46 can be formed in the plurality of backside recesses 43, and a continuous conductive material layer 46L can be formed on the sidewalls of each backside trench 79 and over the capping dielectric layer 73. Each electrically conductive layer 46 includes a portion of the conductive barrier layer 46A and a portion of the conductive fill material layer 46B that are located between a vertically neighboring pair of dielectric material layers such as a pair of insulating layers 32. The continuous conductive material layer 46L includes a continuous portion of the conductive barrier layer 46A and a continuous portion of the conductive fill material layer 46B that are located in the backside trenches 79 or above the capping dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 10A:
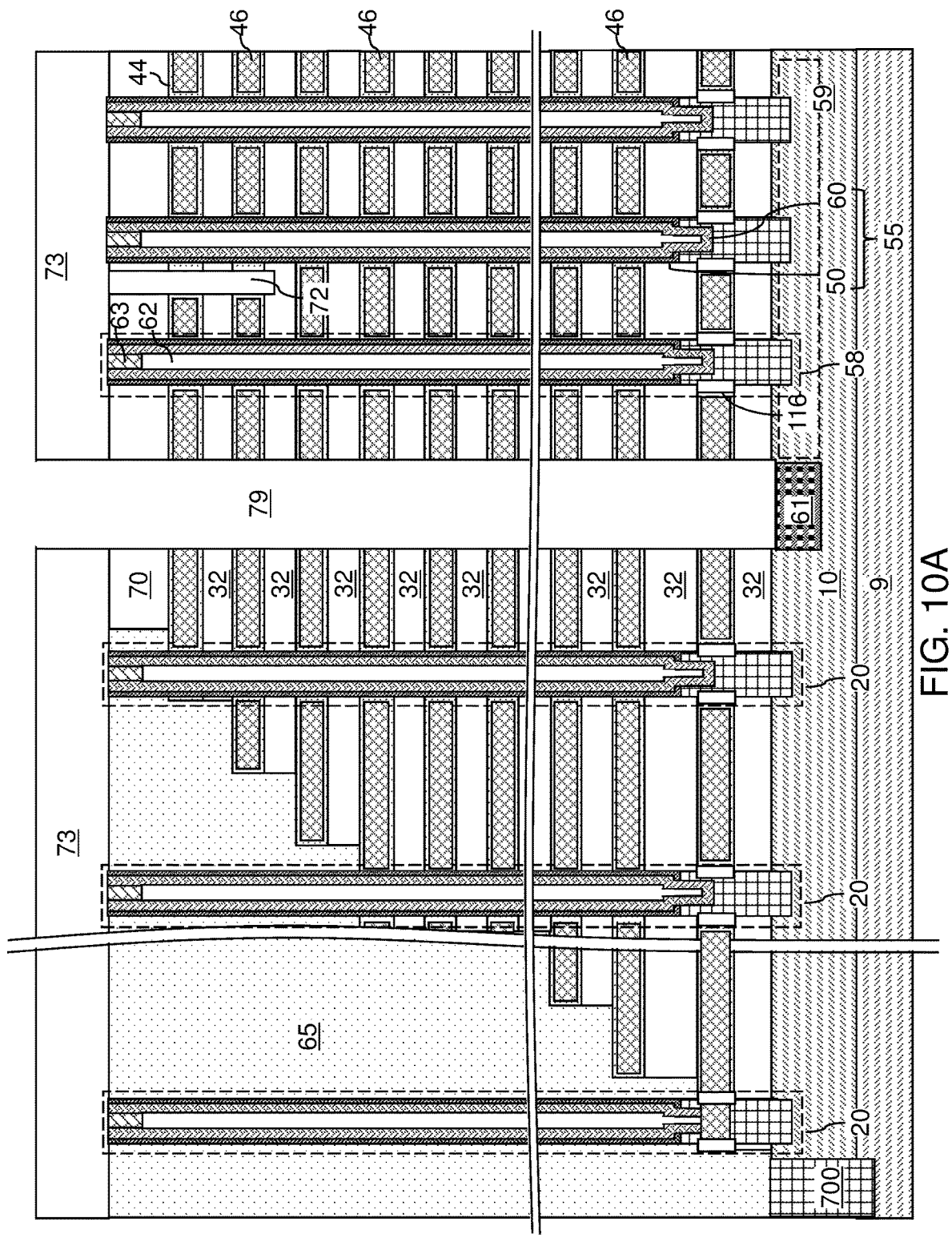
FIG. 10A is a schematic vertical cross-sectional view of the first exemplary structure after removal of a deposited conductive material from within the backside trenches according to an embodiment of the present disclosure.
Figure 10B:
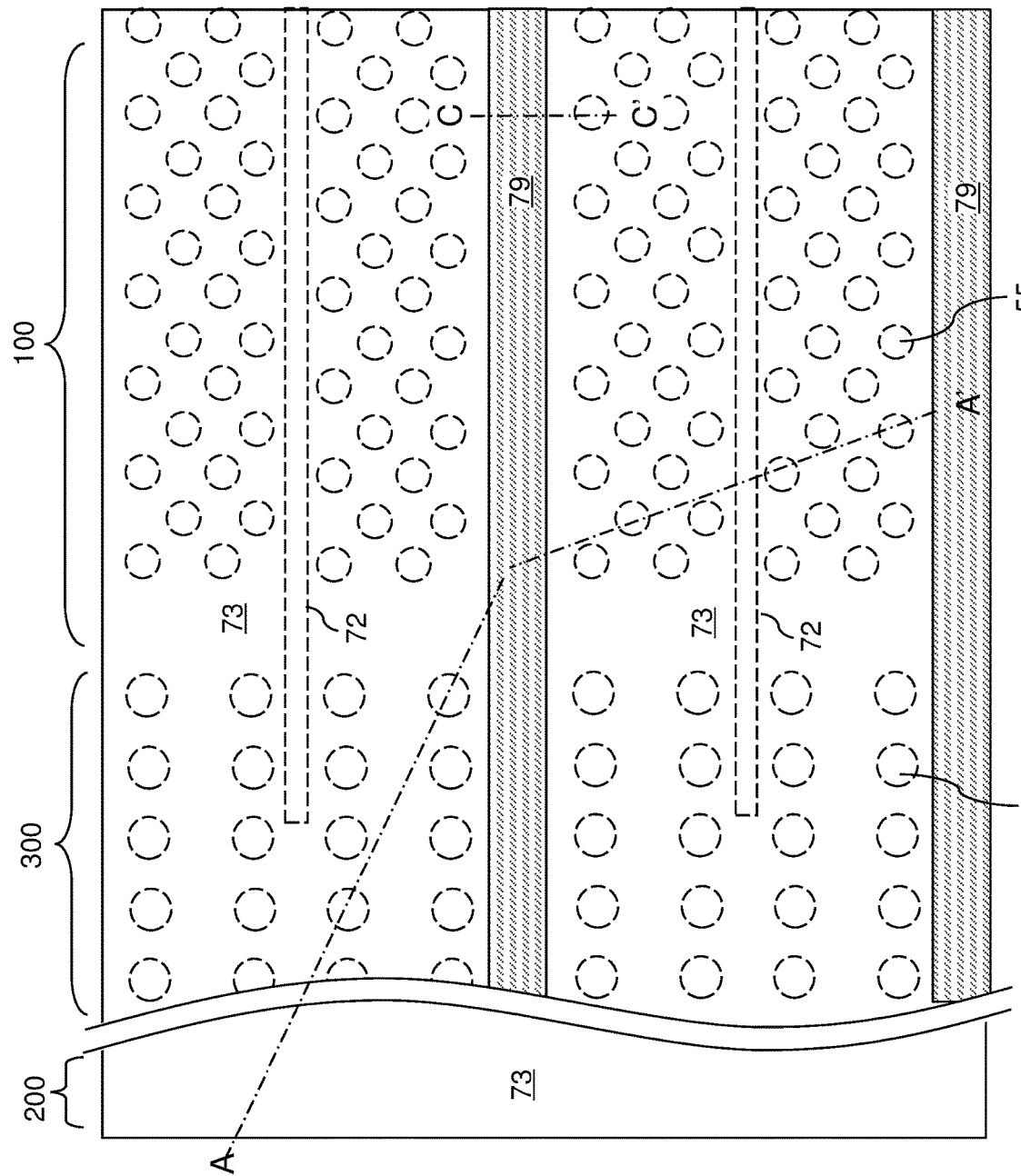
FIG. 10B is a partial see-through top-down view of the first exemplary structure of FIG. 10A. The vertical plane A-A' is the plane of the schematic vertical cross-sectional view of FIG. 10A.
Figure 10C:
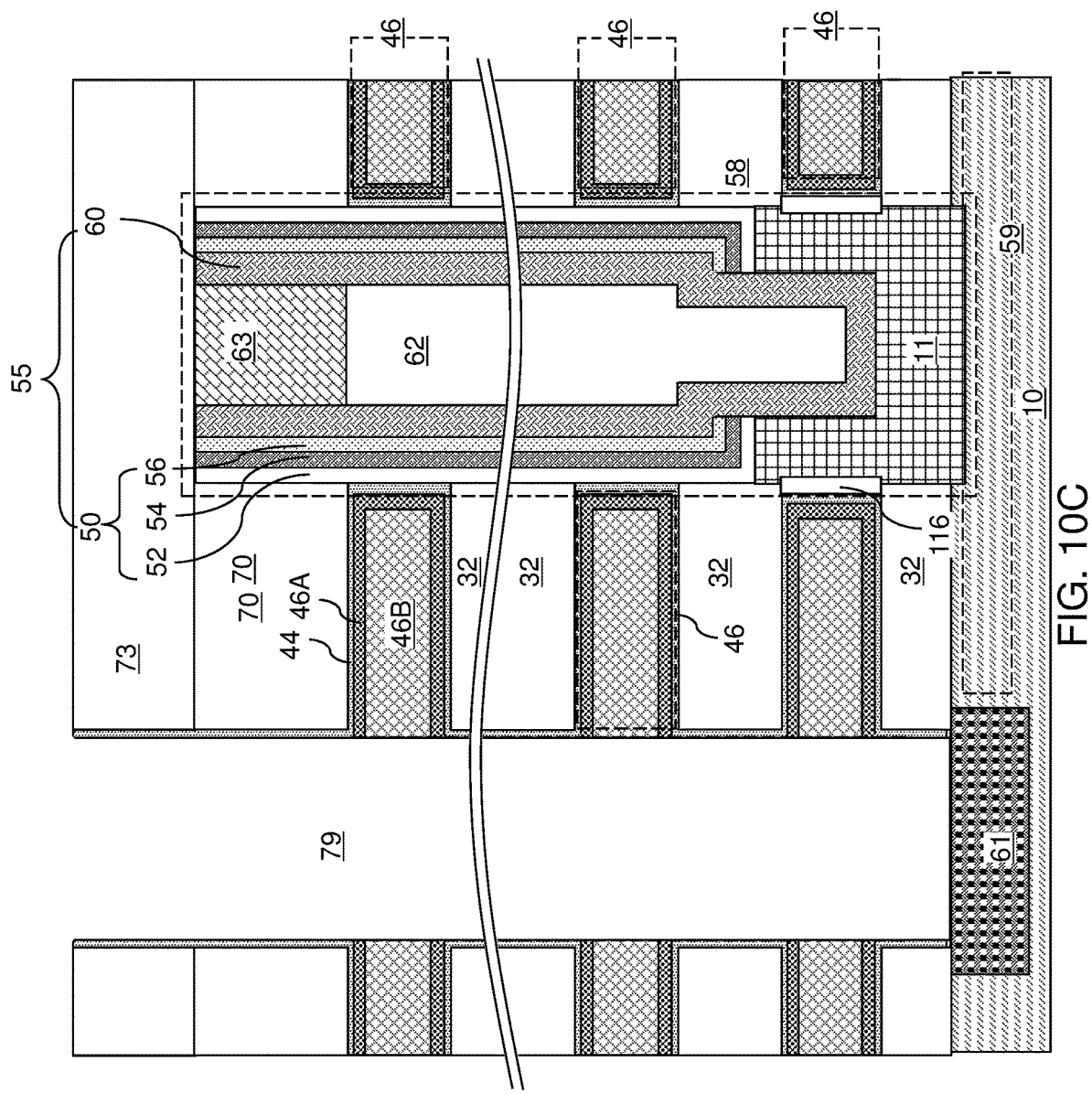
FIG. 10C is a vertical cross-sectional view of the first exemplary structure along the vertical plane C-C' of FIG. 10B.
Figure 10D:
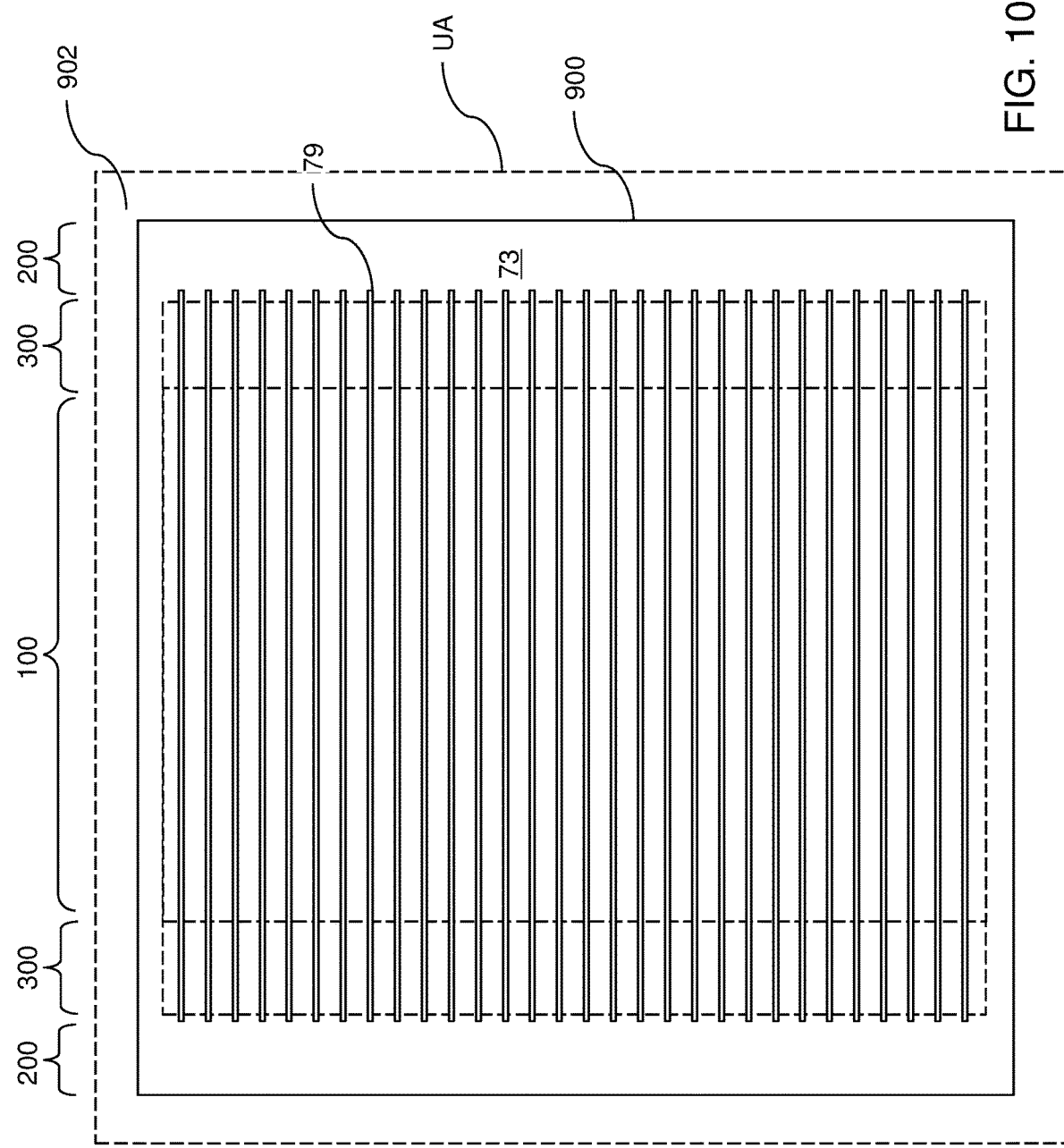
FIG. 10D is a top-down view of a unit area of a wafer including the first exemplary structure at the processing steps of FIGS. 10A-10C.

Referring to FIGS. 10A-10D, the deposited conductive material of the continuous electrically conductive material layer 46L is etched back from the sidewalls of each backside trench 79 and from above the capping dielectric layer 73, for example, by an isotropic wet etch, an anisotropic dry etch, or a combination thereof. FIG. 10A is a schematic vertical cross-sectional view of the first exemplary structure after removal of the continuous electrically conductive material layer 46L from within the backside trenches 79 according to an embodiment of the present disclosure. FIG. 10B is a partial see-through top-down view of the first exemplary structure of FIG. 10A. The vertical plane A-A' is the plane of the schematic vertical cross-sectional view of FIG. 10A. FIG. 10C is a vertical cross-sectional view of the first exemplary structure along the vertical plane C-C' of FIG. 10B. FIG. 10D is a top-down view of a unit area UA of a wafer including the first exemplary structure at the processing steps of FIGS. 10A-10C.

Each remaining portion of the deposited conductive material in the backside recesses 43 constitutes an electrically conductive layer 46. Each electrically conductive layer 46 can be a conductive line structure. Thus, the sacrificial material layers 42 are replaced with the electrically conductive layers 46. Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

At least one bottommost electrically conductive layer 46 provided upon formation of the electrically conductive layers 46 within the alternating stack (32, 46) can comprise a source side select gate electrode for the vertical NAND strings. At least one topmost electrically conductive layer 46 provided upon formation of the electrically conductive layers 46 within the alternating stack (32, 46) can comprise a drain side select gate electrode for the vertical NAND strings. The remaining electrically conductive layers may comprise word lines. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 11A:
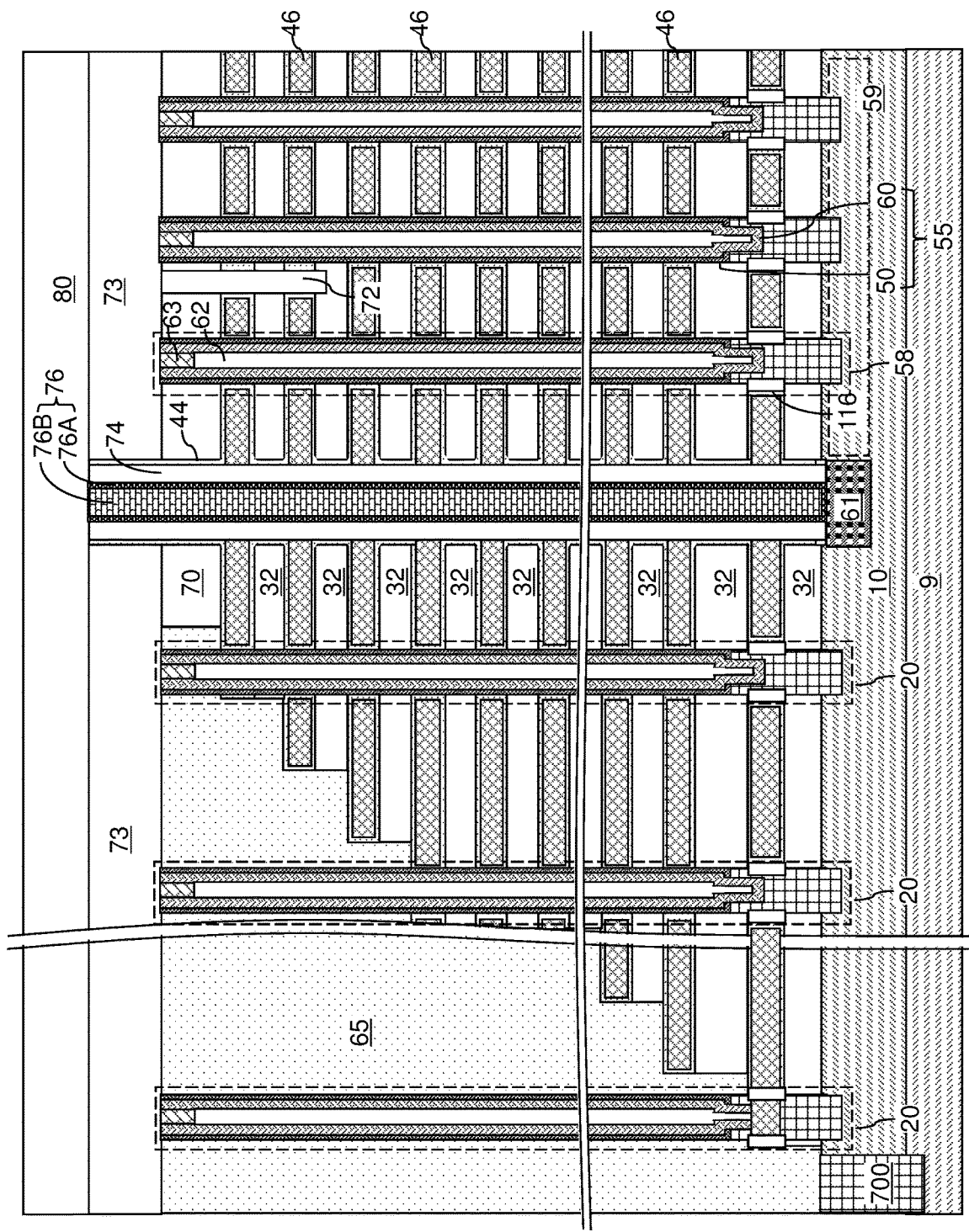
FIG. 11A is a schematic vertical cross-sectional view of the first exemplary structure after formation of backside trench fill structures and a contact-level dielectric layer, and after removal of material portions above the substrate from kerf areas according to an embodiment of the present disclosure.
Figure 11B:
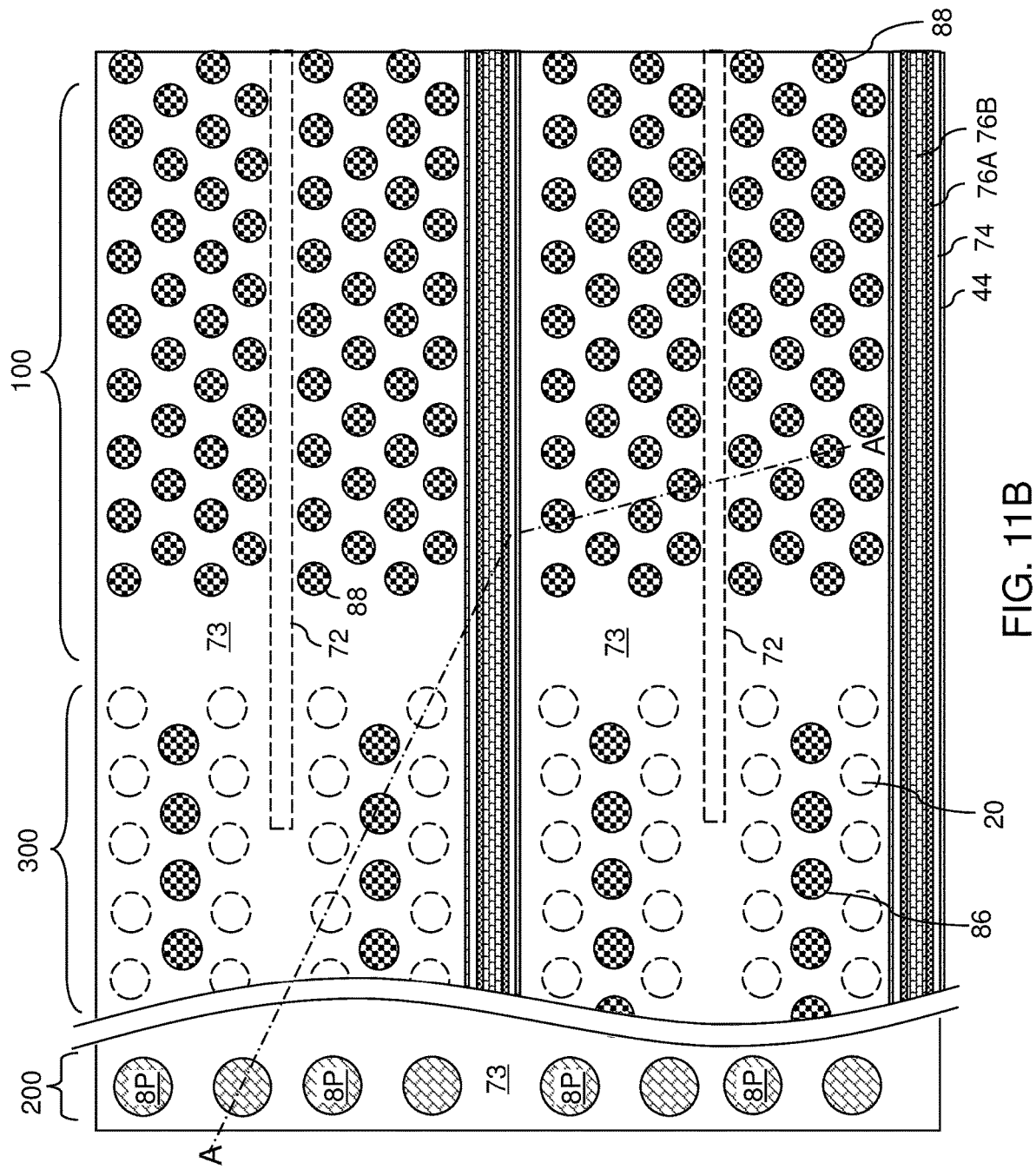
FIG. 11B is a partial see-through top-down view of the first exemplary structure of FIG. 11A. The vertical plane A-A' is the plane of the schematic vertical cross-sectional view of FIG. 11A.
Figure 11C:
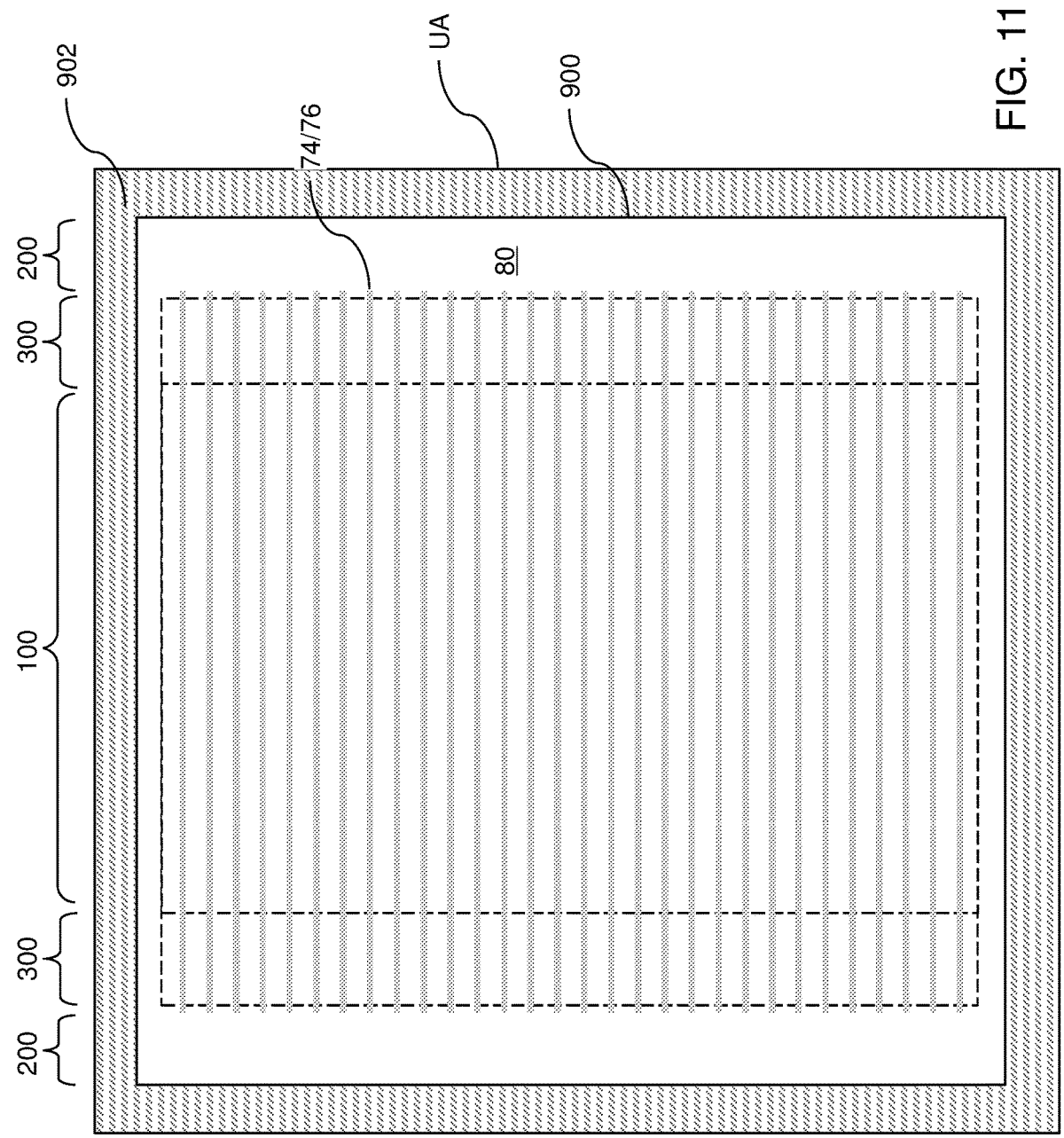
FIG. 11C is a partial see-through top-down view of a unit area of a wafer including the first exemplary structure at the processing steps of FIGS. 11A and 11B.

Referring to FIGS. 11A-11C, backside trench fill structures (74, 76) can be formed in the backside trenches 79, a contact-level dielectric layer 80 can be formed over the insulating cap layer 70 and the backside trench fill structures (74, 76), and material portions can be removed from the kerf regions 902 over the wafer 1000. FIG. 11A is a schematic vertical cross-sectional view of the first exemplary structure after formation of backside trench fill structures (74, 76) and the contact-level dielectric layer 80, and after removal of material portions above the substrate from kerf areas according to an embodiment of the present disclosure. FIG. 11B is a partial see-through top-down view of the first exemplary structure of FIG. 11A. The vertical plane A-A' is the plane of the schematic vertical cross-sectional view of FIG. 11A. FIG. 11C is a partial see-through top-down view of a unit area UA of a wafer 1000 including the first exemplary structure at the processing steps of FIGS. 11A and 11B.

Specifically, an insulating material layer can be formed in the backside trenches 79 and over the capping dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the capping dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a conductive alloy. For example, the conductive fill material portion 76B can include W, Cu, Al, Co, Ru, Ni, an alloy thereof, or a stack thereof.

The at least one conductive material can be planarized employing the capping dielectric layer 73 overlying the alternating stack (32, 46) as a stopping layer. If chemical mechanical planarization (CMP) process is employed, the capping dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Each contiguous combination of an insulating spacer 74 and a backside contact via structure 76 constitutes a backside trench fill structure (74, 76).

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

A contact-level dielectric layer 80 can be formed over the semiconductor devices on the semiconductor substrate (9, 10) and over the dielectric material portion 65. The contact-level dielectric layer 80 comprises a dielectric material such as silicon oxide, silicon nitride or silicon oxynitride, and may have a thickness in a range from 100 nm to 600 nm, although lesser and greater thicknesses may also be employed.

A photoresist layer (not shown) can be applied over the contact-level dielectric layer 80, and can be lithographically patterned to cover areas of the semiconductor dies 900 without covering the kerf regions 902. An etch process such as an anisotropic etch process can be performed to remove material portions in the kerf regions 902 in the wafer 1000. The semiconductor dies 900 can be separated above the horizontal plane including the top surface of the semiconductor substrate (9, 10). The photoresist layer can be subsequently removed, for example, by ashing. Each semiconductor die 900 may include a respective dielectric material portion which is patterned remaining portion of the dielectric material portion 65 as formed at the processing steps of FIGS. 3A-3C.

Generally, a semiconductor die 900 including semiconductor devices and a dielectric material portion 65 can be formed over a semiconductor substrate (9, 10). A dielectric material portion 65 laterally surrounds the semiconductor devices. In one embodiment, the semiconductor devices may comprise an alternating stack of insulating layers 32 and electrically conductive layers 46, and memory opening fill structures 58 located within memory openings 49 that vertically extend through the alternating stack (32, 46) and comprising a respective vertical stack of memory elements (which may comprise for example, portions of memory material layers 54 located at levels of the electrically conductive layers 46) and a vertical semiconductor channel 60. In one embodiment, each of the memory opening fill structures 58 comprises a NAND string, the electrically conductive layers 46 comprise word lines of the NAND strings, and the electrically conductive nodes of the semiconductor devices comprise the word lines of the NAND strings. In one embodiment, sidewalls of each semiconductor die 900 may comprise sidewalls of the dielectric material portion 65 that are exposed to the kerf region 902 located between the semiconductor die 900 and additional semiconductor dies 900 located over the semiconductor substrate (9, 10) or between the edge semiconductor die 900 and the edge of the semiconductor substrate (e.g., silicon wafer 9).

Figure 12A:
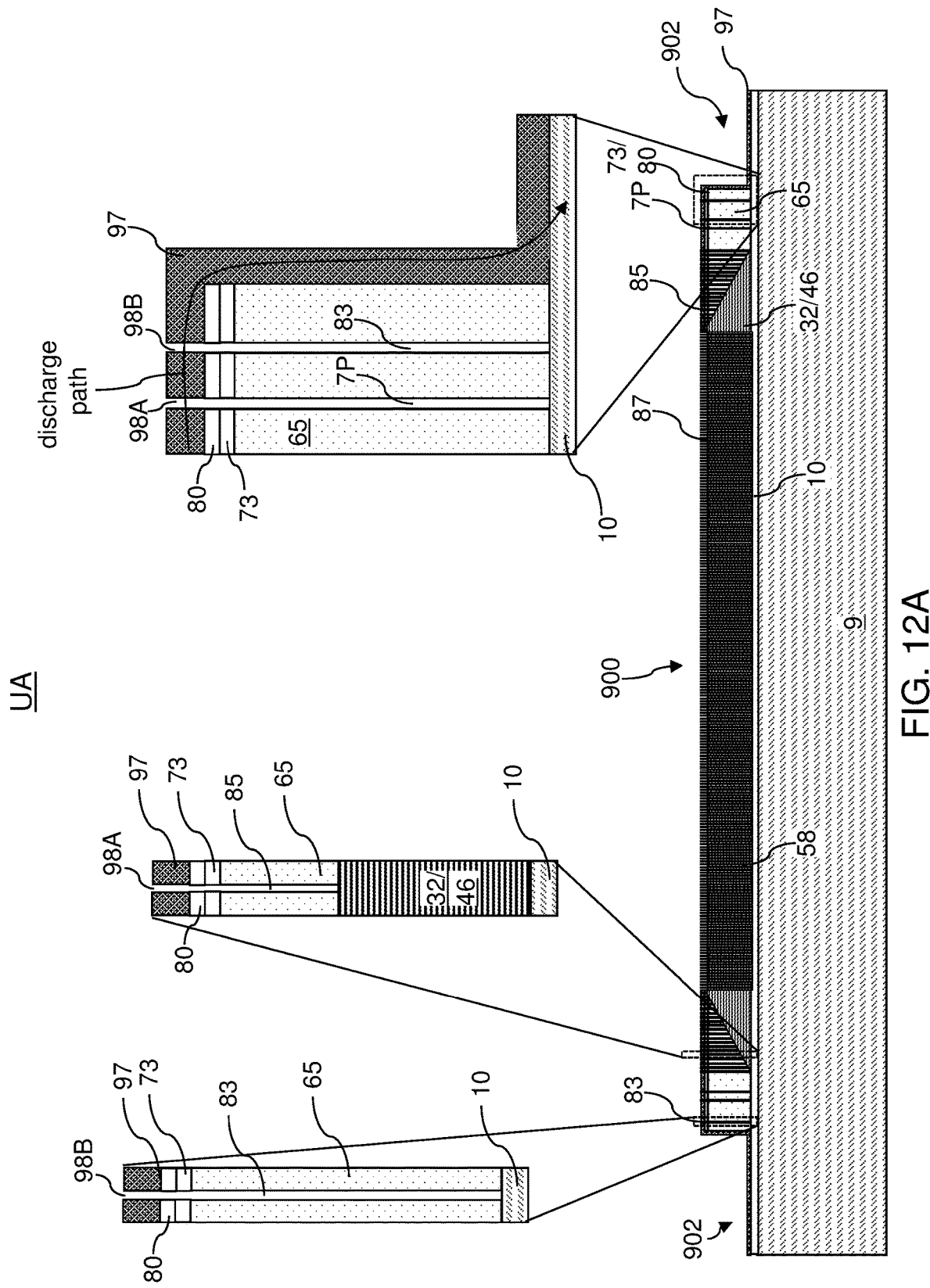
FIG. 12A is a vertical cross-sectional view of a unit area of a wafer including the first exemplary structure after formation of a patterned conductive hard mask layer, and formation of various via cavities including peripheral discrete via cavities according to an embodiment of the present disclosure. Various insets provide magnified views within a die.
Figure 12B:
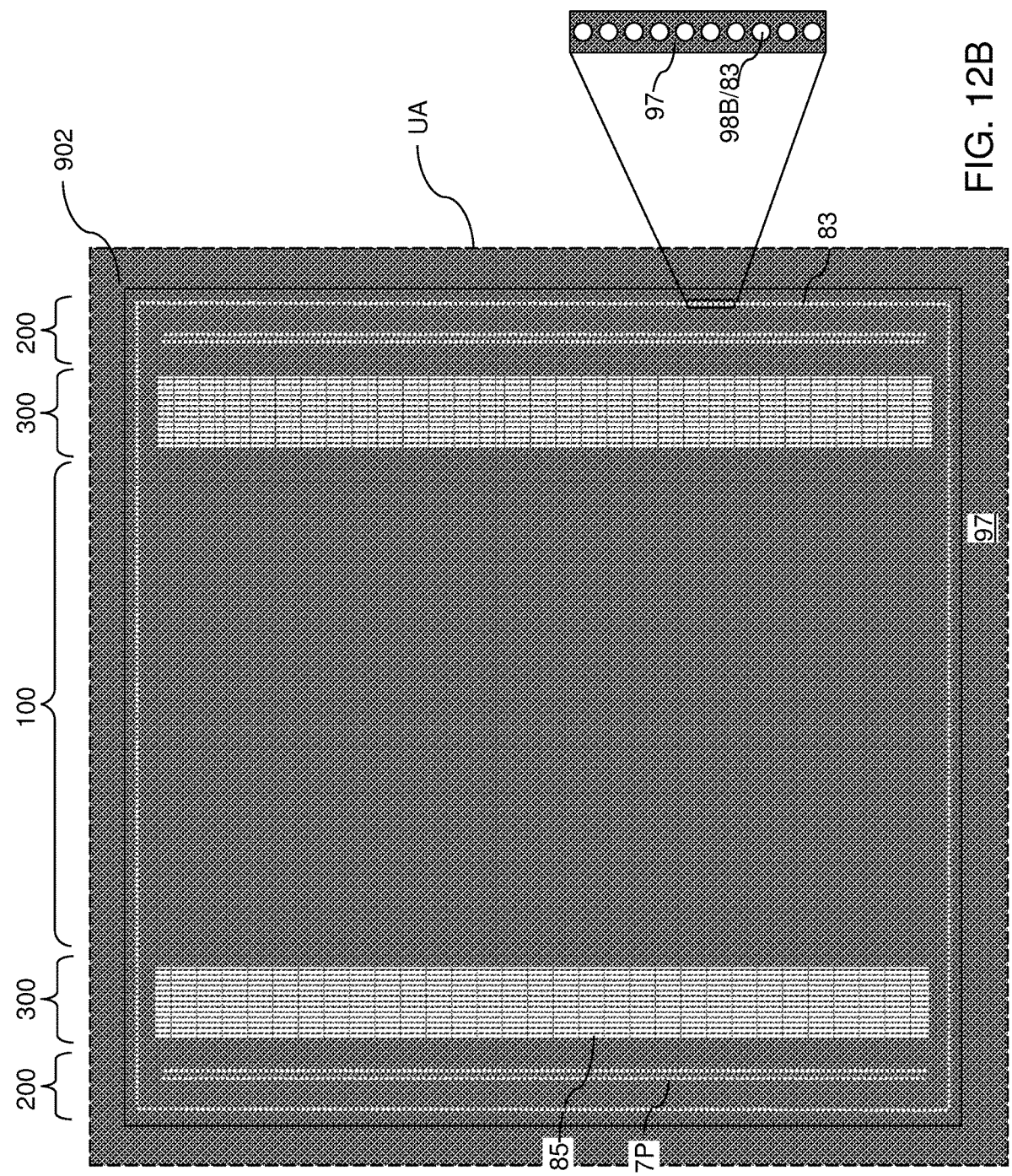
FIG. 12B is a top-down view of the unit area of the wafer of FIG. 12A.
Figure 12C:
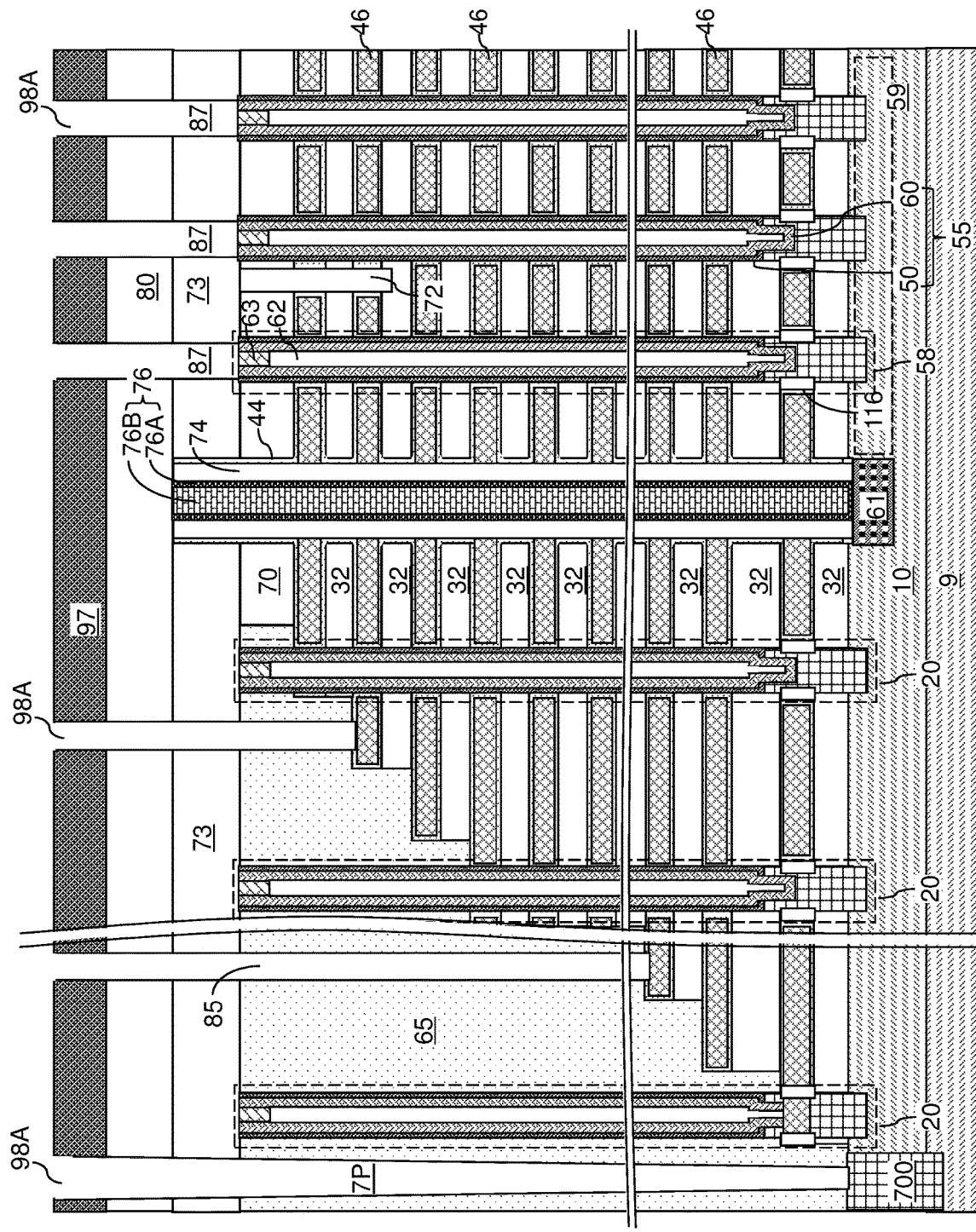
FIG. 12C is a vertical cross-sectional view of a region of the first exemplary structure within the die illustrated in FIGS. 12A and 12B.

Referring to FIGS. 12A-12C, a patterned conductive hard mask layer 97 including openings can be formed over each semiconductor die 900. An anisotropic etch process may be performed to through the openings in the conductive hard mask layer 97 to form various via cavities (83, 7P, 85, 87). FIG. 12A is a vertical cross-sectional view of a unit area UA of a wafer 1000 including the first exemplary structure after formation of a patterned conductive hard mask layer 97, and formation of various via cavities including peripheral discrete via cavities 83 according to an embodiment of the present disclosure. Various insets provide magnified views within a die 900 and kerf area 902 in the unit area UA. FIG. 12B is a top-down view of the unit area UA of the wafer 1000 of FIG. 12A. FIG. 12C is a vertical cross-sectional view of a region of the first exemplary structure within the die 900 illustrated in FIGS. 12A and 12B.

Specifically, the conductive hard mask layer 97 can be formed over the semiconductor devices and the dielectric material portion 65 over the entire area of the wafer 1000. The conductive hard mask layer 97 may comprise a conductive metal nitride material (such as TiN, TaN, WN, and/or MoN) and/or a metal (such as W, Ti, Ta, W, Co, Ru, etc.) and/or a metal alloy (e.g., an alloy of two or more metals, a metal silicide, etc.). In one embodiment, the conductive hard mask layer 97 may comprise a tungsten layer. The conductive hard mask layer 97 may be deposited by a conformal or non-conformal deposition process provided that the top horizontal portions of the conductive hard mask layer 97 overlying the contact-level dielectric layer 80 are connected to bottom horizontal portions of the conductive hard mask layer 97 formed in the kerf regions 902. The bottom horizontal portions may contact the top surface of the semiconductor substrate (9, 10). Vertically-extending portions of the conductive hard mask layer 97 located on sidewalls of the semiconductor dies 900 (which comprise sidewalls of the dielectric material portions 65) connect the top and bottom horizontal portions. For example, the conductive hard mask layer 97 may be formed by chemical vapor deposition, physical vapor deposition, electroplating, and/or electroless plating. In one embodiment, the top horizontal portions of the conductive hard mask layer 97 overlying the contact-level dielectric layers 80 of the semiconductor dies 900 may have a thickness in a range from 20 nm to 400 nm, such as from 40 nm to 200 nm, although lesser and greater thicknesses may also be employed. In one embodiment, the conductive hard mask layer 97 continuously extends over sidewalls of the dielectric material portion 65 of each semiconductor die 900, and contacts a segment of a top surface of the semiconductor substrate (9, 10) located in the kerf region 902.

A photoresist layer (not shown) may be applied over the conductive hard mask layer 97, and may be lithographically patterned to form various openings therein. The various openings in the photoresist layer may comprise discrete openings overlying the drain regions 63, the stepped surfaces of the electrically conductive layers 46, or the peripheral devices 70. According to an aspect of the present disclosure, the various openings in the photoresist layer comprises discrete openings arranged adjacent to the sidewalls of the semiconductor dies 900 along the entire periphery of the top surface of a respective horizontal top portion of the conductive hard mask layer 97. A first anisotropic etch process may be performed to transfer the pattern of the openings in the photoresist layer through the conductive hard mask layer 97.

Openings comprising contact openings 98A and peripheral discrete openings 98B are formed through the conductive hard mask layer 97 underneath the openings in the photoresist layer. A subset of the openings comprising the contact openings 98A in the conductive hard mask layer 97 is formed over the drain regions 63, the stepped surfaces of the electrically conductive layers 46, and the peripheral devices 70. The peripheral discrete openings 98B are formed through the conductive hard mask layer 97 along a periphery of the dielectric material portion 65 in each semiconductor die 900. The set of contact openings 98A through the conductive hard mask layer 97 can be formed within an area surrounded by the set of peripheral discrete openings 98B in the conductive hard mask layer 97. Optionally, the photoresist layer may be removed, for example, by ashing.

The pattern of the openings (98A, 98B) in the conductive hard mask layer 97 can be transferred through underlying material portions by performing at least one second anisotropic etch process. In one embodiment, the pattern of all of the openings in the conductive hard mask layer 97 can be transferred through underlying material portions by a single second anisotropic etch process. Alternatively, at least one patterned photoresist layer may be employed to cover a respective subset of the openings in the conductive hard mask layer 97, and a plurality of second anisotropic etch processes may be performed to form a respective set of via cavities underneath a respective subset of the openings in the conductive hard mask layer 97 that is not masked by a respective patterned photoresist layer.

In an illustrative example, the various via cavities that are formed by the at least one second anisotropic etch process may comprise drain-contact via cavities 87, layer contact via cavities 85, and optional peripheral contact via cavities 7P formed below the respective contact openings 98A in the die 900, and a set of peripheral discrete via cavities 83 formed below the peripheral discrete openings 98B adjacent to the kerf region 902 located at the edge of the die 900 or at the edge of the wafer 1000. The drain-contact via cavities 87 are formed through the contact-level dielectric layer 80 and the capping dielectric layer 73 over a physically exposed top surface of a respective drain region 63. The layer contact via structures 85 are formed through the contact-level dielectric layer 80, the insulating cap layer 70, and the dielectric material portion 65 over a top surface of a respective electrically conductive layer 46. The optional peripheral contact via cavities 7P are formed through the contact-level dielectric layer 80, the insulating cap layer 70, and the dielectric material portion 65 over a physically exposed top surface of a respective node of the peripheral devices 700 (if present on the wafer 1000). The set of peripheral discrete via cavities 83 are formed through the contact-level dielectric layer 80, the insulating cap layer 70, and the dielectric material portion 65 over a physically exposed top surface of the semiconductor substrate (9, 10) adjacent to the kerf region 902.

A set of contact via cavities (85, 7P, 87) can be formed through the contact-level dielectric layer 80 down to top surfaces of electrically conductive nodes of the semiconductor devices in the semiconductor die 900 by performing the at least one second anisotropic etch process. The at least one second anisotropic etch process may etch materials of the contact-level dielectric layer 80, the insulating cap layer 70, and the dielectric material portion 65 selective to the semiconductor devices. According to an aspect of the present disclosure, a set of peripheral discrete via cavities 83 can be formed through the dielectric material portion 65 within each semiconductor die 900 down to a top surface of the semiconductor substrate (9, 10) by performing an anisotropic etch process that etches a material of the dielectric material portion 65 underneath the set of peripheral discrete openings 98B in the conductive hard mask layer 97. The lateral offset distance between the set of peripheral discrete via cavities 83 in a semiconductor die 900 and the sidewalls of the semiconductor die 900 may be in a range from 0.5 micron to 30 microns, such as from 1 micron to 15 microns, although lesser and greater lateral offset distances may also be employed. In on embodiment, the entirety of a region of the dielectric material portion 65 between the set of peripheral discrete via cavities 83 and the sidewalls of the semiconductor die 900 may be free of any semiconductor device.

According to an aspect of the present disclosure shown in FIG. 12A, each point within the conductive hard mask layer 97 is electrically connected to a surface a segment of the top surface of the semiconductor substrate (9, 10) through a respective electrically conductive discharge path located entirely within the conductive hard mask layer 97. For example, each point within a portion of the conductive hard mask layer 97 located within an area enclosed by a set of peripheral discrete openings 98B is electrically connected to the semiconductor substrate (9, 10) through a portion of the conductive hard mask layer 97 laterally extending between neighboring pairs of the peripheral discrete openings 98 through the conductive hard mask layer 97 overlying the set of peripheral discrete via cavities 83. Thus, any electrical charge (e.g., electrons) that accumulates in the conductive hard mask layer 97 during the anisotropic etch process can be drained through a respective electric discharge path to the semiconductor substrate (9, 10). Therefore, arcing can be reduced or avoided during the one or more anisotropic etch processes that form the contact via cavities (85, 7P, 87) and a set of peripheral discrete via cavities 83 in each memory die 900. Electrical grounding of the conductive hard mask layer 97 is provided throughout the entirety of the conductive hard mask layer 97 according to an aspect of the present disclosure, and as such, arcing can be entirely prevented during the at least one second anisotropic etch process. In contrast, if a continuous peripheral trench was formed around the edge of the die 900 instead of the peripheral discrete openings 98B, then arcing may occur across the continuous peripheral trench during the anisotropic etching due to a difference in high and low voltage charges in separate portions of the conductive hard mask layer 97 on opposite sides of the trench.

In one embodiment, a maximum lateral dimension (such as a diameter or a major axis) of each peripheral discrete via cavity 83 may be in a range from 100 nm to 2 microns, such as from 200 nm to 1 micron, although lesser and greater maximum lateral dimensions may also be employed. In one embodiment, a maximum nearest neighbor distance within the peripheral discrete via cavities 83 may be less than a maximum lateral dimension (such as a diameter or a major axis) of each peripheral discrete via cavity 83 within the set of peripheral discrete via cavities 83. In one embodiment, all sidewall surfaces of the set of peripheral discrete via cavities 83 may be dielectric surfaces, which may include surfaces of the contact-level dielectric layer 80, the insulating cap layer 70, and the dielectric material portion 65.

The conductive hard mask layer 97 may be subsequently removed, for example, by performing a selective wet etch process. While an embodiment in which the conductive hard mask layer 97 is removed immediately after formation of the contact via cavities (85, 7P, 87) and the set of peripheral discrete via cavities 83 in each semiconductor die 900 is described above, alternative embodiments are expressly contemplated herein in which the conductive hard mask layer 97 is removed at any subsequent processing step prior to, during or after formation of an edge seal structure.

Figure 13A:
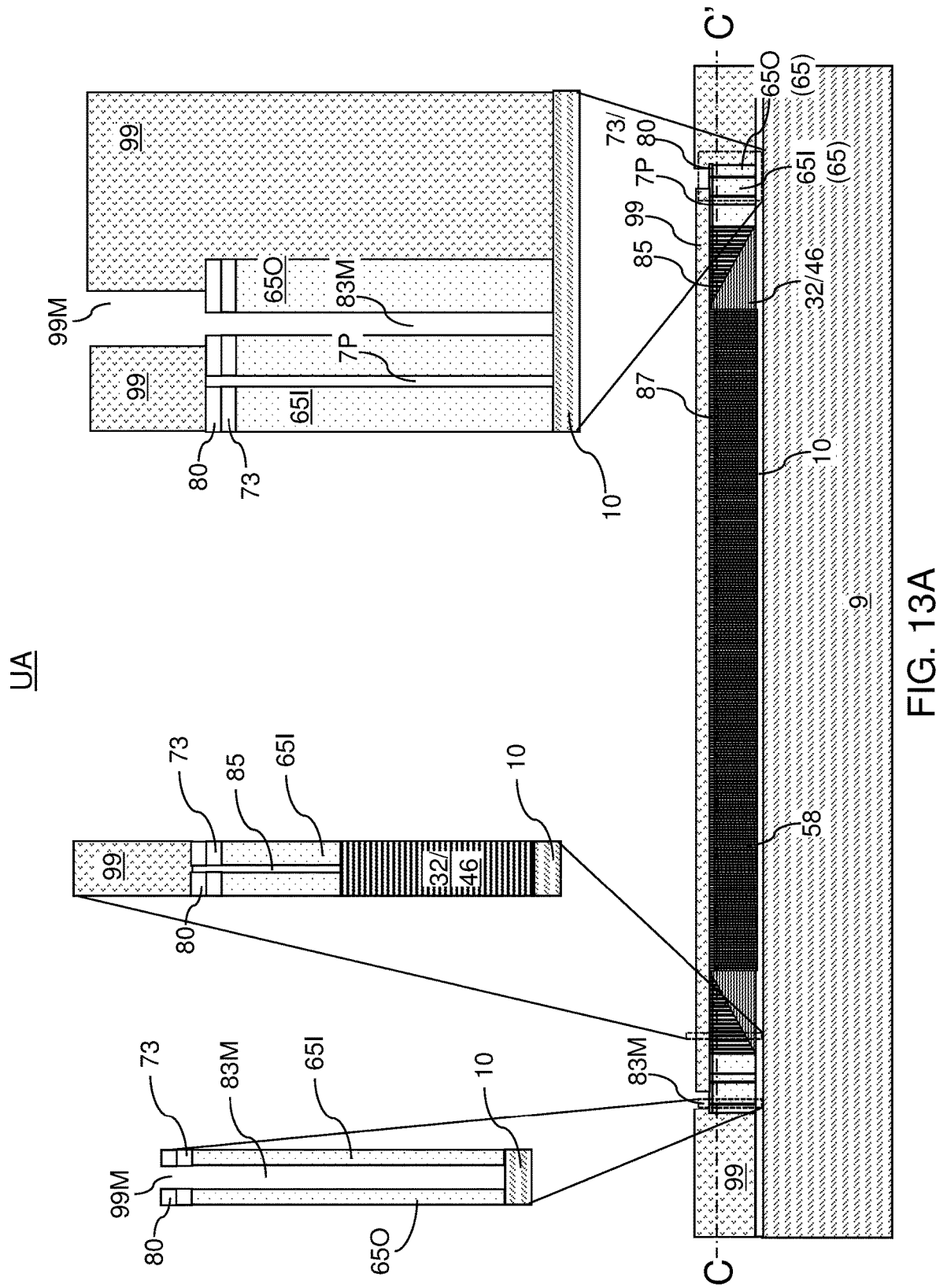
FIG. 13A is a vertical cross-sectional view of the unit area of the wafer including the first exemplary structure after formation of a continuous moat trench according to an embodiment of the present disclosure.
Figure 13B:
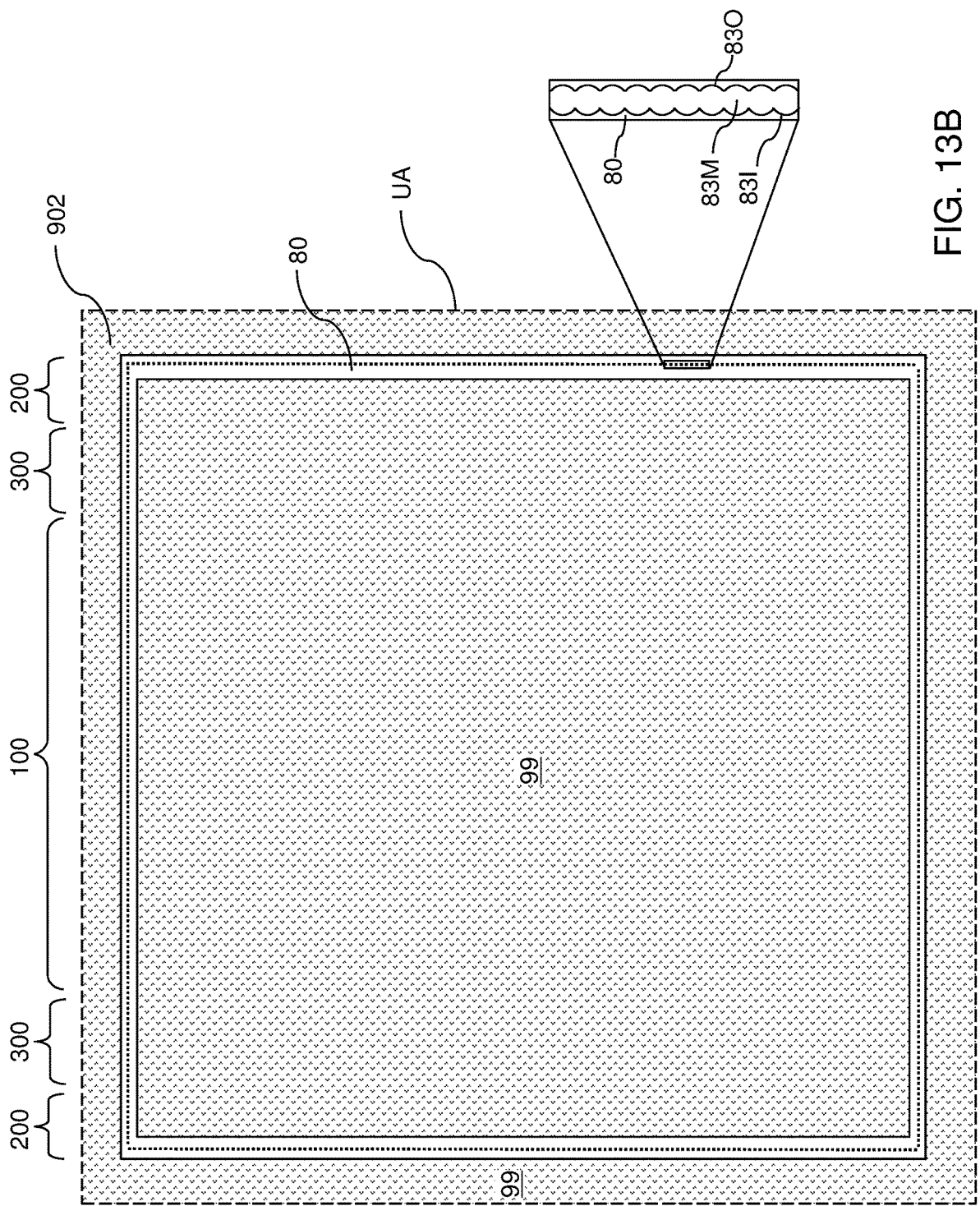
FIG. 13B is a top-down view of the unit area of the wafer of FIG. 13A.
Figure 13C:
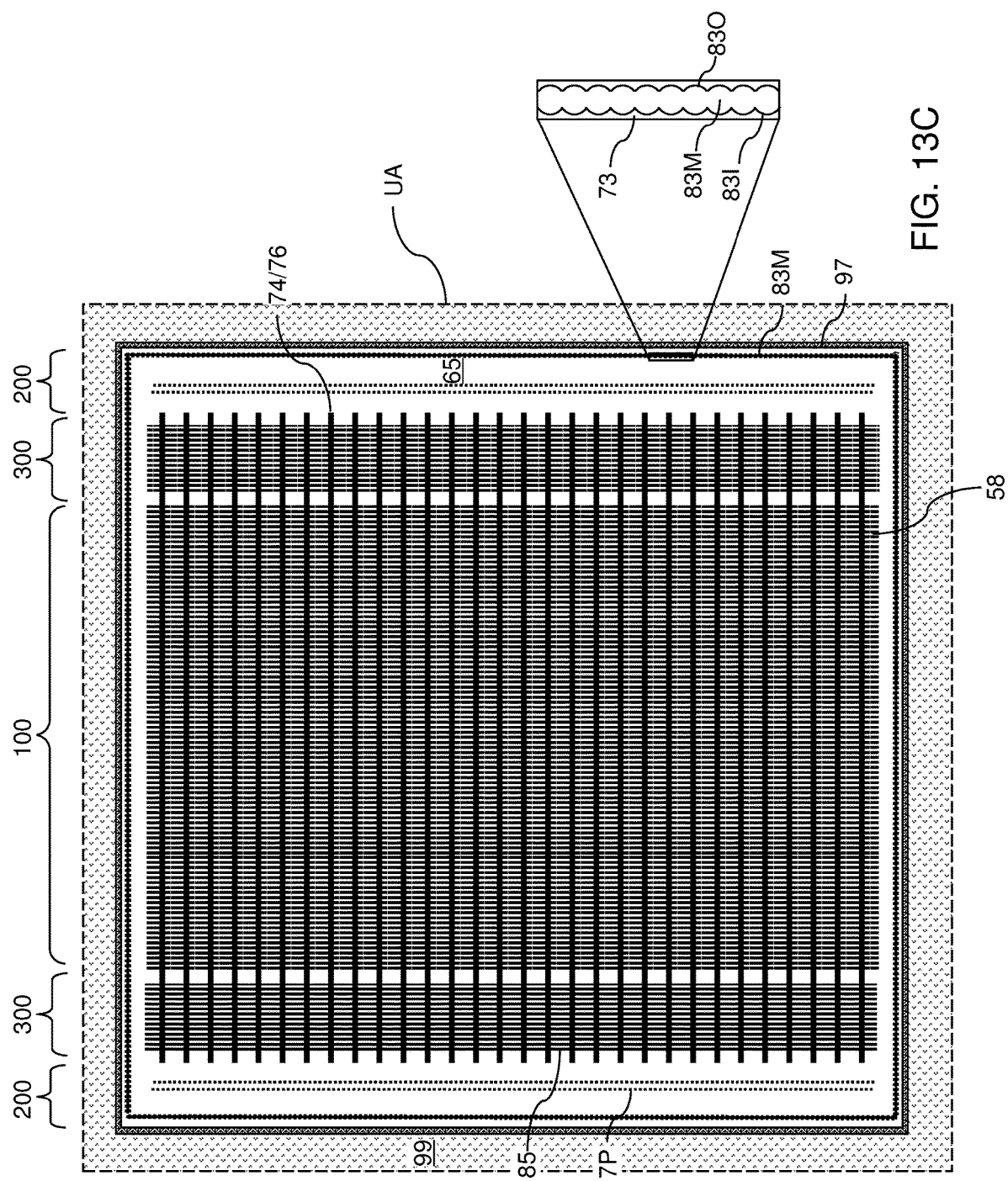
FIG. 13C is a horizontal cross-sectional view of the unit area of the wafer along the horizontal plane C-C' of FIG. 13A.
Figure 13D:
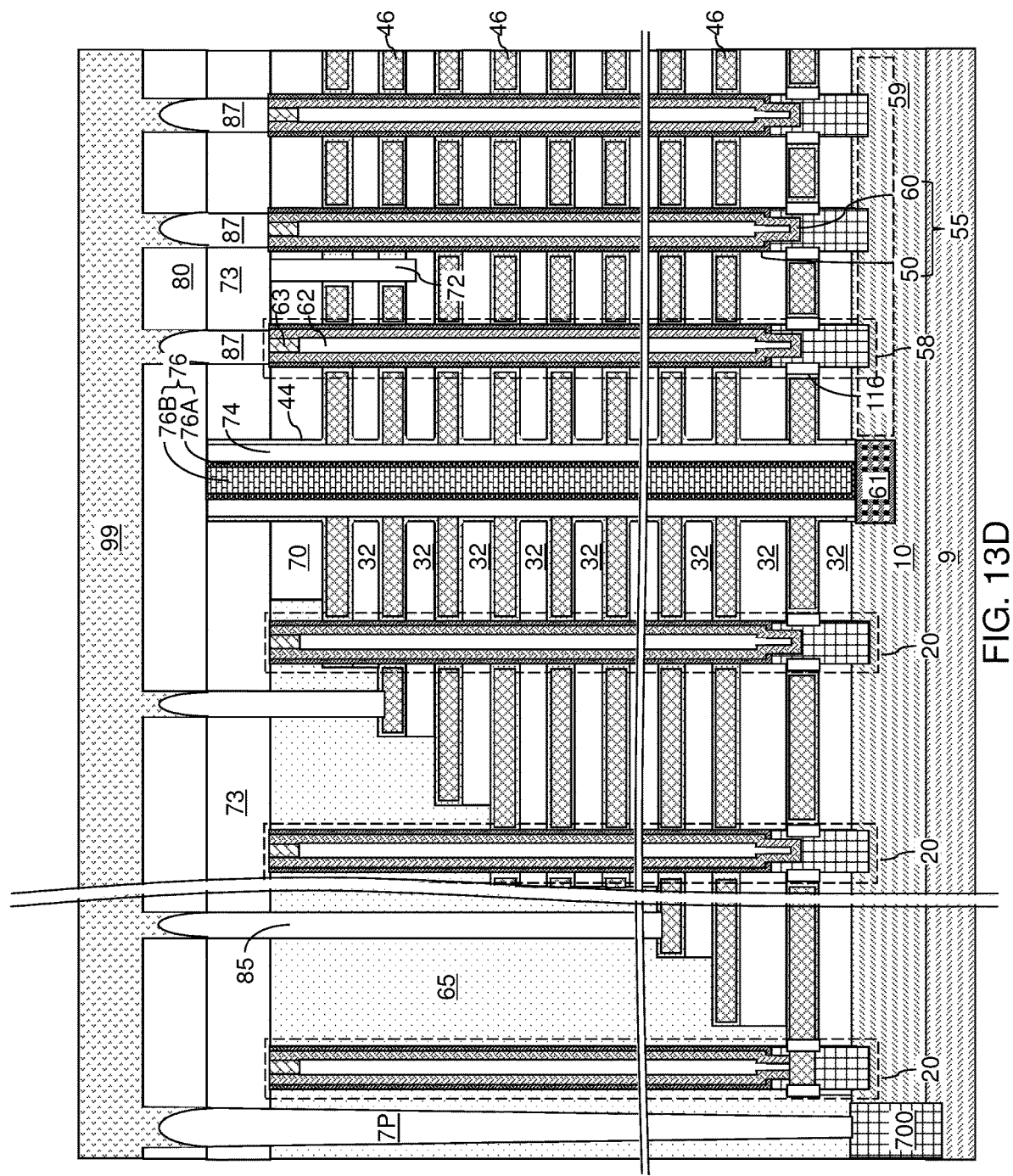
FIG. 13D is a vertical cross-sectional view of a region of the first exemplary structure within the die illustrated in FIGS. 13A-13C.

Referring to FIGS. 13A-13D, a photoresist layer 99 may be applied over the wafer 1000, and may be lithographically patterned to form a moat-shaped opening over each set of peripheral discrete via cavities 83. Subsequently, an isotropic etch process may be performed to laterally expand the discrete via cavities 83 and to provide a continuous moat trench 83M within each semiconductor die 900. FIG. 13A is a vertical cross-sectional view of the unit area UA of the wafer 1000 including the first exemplary structure after formation of a continuous moat trench 83M according to an embodiment of the present disclosure. FIG. 13B is a top-down view of the unit area UA of the wafer 1000 of FIG. 13A. FIG. 13C is a horizontal cross-sectional view of the unit area UA of the wafer 1000 along the horizontal plane C-C' of FIG. 13A. FIG. 13D is a vertical cross-sectional view of a region of the first exemplary structure within the die 900 illustrated in FIGS. 13A-13C.

Specifically, the photoresist layer 99 may be formed, for example, by spin-coating. A lithographic exposure and development process may be performed to pattern the photoresist layer 99. A moat-shaped opening 99M can be formed through the photoresist layer 99 over each set of peripheral discrete via cavities 83 such that the peripheral discrete via cavities 83 are not covered by the patterned photoresist layer 99. An isotropic etch process can be performed to laterally expand the peripheral discrete via cavities 83 until the peripheral discrete via cavities 83 merge with each other and form a continuous moat trench 83M around the periphery of each semiconductor die 900. The dielectric material portion 65 of each semiconductor die 900 is divided into an inner dielectric material portion 65I that is laterally surrounded by the continuous moat trench 83M, and an outer dielectric material portion 65O that laterally surrounds the continuous moat trench 83M. The inner dielectric material portion 65I comprises an inner region of the dielectric material portion 65, and the outer dielectric material portion 65O comprises an outer region of the dielectric material portion 65.

In one embodiment, each of the peripheral discrete via cavities 83 may have a respective circular or elliptical horizontal cross-sectional shape, and the continuous moat trench 83M comprises a laterally-undulating outer sidewall 830 having horizontally-concave outer surface segments that are adjoined to each other, and a laterally-undulating inner sidewall 831 having horizontally-concave inner surface segments that are adjoined to each other. As used herein, a surface is "laterally-undulating" if a horizontal cross-sectional profile of the surface is undulating. In one embodiment, the region of the dielectric material portion 65 between the continuous moat trench 83M and the sidewalls of the semiconductor die 900 (i.e., the outer dielectric material portion 65O) may be free of any semiconductor device, i.e., not in direct contact with any semiconductor device. The photoresist layer 99 may be subsequently removed, for example, by ashing.

Figure 14A:
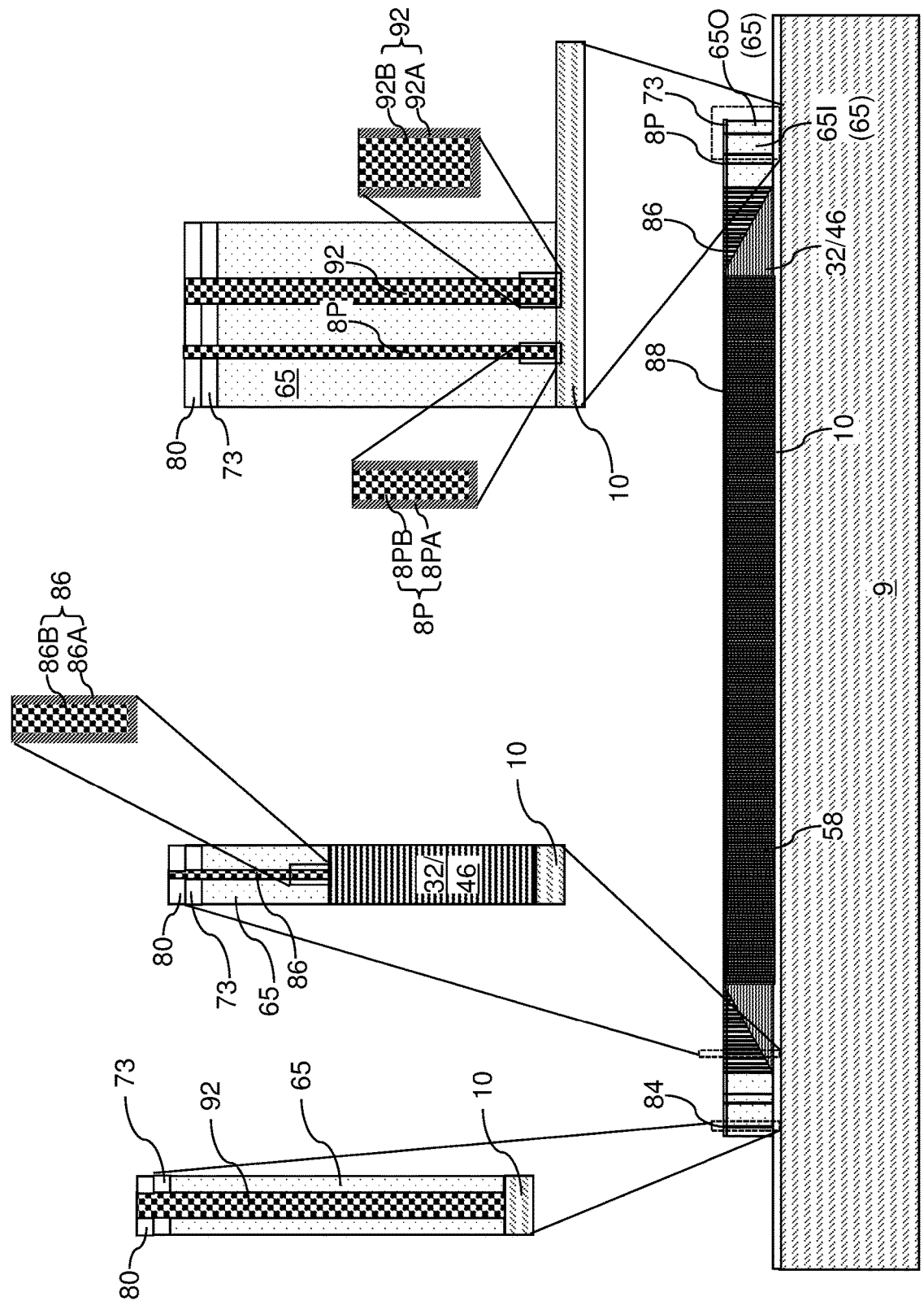
FIG. 14A is a vertical cross-sectional view of the unit area of the wafer including the first exemplary structure after formation of contact via structures and a metal edge seal structure according to an embodiment of the present disclosure.
Figure 14B:
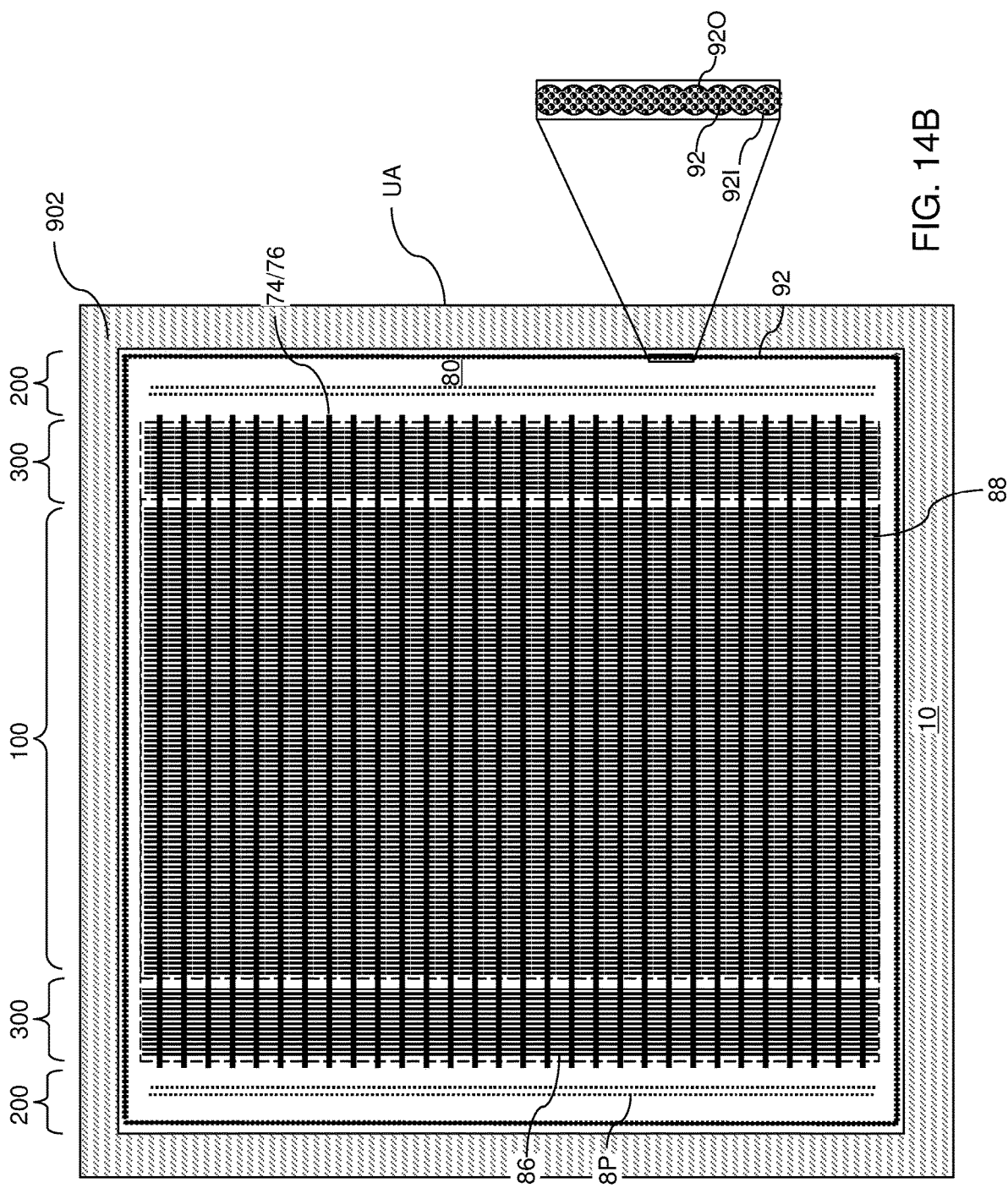
FIG. 14B is a top-down view of the unit area of the wafer of FIG. 14A.
Figure 14C:
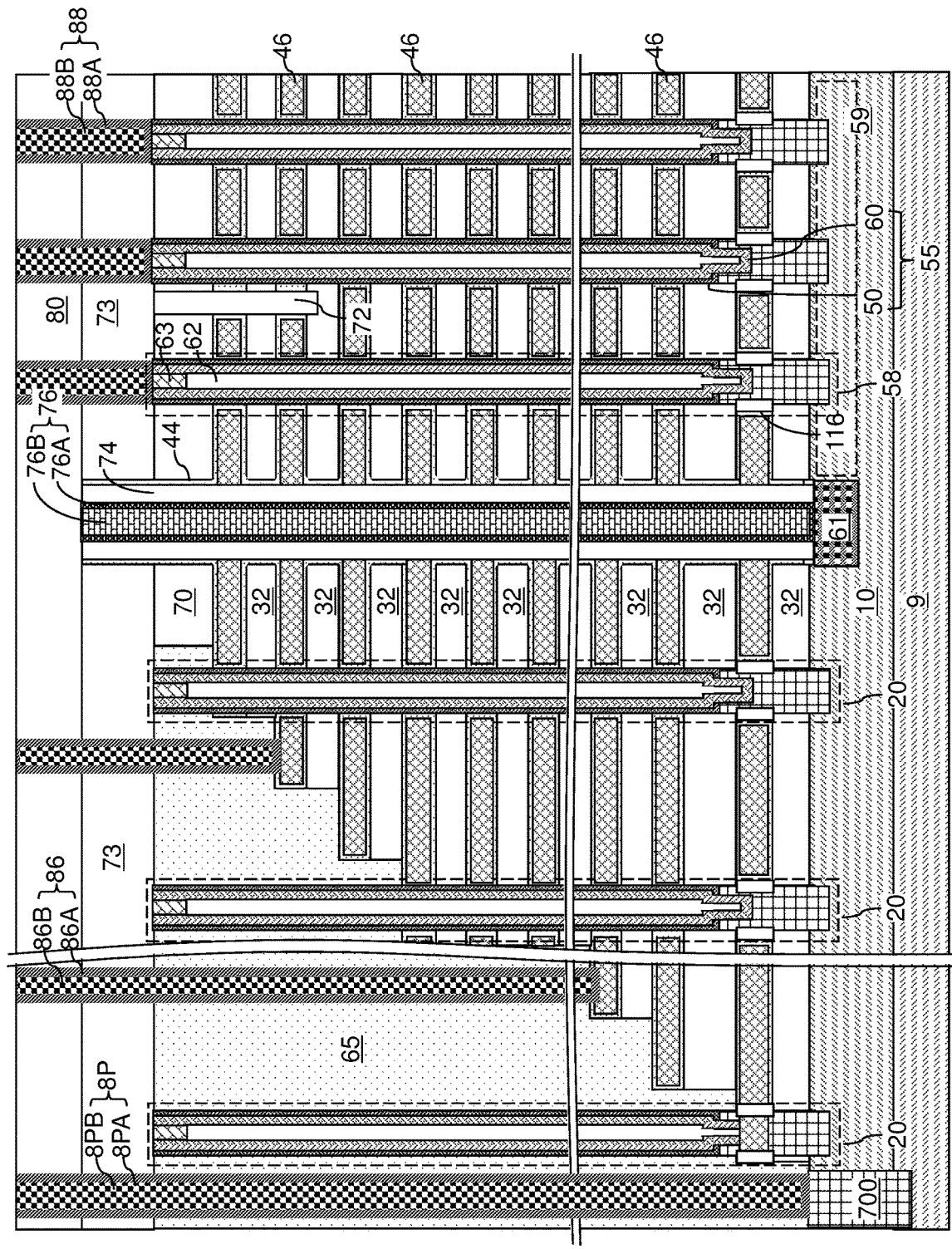
FIG. 14C is a vertical cross-sectional view of a region of the first exemplary structure within the die illustrated in FIGS. 14A and 14B.
Figure 14D:
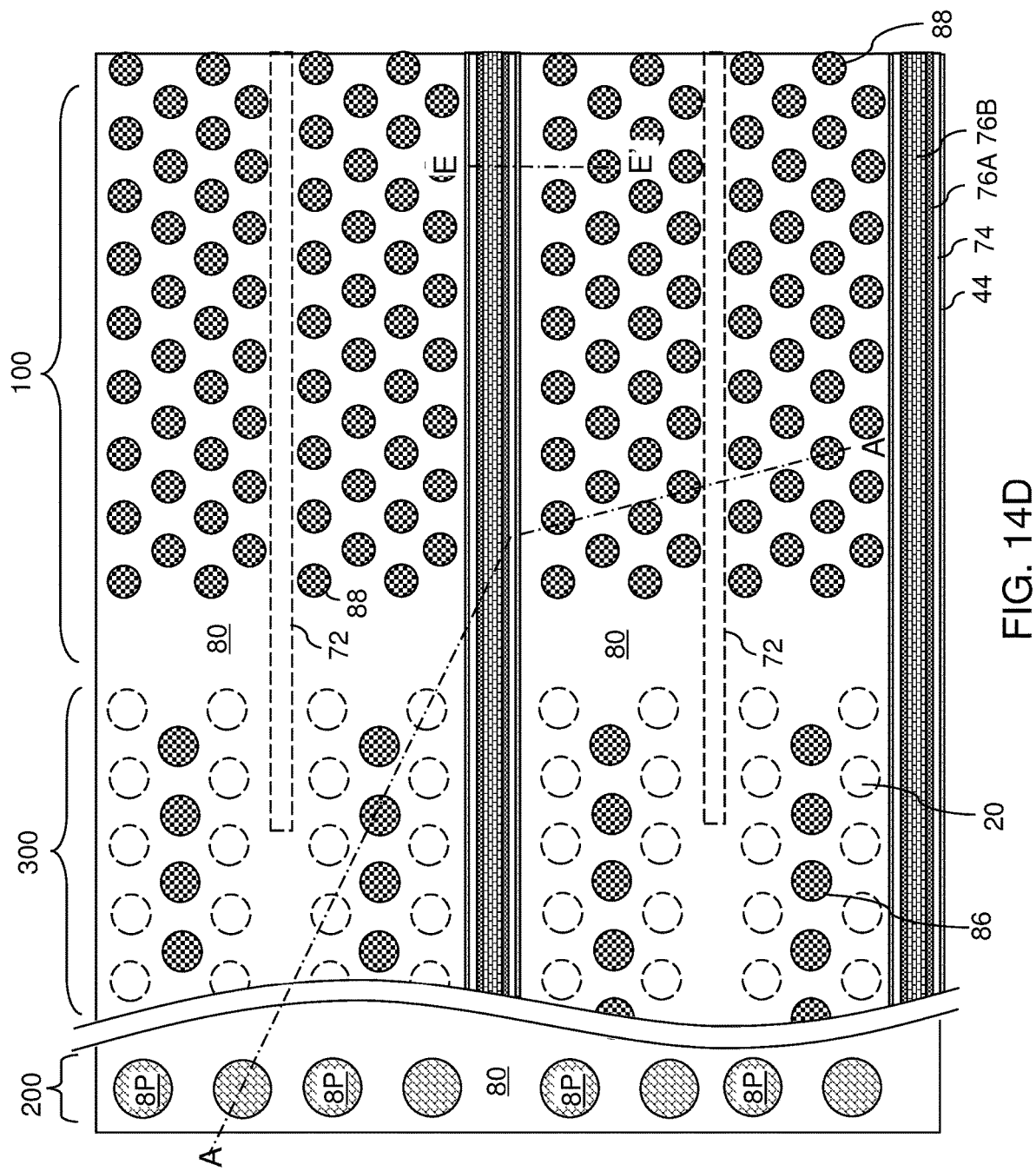
FIG. 14D is a top-down view the region of the first exemplary structure of FIG. 14C.
Figure 14E:
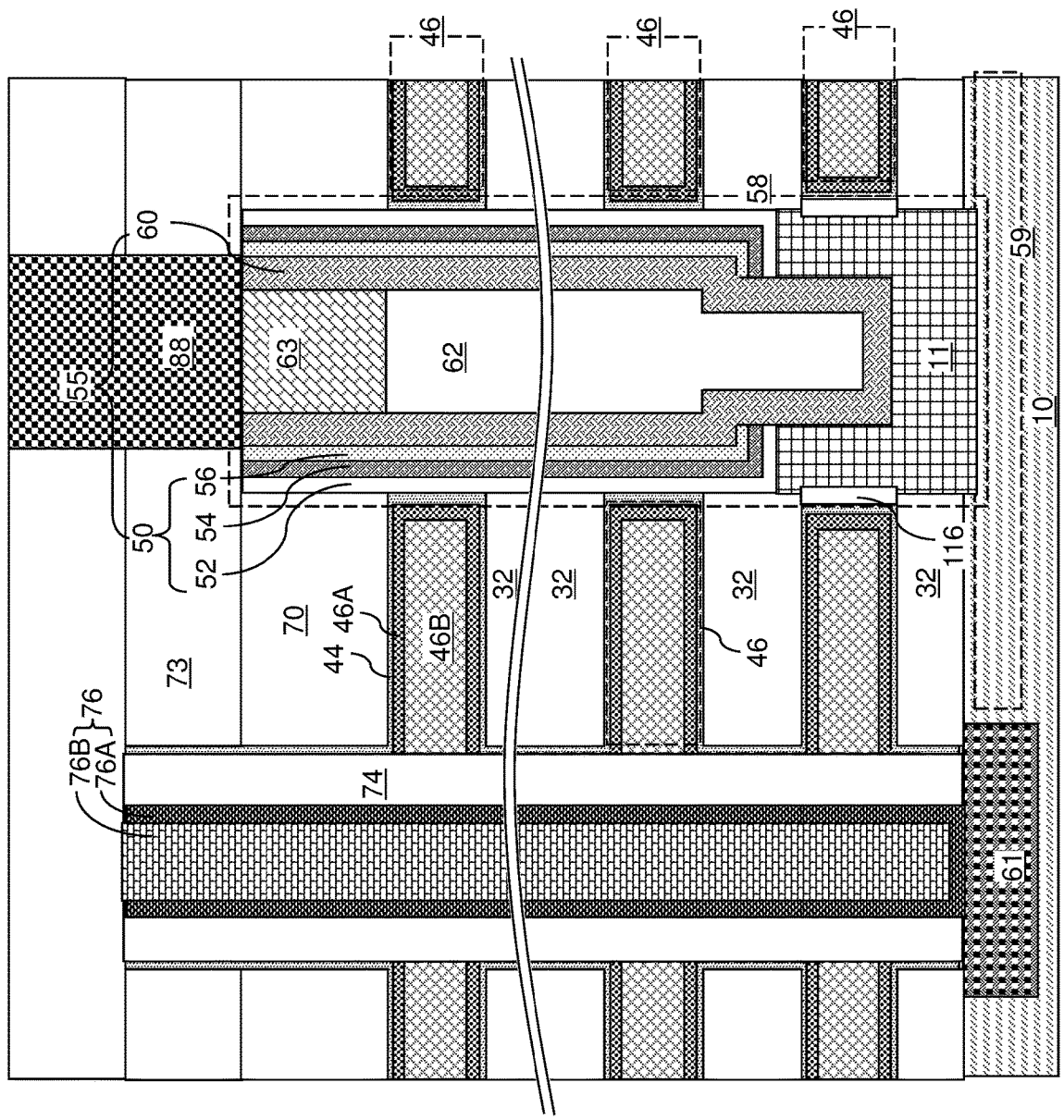
FIG. 14E is a vertical cross-sectional view of first exemplary structure along the vertical plane E-E' of FIG. 14D.

Referring to FIGS. 14A-14E, various contact via structures (86, 8P, 88) can be formed in the various contact via cavities (85, 7P, 87) and a conductive edge seal structure 92 can be formed in the continuous moat trench 83M. FIG. 14A is a vertical cross-sectional view of the unit area UA of the wafer 1000 including the first exemplary structure after formation of contact via structures (86, 8P) and a conductive edge seal structure 92 according to an embodiment of the present disclosure. FIG. 14B is a top-down view of the unit area UA of the wafer 1000 of FIG. 14A. FIG. 14C is a vertical cross-sectional view of a region of the first exemplary structure within the die 900 illustrated in FIGS. 14A and 14B. FIG. 14D is a top-down view the region of the first exemplary structure of FIG. 14C. FIG. 14E is a vertical cross-sectional view of first exemplary structure along the vertical plane E-E' of FIG. 14D.

Specifically, at least one conductive material is deposited in the various contact via cavities (85, 7P, 87) and the continuous moat trench 83M. In one embodiment, the at least one conductive material may comprise a conductive nitride liner material and a metal fill material which may be a metal or a metal alloy. For example, the conductive nitride liner material may comprise TiN, TaN, WN, and/or MoN. The metal fill material may comprise W, Ti, Ta, Mo, Ru, Co, Cu, or alloys thereof. The at least one conductive material may be deposited, for example, by chemical vapor deposition, physical vapor deposition, electroplating, and/or electroless plating. Excess portions of the at least one conductive material may be removed from above the horizontal plane including the top surface of the contact-level dielectric layer 80 by a planarization process, which may employ a recess etch process and/or a chemical mechanical polishing process.

Each remaining portion of the at least one conductive material filling a drain-contact via cavity 87 constitutes a drain-contact via structure 88. Each remaining portion of the at least one conductive material filling a layer contact via cavity 85 constitutes a layer contact via structure 86. Each remaining portion of the at least one conductive material filling an optional peripheral contact via cavity 7P constitutes an optional peripheral contact via structure 8P. A remaining portion of the at least one conductive material filling the continuous moat trench 83M constitutes a conductive edge seal structure 92.

In one embodiment, each of the contact via structures (88, 86, 8P) comprises a conductive contact liner (88A, 86A, 8PA) and a conductive fill material portion (88B, 86B, 8PB) embedded within the conductive contact liner (88A, 86A, 8PA). The conductive edge seal structure 92 comprises a conductive edge seal liner 92A and a conductive edge seal fill material portion 92B embedded within the conductive edge seal liner 92A. In one embodiment, the conductive contact liners (88A, 86A, 8PA) and the conductive edge seal liner 92A have a first conductive composition (e.g., the material composition of the conductive nitride liner material) and have a same thickness, and the conductive edge seal fill material portions 92B and the conductive fill material portion (88B, 86B, 8PB) have a second conductive composition (e.g., the material composition of the conductive fill material).

In one embodiment, an inner dielectric material portion 65I laterally surrounds the semiconductor devices of each semiconductor die 900. A conductive edge seal structure 92 laterally surrounds the inner dielectric material portion 65I, vertically extends from the semiconductor substrate (9, 10) at least to a horizontal plane including a topmost surface of the inner dielectric material portion 65I, and has laterally-undulating inner sidewalls 921 and laterally-undulating outer sidewalls 920 that generally laterally extend parallel to a most proximal one of outer sidewalls of the semiconductor die 900. In one embodiment, an outer dielectric material portion 65O laterally surrounds the conductive edge seal structure 92.

In one embodiment, outer sidewalls of the outer dielectric material portion 65O are the outer sidewalls of the semiconductor die 900. In one embodiment, each of the laterally-undulating outer sidewalls 920 of the conductive edge seal structure 92 has respective horizontally-concave outer surface segments that are adjoined to each other, and each of the laterally-undulating inner sidewalls 921 of the conductive edge seal structure 92 has respective horizontally-concave inner surface segments that are adjoined to each other. In one embodiment, the outer dielectric material portion 65O is not in direct contact with any of the semiconductor devices in the semiconductor die 900.

In one embodiment, the semiconductor die 900 comprises metal interconnect structures, the outer dielectric material portion 65O is not in direct contact with any of the metal interconnect structures, and all of the metal interconnect structures are laterally surrounded by the conductive edge seal structure 92. In one embodiment, the semiconductor die 900 comprises a contact-level dielectric layer 80 overlying the semiconductor devices, the inner dielectric material portion 65I, and the outer dielectric material portion 65O, wherein the conductive edge seal structure 92 vertically extends through the contact-level dielectric layer 80.

In one embodiment, the semiconductor die 900 comprises contact via structures (88, 86, 8P) vertically extending through the contact-level dielectric layer 80 and contacting top surfaces of electrically conductive nodes of the semiconductor devices and having top surfaces that are located within a same horizontal plane as a top surface of the conductive edge seal structure 92. In one embodiment, the semiconductor devices comprise an alternating stack of insulating layers 32 and electrically conductive layers 46, and memory opening fill structures 58 located within memory openings 49 that vertically extend through the alternating stack and comprising vertical semiconductor channel and a respective vertical stack of memory elements. In one embodiment, each of the memory opening fill structures 58 comprises a NAND string, the electrically conductive layers 46 comprise word lines of the NAND strings, and the electrically conductive nodes of the semiconductor devices comprise the word lines. In some embodiments, the conductive hard mask layer 97 may be removed after the processing steps of FIGS. 13A-13D prior to, during, or after, formation of the conductive edge seal structure 92.

Referring collectively to FIGS. 1-14E and according to various embodiments of the present disclosure, a semiconductor die 900 comprises semiconductor devices (e.g., vertical NAND strings) located over a semiconductor substrate (9, 10), an inner dielectric material portion 65I laterally surrounding the semiconductor devices, a conductive edge seal structure 92 that laterally surrounds the inner dielectric material portion 65I, vertically extends from the semiconductor substrate (9, 10) at least to a horizontal plane including a topmost surface of the inner dielectric material portion 65I, and has laterally-undulating inner sidewalls 921 and laterally-undulating outer sidewalls 920 (e.g., that generally laterally extend parallel to a most proximal one of outer sidewalls of the semiconductor die 900), and an outer dielectric material portion 65O laterally surrounding the conductive edge seal structure 92. In one embodiment, the outer sidewalls of the outer dielectric material portion 65O are the outer sidewalls of the semiconductor die 900. In one embodiment, each of the laterally-undulating outer sidewalls 920 has respective horizontally-concave outer surface segments that are adjoined to each other, and each of the laterally-undulating inner sidewalls 921 has respective horizontally-concave inner surface segments that are adjoined to each other.

Figure 15A:
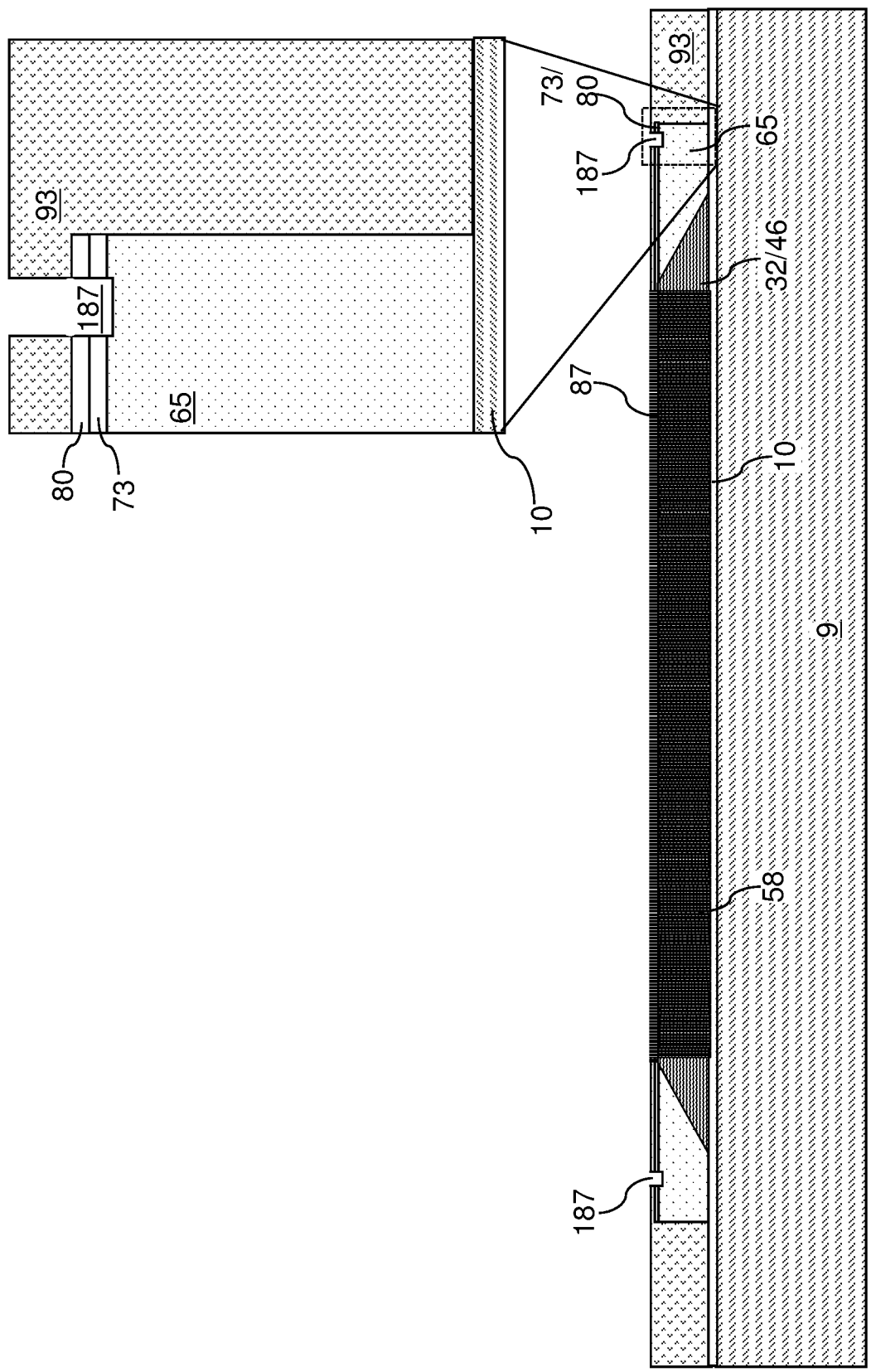
FIG. 15A is a vertical cross-sectional view of a unit area of a wafer including a second exemplary structure after formation of edge-region recess cavities and drain-contact via cavities according to an embodiment of the present disclosure.
Figure 15B:
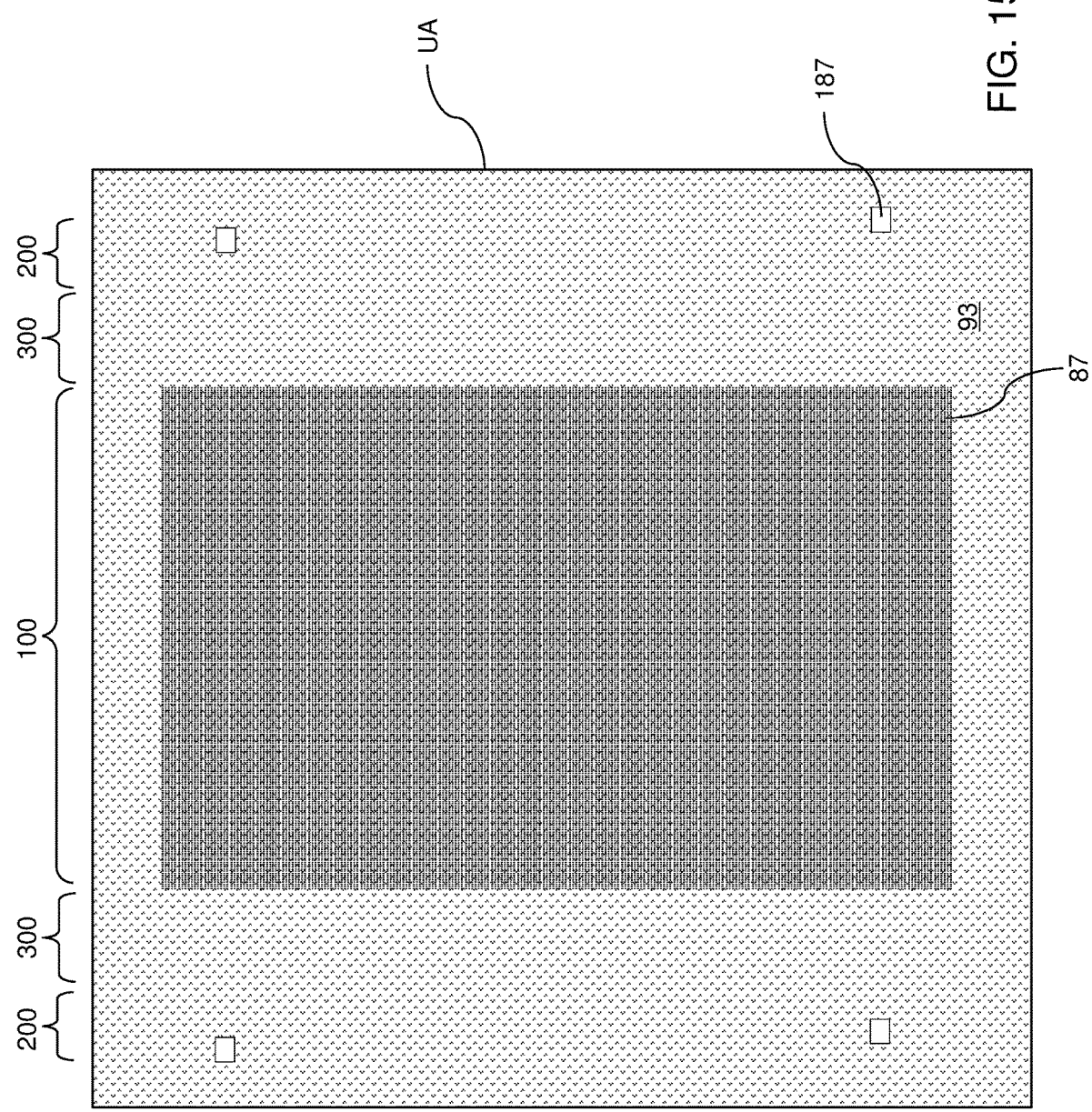
FIG. 15B is a top-down view of the unit area of the wafer of FIG. 15A.
Figure 15C:
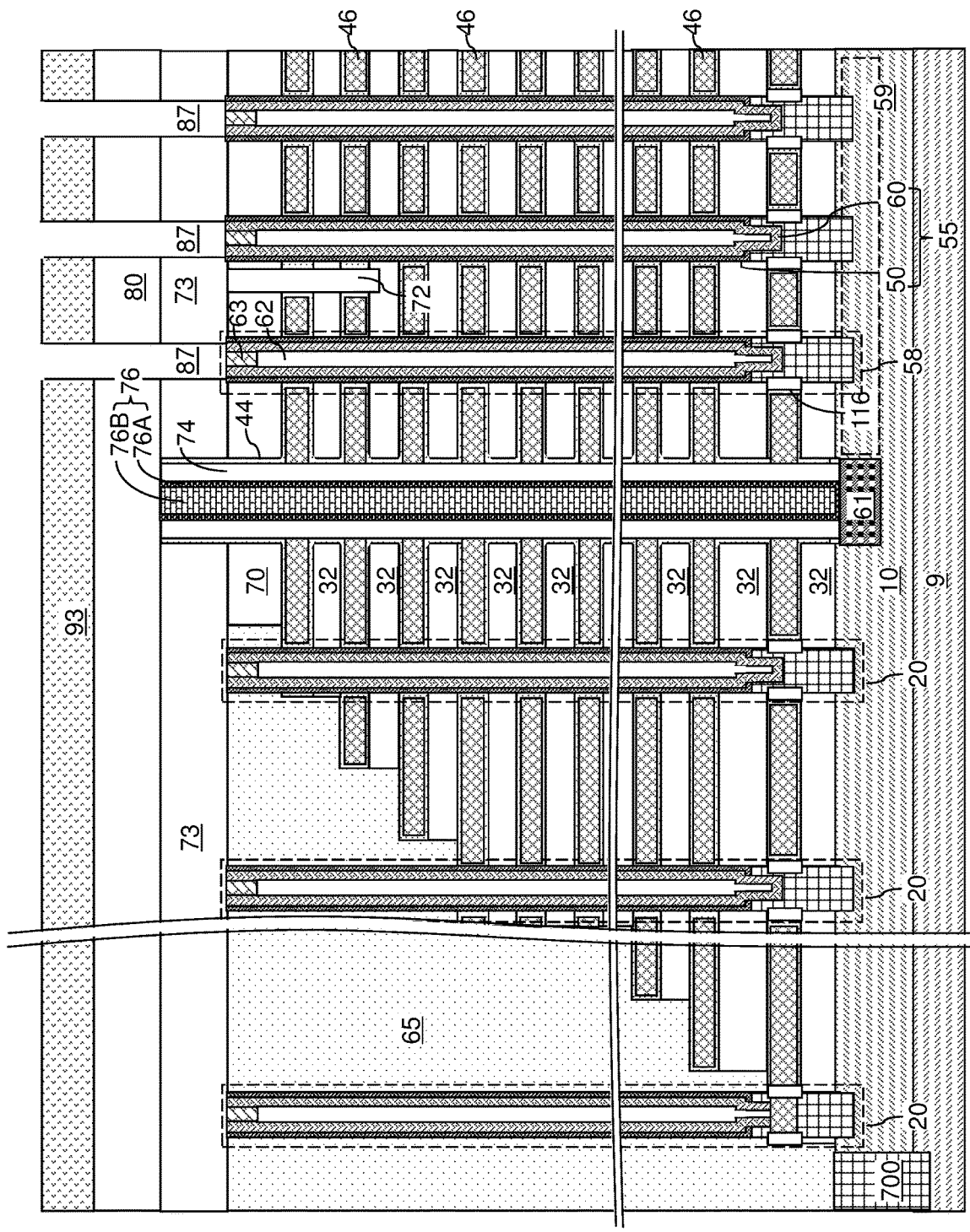
FIG. 15C is a vertical cross-sectional view of a region of the second exemplary structure within the die illustrated in FIGS. 15A and 15B.

Referring to FIGS. 15A-15C, a second exemplary structure according to an embodiment of the present disclosure is illustrated. FIG. 15A is a vertical cross-sectional view of a unit area UA of a wafer 1000 including the second exemplary structure after formation of edge-region recess cavities 187 and drain-contact via cavities 87 according to an embodiment of the present disclosure. FIG. 15B is a top-down view of the unit area UA of the wafer 1000 of FIG. 15A. FIG. 15C is a vertical cross-sectional view of a region of the second exemplary structure within the die illustrated in FIGS. 15A and 15B.

The second exemplary structure can be derived from the first exemplary structure of FIGS. 11A-11C by forming a photoresist layer 93 over the two-dimensional array of semiconductor dies 900, by lithographically patterning various discrete openings in the photoresist layer 93, and by transferring the pattern of the various discrete openings through the contact-level dielectric layer 80 and the capping dielectric layer 73. Edge-region recess cavities 187 can be formed through the contact-level dielectric layer 80 and the capping dielectric layer 73 in proximity to outer sidewalls of the dielectric material portions 65 at the periphery of each semiconductor die 900. A bottom surface of each edge-region recess cavity 187 may be formed at or underneath the top surface of the dielectric material portion 65. Drain-contact via cavities 87 are formed through the contact-level dielectric layer 80 and the capping dielectric layer 73 above the top surfaces of the drain regions 63 during the same etching step as the edge-region recess cavities 187. The drain-contact via cavities 87 extend through the contact-level dielectric layer 80 down to top surfaces of the drain regions 63. A top surface of a drain region 63 may be physically exposed at the bottom of each drain-contact via cavity 87. The photoresist layer 93 can be subsequently removed, for example, by ashing.

Figure 16A:
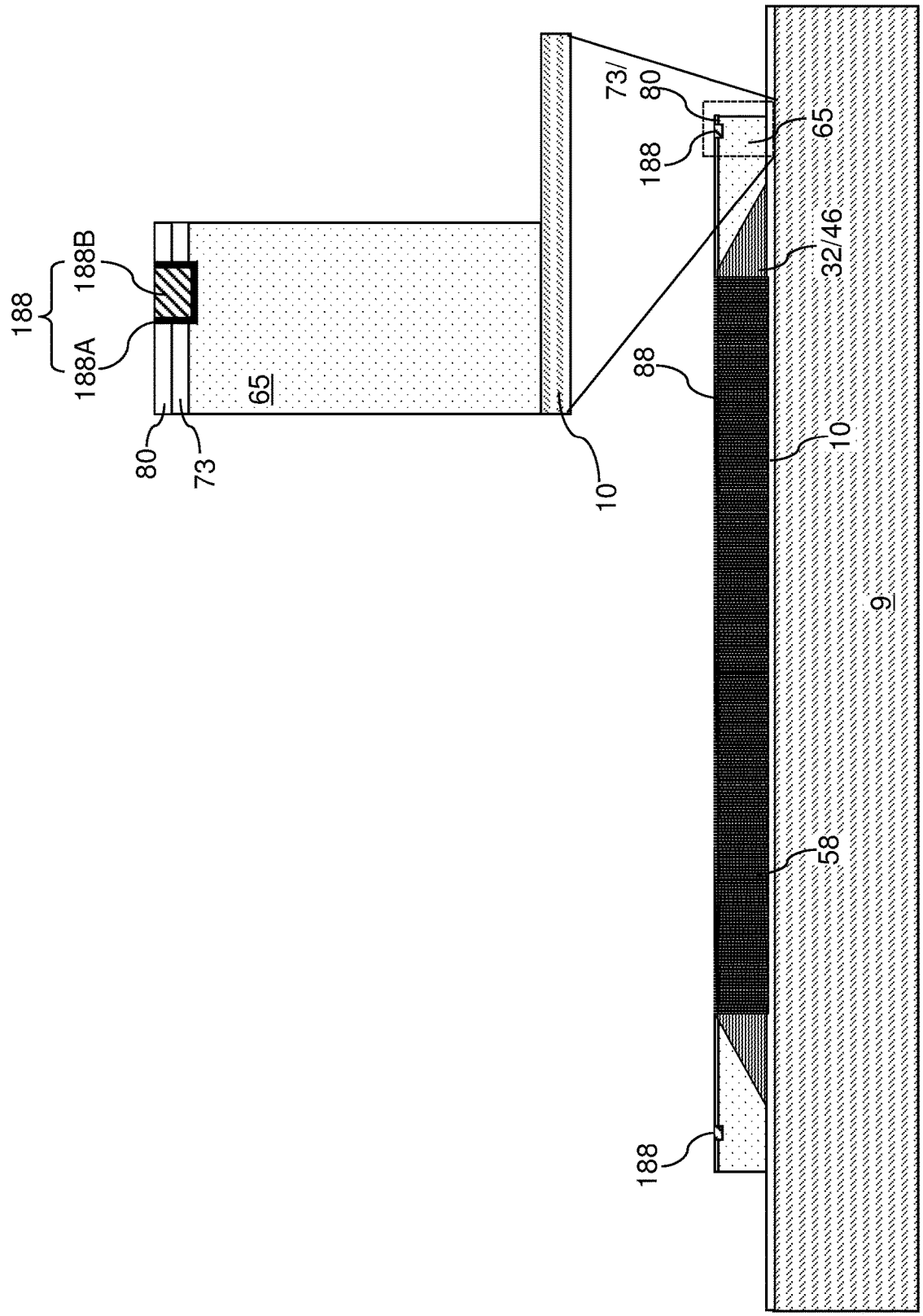
FIG. 16A is a vertical cross-sectional view of the unit area of the wafer including the second exemplary structure after formation of conductive bridge structures and drain-contact via structures according to an embodiment of the present disclosure.
Figure 16B:
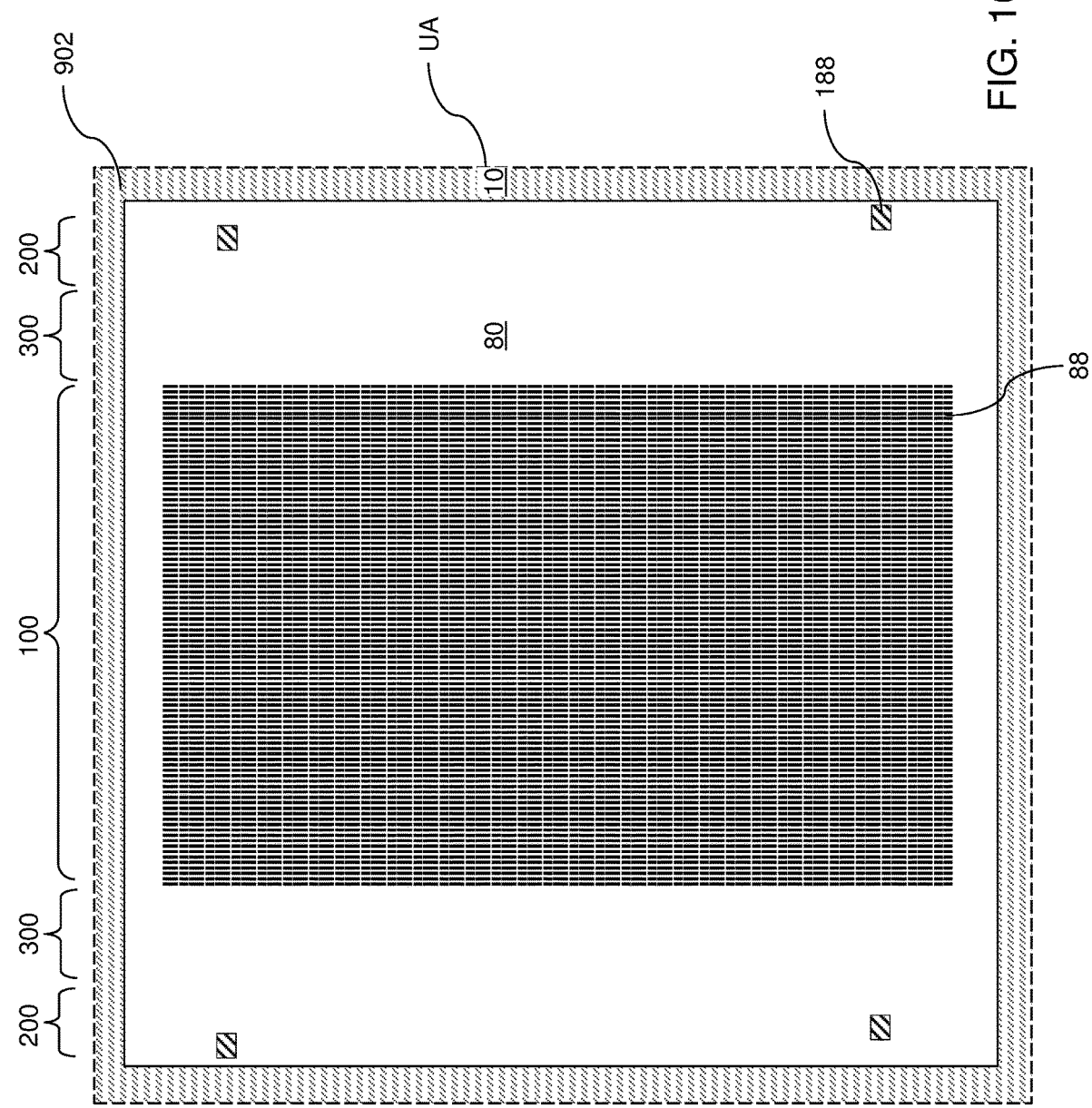
FIG. 16B is a top-down view of the unit area of the wafer of FIG. 16A.
Figure 16C:
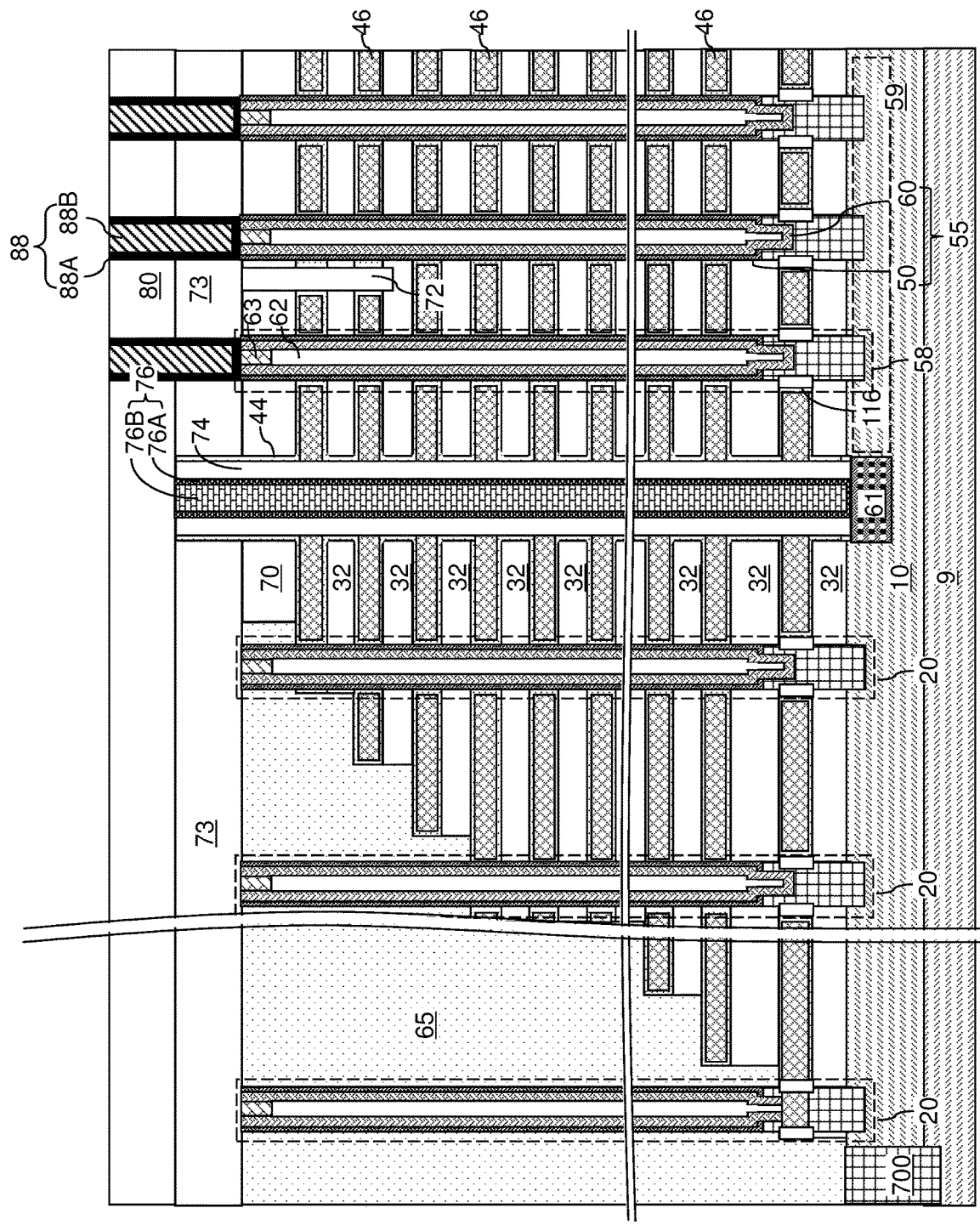
FIG. 16C is a vertical cross-sectional view of a region of the second exemplary structure within the die illustrated in FIGS. 16A and 16B.

Referring to FIGS. 16A-16C, at least one electrically conductive material is deposited in the edge-region recess cavities 187 and the drain-contact via cavities 87 to form conductive plates 188 and drain-contact via structures 88. FIG. 16A is a vertical cross-sectional view of the unit area UA of the wafer 1000 including the second exemplary structure after formation of conductive bridge structures (comprising conductive plates 188) and drain-contact via structures 88 according to an embodiment of the present disclosure. FIG. 16B is a top-down view of the unit area UA of the wafer 1000 of FIG. 16A. FIG. 16C is a vertical cross-sectional view of a region of the second exemplary structure within the die illustrated in FIGS. 16A and 16B.

Specifically, the at least one conductive material may comprise a conductive nitride liner material and a conductive fill material which may be a metal or an intermetallic alloy. For example, the conductive nitride liner material may comprise TiN, TaN, WN, and/or MoN. The conductive fill material may comprise W, Ti, Ta, Mo, Ru, Co, Cu, or alloys thereof. The at least one conductive material may be deposited, for example, by chemical vapor deposition, physical vapor deposition, electroplating, and/or electroless plating. Excess portions of the at least one conductive material may be removed from above the horizontal plane including the top surface of the contact-level dielectric layer 80 by a planarization process, which may employ a recess etch process and/or a chemical mechanical polishing process.

Each remaining portion of the at least one conductive material filling a drain-contact via cavity 87 constitutes a drain-contact via structure 88. Each remaining portion of the at least one conductive material filling an edge-region recess cavity 187 constitutes a conductive plate 188, which functions a conductive bridge structure during a subsequent anisotropic etch process. In one embodiment, each of the drain-contact via structures 88 and the conductive plates 188 comprises a conductive contact liner (88A, 188A) and a conductive fill material portion (88B, 188B) embedded within the conductive contact liner 88A. In one embodiment, the conductive contact liners (88A, 188A) may have a same conductive composition (i.e., the material composition of the conductive nitride liner material) thereamongst and have a same thickness. The conductive fill material portions (88B, 188B) may have a same conductive composition (i.e., the material composition of the conductive fill material) thereamongst.

Generally, at least one conductive structure (such as at least one conductive plate 188) can be formed through the contact-level dielectric layer 80 in a peripheral region of the semiconductor die 900. Each conductive structure can be subsequently employed as a conductive bridge structure (comprising a conductive plate 188) during a subsequent anisotropic etch process. In one embodiment, each of the at least one conductive structure (such as at least one conductive plate 188) has a respective bottom surface that is located above a horizontal plane including a top surface of the semiconductor substrate (9, 10). For example, each conductive plate 188 may have a bottom surface located above a horizontal plane including a topmost surface of the electrically conductive layers 46 within the alternating stack (32, 46). Each of the at least one conductive structure (such as the at least one conductive plate 188) is electrically isolated from the semiconductor substrate (9, 10).

Figure 17A:
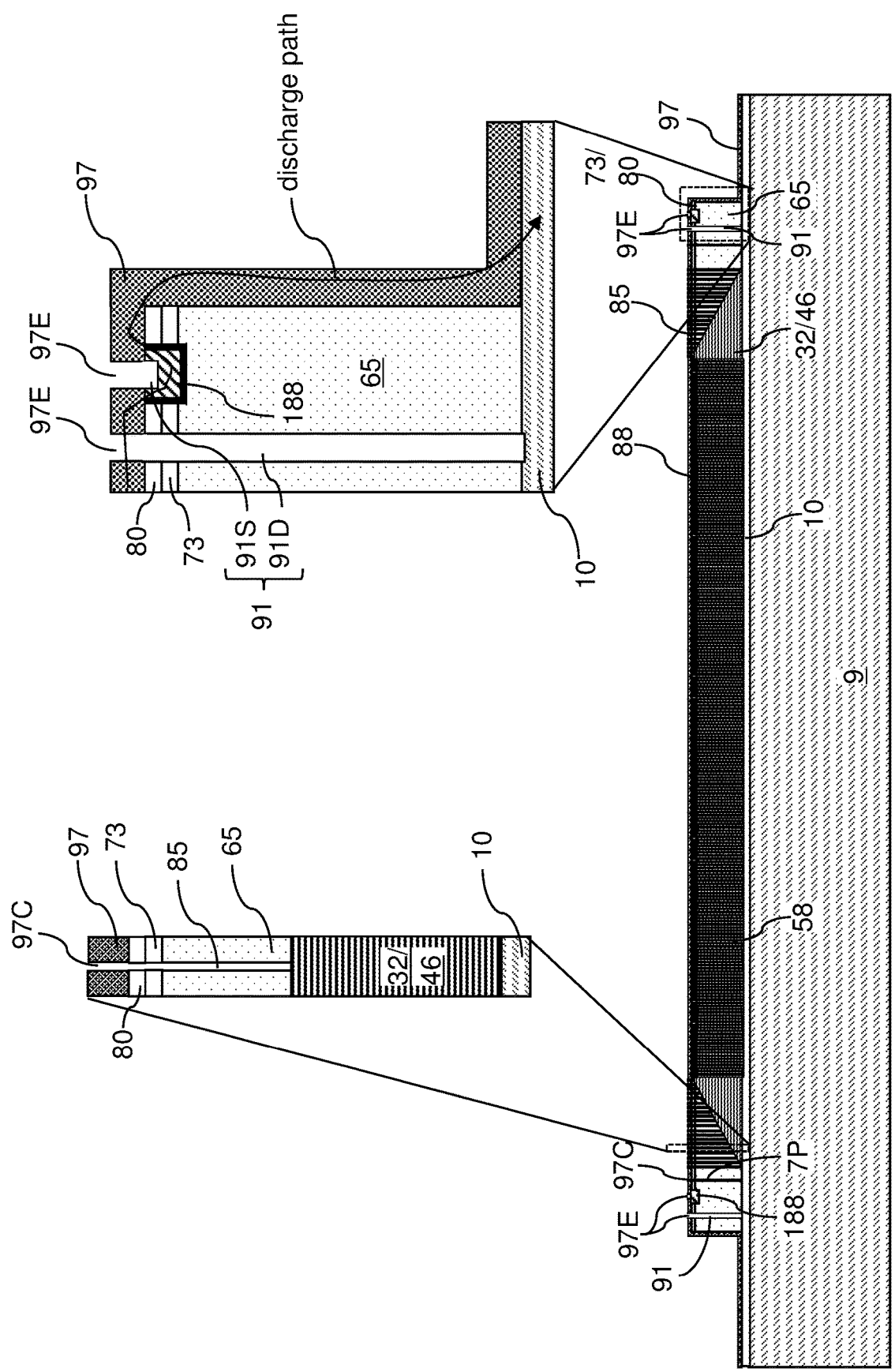
FIG. 17A is a vertical cross-sectional view of the unit area of the wafer including the second exemplary structure after formation of a patterned conductive hard mask layer and various via cavities and continuous moat trenches according to an embodiment of the present disclosure.
Figure 17B:
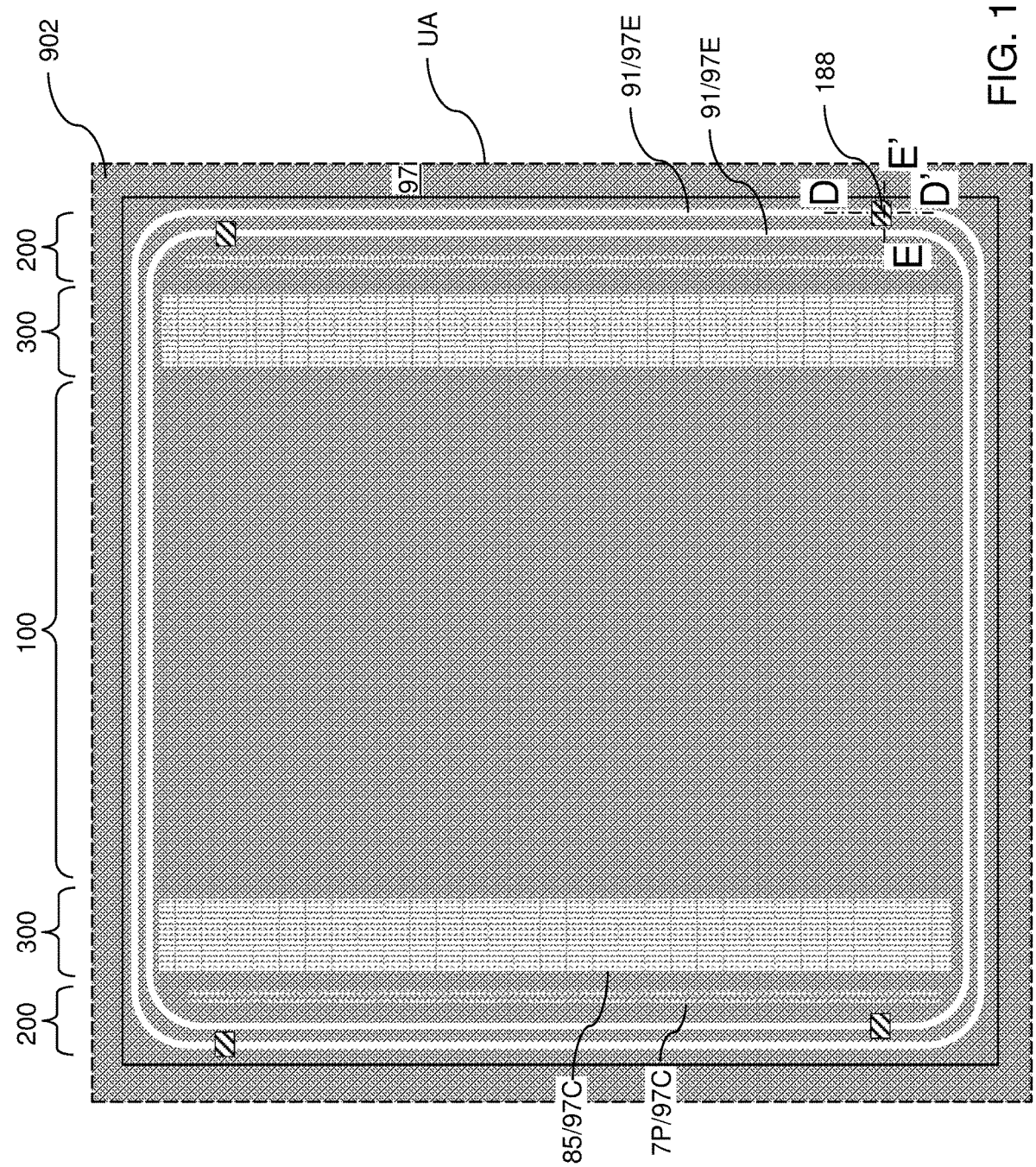
FIG. 17B is a top-down view of the unit area of the wafer of FIG. 16A.
Figure 17C:
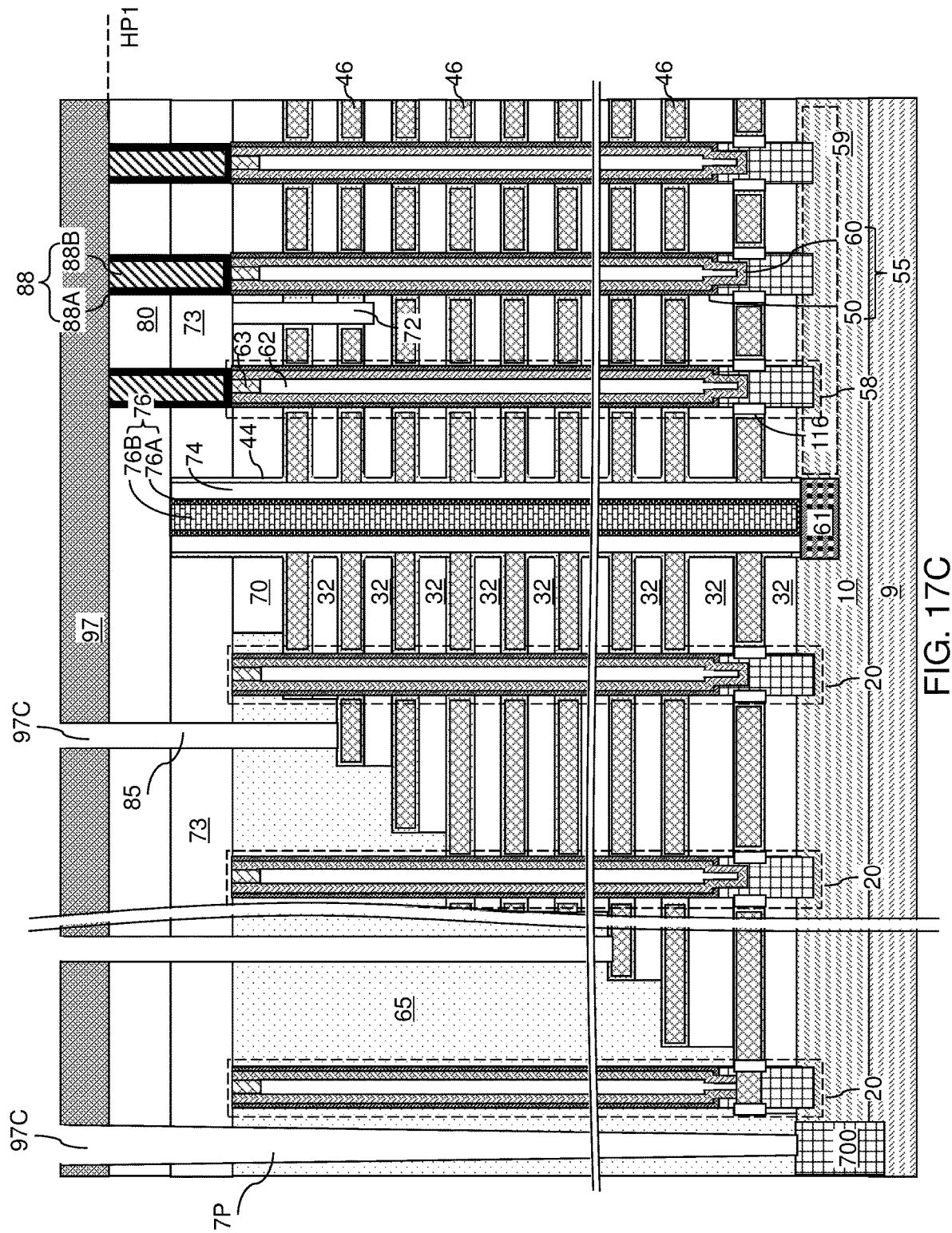
FIG. 17C is a vertical cross-sectional view of a region of the second exemplary structure within the die illustrated in FIGS. 17A and 17B.

Referring to FIGS. 17A-17E, a conductive hard mask layer 97 can be formed over the wafer 1000, and can be patterned to form openings therein, and the pattern of the openings in the conductive hard mask layer 97 can be transferred through underlying material portions to form various contact via cavities and moat trenches 91. FIG. 17A is a vertical cross-sectional view of the unit area UA of the wafer 1000 including the second exemplary structure after formation of a patterned conductive hard mask layer 97 and various via cavities and continuous moat trenches 91 according to an embodiment of the present disclosure. FIG. 17B is a top-down view of the unit area UA of the wafer 1000 of FIG. 16A. FIG. 17C is a vertical cross-sectional view of a region of the second exemplary structure within the die illustrated in FIGS. 17A and 17B. FIG. 17D is a vertical cross-sectional view of the second exemplary structure along the vertical plane D-D' of FIG. 17B. FIG. 17E is a vertical cross-sectional view of the second exemplary structure along the vertical plane E-E' of FIG. 17B.

Specifically, the conductive hard mask layer 97 can be formed over the semiconductor devices and the dielectric material portion 65 over the entire area of the wafer 1000. The conductive hard mask layer 97 may comprise a conductive metal nitride material (such as TiN, TaN, WN, and/or MoN) and/or a metal (such as W, Ti, Ta, W, Co, Ru, etc.) and/or a metal alloy. In one embodiment, the conductive hard mask layer 97 may comprise a tungsten layer. The conductive hard mask layer 97 may be deposited by a conformal or non-conformal deposition process provided that the top horizontal portions of the conductive hard mask layer 97 overlying the contact-level dielectric layer 80 is connected to bottom horizontal portions of the conductive hard mask layer 97 formed in the kerf regions 902 and contacting the top surface of the semiconductor substrate (9, 10) by vertically-extending portions of the conductive hard mask layer 97 located on sidewalls of the semiconductor dies 900 (which comprise sidewalls of the dielectric material portions 65). For example, the conductive hard mask layer 97 may be formed by chemical vapor deposition, physical vapor deposition, electroplating, and/or electroless plating. In one embodiment, the top horizontal portions of the conductive hard mask layer 97 overlying the contact-level dielectric layers 80 of the semiconductor dies 900 may have a thickness in a range from 20 nm to 400 nm, such as from 40 nm to 200 nm, although lesser and greater thicknesses may also be employed. In one embodiment, the conductive hard mask layer 97 continuously extends over sidewalls of the dielectric material portion 65 of each semiconductor die 900, and contacts a segment of a top surface of the semiconductor substrate (9, 10) located in the kerf region 902 that is located between the semiconductor die 900 and one of the edge of the semiconductor substrate or an additional semiconductor dies 900 located on the semiconductor substrate (9, 10).

A photoresist layer (not shown) may be applied over the conductive hard mask layer 97, and may be lithographically patterned to form various openings therein. The various openings in the photoresist layer may comprise discrete openings overlying the stepped surfaces of the electrically conductive layers 46 and optionally the peripheral devices 700. According to an aspect of the present disclosure, at least one moat-shaped opening can be formed in the photoresist layer along the entire periphery of the top surface of a respective horizontal top portion of the conductive hard mask layer 97. A moat-shaped opening refers to an opening that separates an area enclosed by the opening and an area located outside the opening without any connection region between the two areas. In one embodiment, the at least one moat-shaped opening may comprise a plurality of (e.g., two) moat-shaped openings that are nested among one another. A first anisotropic etch process may be performed to transfer the pattern of the openings in the photoresist layer through the conductive hard mask layer 97.

Openings can be formed through the conductive hard mask layer 97 underneath the openings in the photoresist layer. A subset of the contact openings 97C in the conductive hard mask layer 97 is formed over the stepped surfaces of the electrically conductive layers 46 and the peripheral devices 700. At least one (e.g., two) moat-shaped openings can be formed through the conductive hard mask layer 97 along a periphery of the dielectric material portion 65 in each semiconductor die 900. The at least one moat-shaped opening is subsequently employed to define the area(s) of at least one edge seal structure, and thus, is herein referred to as at least one edge seal opening 97E. In one embodiment, there may be two edge seal openings 97E, and each edge seal opening 97E encloses an area above an inner region of the dielectric material portion 65 and overlies a respective conductive bridge structure comprising a conductive plate 188. As such, at least one conductive bridge structure comprising the at least one conductive plate 188 connects the inner portion of the conductive hard mask layer 97 located inside an innermost periphery of the at least one edge seal opening 97E to an outer portion of the conductive hard mask layer 97 located outside an outermost periphery of the at least one edge seal opening 97E. The set of contact openings 97C through the conductive hard mask layer 97 can be formed within an area surrounded by the at least one moat-shaped opening 97E in the conductive hard mask layer 97. Optionally, the photoresist layer may be removed, for example, by ashing.

The pattern of the openings (97C, 97E) in the conductive hard mask layer 97 can be transferred through underlying material portions by performing at least one second anisotropic etch process. In one embodiment, the pattern of all of the openings (97C, 97E) in the conductive hard mask layer 97 can be transferred through underlying material portions by a single second anisotropic etch process. Alternatively, at least one patterned photoresist layer may be employed to cover a respective subset of the openings in the conductive hard mask layer 97, and a plurality of second anisotropic etch processes may be performed to form a respective set of via cavities underneath a respective subset of the openings in the conductive hard mask layer 97 that is not masked by a respective patterned photoresist layer.

In an illustrative example, the various via cavities that are formed by the at least one second anisotropic etch process may comprise layer contact via cavities 85 and optional peripheral contact via cavities 7P formed through the contact openings 97C, and at least one moat trench 91 formed through the at least one edge seal opening(s) 97E. The drain-contact via cavities 87 are formed through the contact-level dielectric layer 80 and the capping dielectric layer 73 over a physically exposed top surface of a respective drain region 63. The layer contact via structures 85 are formed through the contact-level dielectric layer 80, the insulating cap layer 70, and the dielectric material portion 65 over a top surface of a respective electrically conductive layer 46. The peripheral contact via cavities 7P are formed through the contact-level dielectric layer 80, the insulating cap layer 70, and the dielectric material portion 65 over a physically exposed top surface of a respective node of the peripheral devices 700. The at least one moat trench 91 is formed through the contact-level dielectric layer 80, the insulating cap layer 70, and the dielectric material portion 65 over a physically exposed top surface of the semiconductor substrate (9, 10).

A set of contact via cavities (85, 7P) can be formed through the contact-level dielectric layer 80 down to top surfaces of electrically conductive nodes of the semiconductor devices in the semiconductor die 900 by performing the at least one second anisotropic etch process. The at least one second anisotropic etch process may etch materials of the contact-level dielectric layer 80, the insulating cap layer 70, and the dielectric material portion 65 selective to the semiconductor devices. According to an aspect of the present disclosure, at least one moat trench 91 can be formed through the dielectric material portion 65 within each semiconductor die 900 down to a top surface of the semiconductor substrate (9, 10) by performing an anisotropic etch process that etches a material of the dielectric material portion 65 underneath the moat-shaped opening(s) (i.e., edge seal opening(s)) 97E in the conductive hard mask layer 97. The width of each moat trench 91 may be in a range from 0.5 micron to 30 microns, such as from 1 micron to 15 microns, although lesser and greater lateral offset distances may also be employed. In on embodiment, the entirety of a region of the dielectric material portion 65 between the innermost one of the at least one moat trench 91 and the sidewalls of the semiconductor die 900 may be free of any semiconductor device.

According to an aspect of the present disclosure shown in FIG. 17A, each point within the conductive hard mask layer 97 is electrically connected to a surface a segment of the top surface of the semiconductor substrate (9, 10) through a respective electrically conductive discharge path located underneath the conductive hard mask layer 97 and which forms a conductive bridge structure. For example, each point within a portion of the conductive hard mask layer 97 located within an area enclosed by the at least one moat-shaped opening 97E in the conductive hard mask layer 97 is electrically connected to the semiconductor substrate (9, 10) through at least one conductive bridge structure comprising least one conductive plate 188 overlying an unetched pillar-shaped portion of the dielectric material portion 65. Thus, any electrical charge (e.g., electrons) that accumulates in the conductive hard mask layer 97 during the anisotropic etch process can be drained through a respective electric discharge path to the semiconductor substrate (9, 10). Therefore, arcing can be reduced or avoided during the one or more anisotropic etch processes that form the contact via cavities (85, 7P) and the at least one moat trench 91 in each memory die 900. Electrical grounding of the conductive hard mask layer 97 is provided throughout the entirety of the conductive hard mask layer 97 according to an aspect of the present disclosure, and as such, arcing can be entirely prevented during the at least one second anisotropic etch process.

A top portion of each conductive plate 188 may be collaterally recessed between neighboring portions of a respective moat trench 91. Each moat trench 91 may comprise at least one deep trench section 91D vertically extending from a top surface of the contact-level dielectric layer 80 to a top surface of the semiconductor substrate (9, 10) and at least one shallow trench section 91S overlying a recessed top surface of a respective conductive plate 188. Thus, each moat trench 91 may continuously extend around and encircle an area of a semiconductor die 900 without a gap. As such, each moat trench 91 may be a continuous moat trench comprising at least one deep trench section 91D that vertically extends down to a top surface of the semiconductor substrate (9, 10) and at least one shallow trench section 91S that overlies a horizontal surface of the conductive bridge structure (comprising a conductive plate 188) that is recessed below a horizontal plane including a top surface of the contact-level dielectric layer 80.

Generally, each of the at least one conductive bridge structure (such as the at least one conductive plate 188) is electrically isolated from the semiconductor substrate (9, 10) prior to formation of the conductive hard mask layer 97, and is electrically connected to the semiconductor substrate (9, 10) through the conductive hard mask layer 97 upon formation of the conductive hard mask layer 97 throughout each of the at least one second anisotropic etch process. Electrical charges (e.g., electrons) are discharged from each portion in the conductive hard mask layer 97 into the semiconductor substrate (9, 10) during each of the at least one second anisotropic etch process. In one embodiment, the conductive hard mask layer 97 is formed over sidewalls of the dielectric material portion 65 and on a top surface of the semiconductor substrate (9, 10). In one embodiment, the at least one second anisotropic etch process etches a material of the dielectric material portion 65 selective to materials of the conductive bridge structure (comprising a conductive plate 188), the conductive hard mask layer 97, and the semiconductor substrate (9, 10). Portions of the conductive plates 188 that are not masked by the conductive hard mask layer 97 may be collaterally recessed during the at least one second anisotropic etch process. The recess depth of the vertically recesses top surfaces of the conductive plates 188 may be in a range from 1% to 50%, such as from 5% to 25%, of the thickness of the conductive plates 188. The conductive hard mask layer 97 may be collaterally partially removed during the at least one second anisotropic etch process.

Each conductive bridge structure (comprising a conductive plate 188) connects the inner portion of the conductive hard mask layer 97 located inside an inner periphery of the at least one edge seal opening 97E to an outer portion of the conductive hard mask layer 97 located outside an outer periphery of the at least one edge seal opening 97E during and after the anisotropic etch process. The conductive hard mask layer 97 may be subsequently removed, for example, by a selective isotropic recess etch process, such as a wet etch process.

Figure 18A:
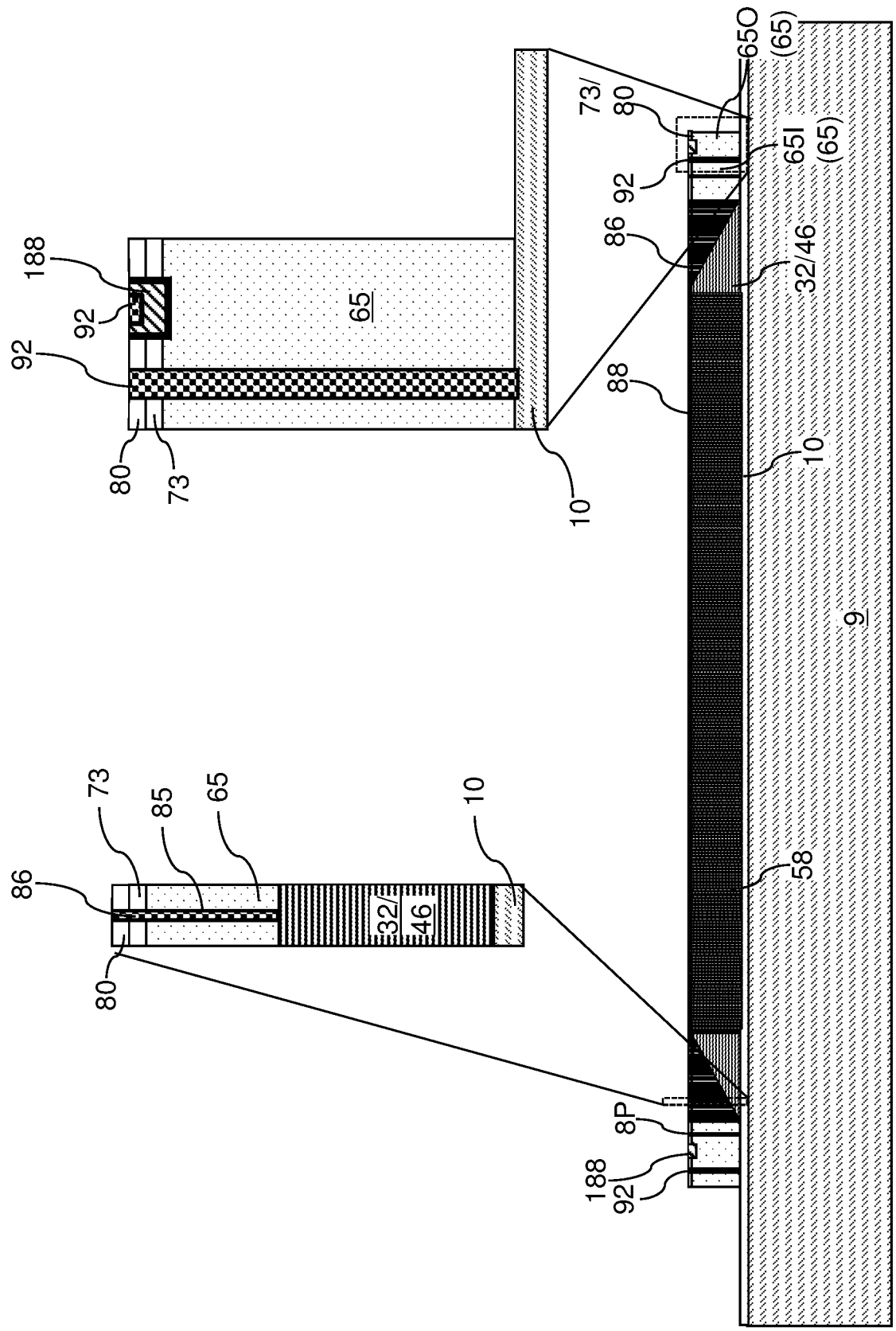
FIG. 18A is a vertical cross-sectional view of the unit area of the wafer including the second exemplary structure after formation of a conductive edge seal structure according to an embodiment of the present disclosure.
Figure 18B:
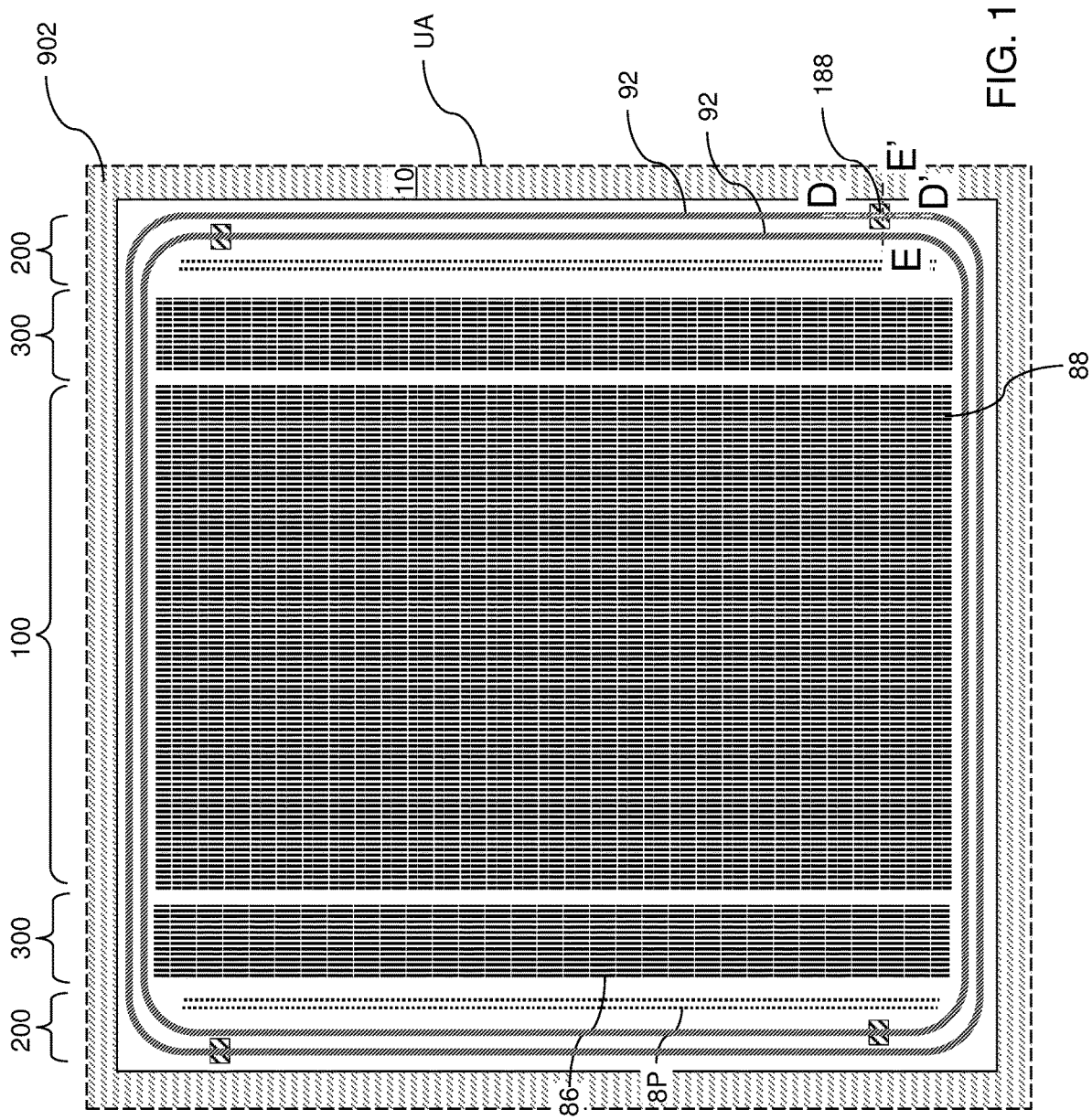
FIG. 18B is a top-down view of the unit area of the wafer of FIG. 18A.
Figure 18C:
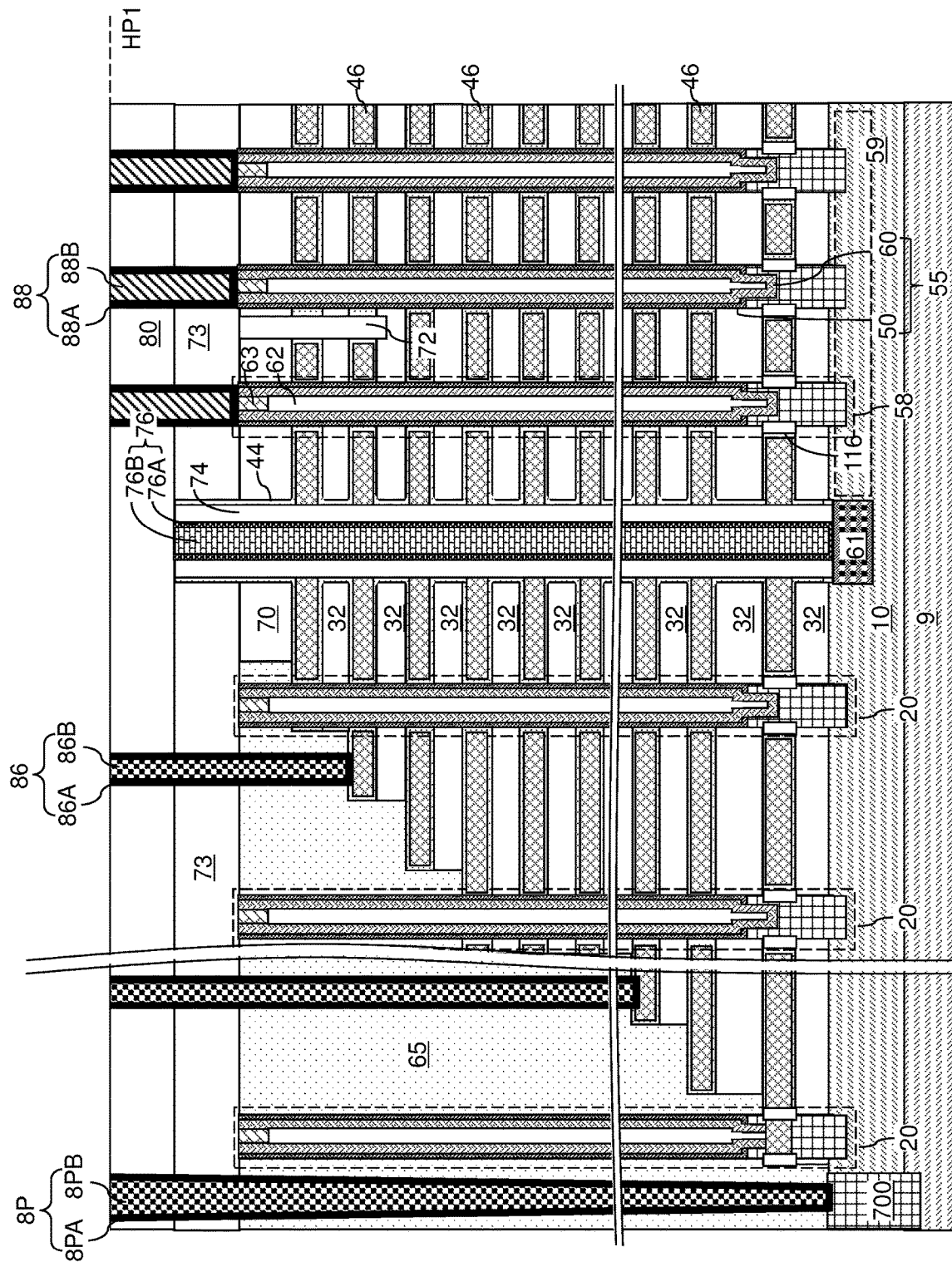
FIG. 18C is a vertical cross-sectional view of a region of the second exemplary structure within the die illustrated in FIGS. 18A and 18B.
Figure 18D:
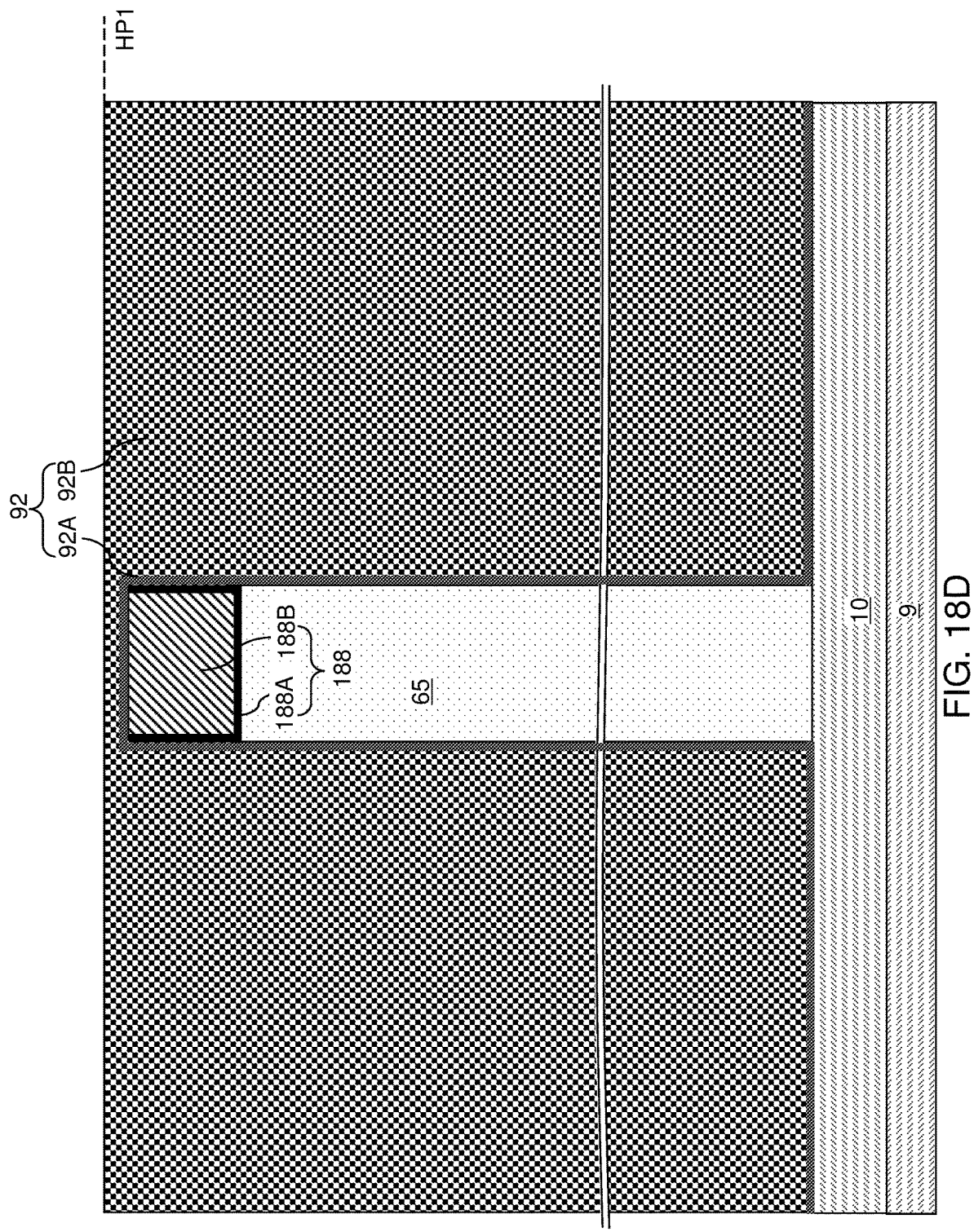
FIG. 18D is a vertical cross-sectional view of the second exemplary structure along the vertical plane D-D' of FIG. 18B.
Figure 18E:
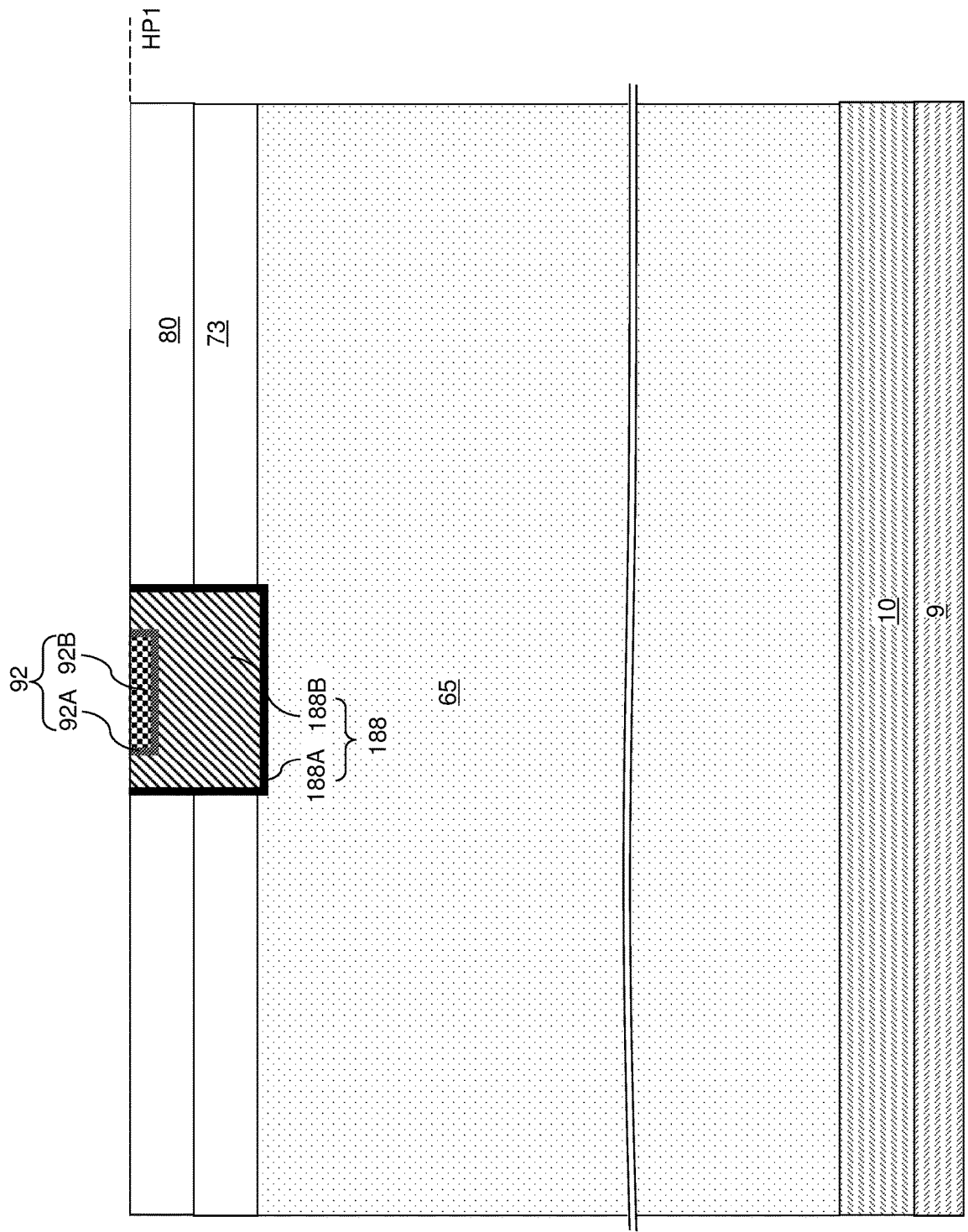
FIG. 18E is a vertical cross-sectional view of the second exemplary structure along the vertical plane E-E' of FIG. 18B.

Referring to FIGS. 18A-18E, various contact via structures (86, 8P) and at least one conductive edge seal structure 92 can be formed in the various contact via cavities (85, 7P) and the at least one moat trench 91. FIG. 18A is a vertical cross-sectional view of the unit area UA of the wafer 1000 including the second exemplary structure after formation of a conductive edge seal structure 92 according to an embodiment of the present disclosure. FIG. 18B is a top-down view of the unit area UA of the wafer 1000 of FIG. 18A. FIG. 18C is a vertical cross-sectional view of a region of the second exemplary structure within the die illustrated in FIGS. 18A and 18B. FIG. 18D is a vertical cross-sectional view of the second exemplary structure along the vertical plane D-D' of FIG. 18B. FIG. 18E is a vertical cross-sectional view of the second exemplary structure along the vertical plane E-E' of FIG. 18B.

Specifically, at least one conductive material is deposited in the various contact via cavities (85, 7P) and the at least one moat trench 91. In one embodiment, the at least one conductive material may comprise a conductive nitride liner material and a conductive fill material which may be a metal or an intermetallic alloy. For example, the conductive nitride liner material may comprise TiN, TaN, WN, and/or MoN. The conductive fill material may comprise W, Ti, Ta, Mo, Ru, Co, Cu, or alloys thereof. The at least one conductive material may be deposited, for example, by chemical vapor deposition, physical vapor deposition, electroplating, and/or electroless plating. Excess portions of the at least one conductive material may be removed from above the horizontal plane including the top surface of the contact-level dielectric layer 80 by a planarization process, which may employ a recess etch process and/or a chemical mechanical polishing process.

Each remaining portion of the at least one conductive material filling a layer contact via cavity 85 constitutes a layer contact via structure 86. Each remaining portion of the at least one conductive material filling a peripheral contact via cavity 7P constitutes an optional peripheral contact via structure 8P. Each remaining portion of the at least one conductive material filling a moat trench 91 constitutes a conductive edge seal structure 92.

In one embodiment, each of the contact via structures (86, 8P) comprises a conductive contact liner (86A, 8PA) and a conductive fill material portion (86B, 8PB) embedded within the conductive contact liner (86A, 8PA). Each conductive edge seal structure 92 comprises a conductive edge seal liner 92A and a conductive edge seal fill material portion 92B embedded within the conductive edge seal liner 92A. In one embodiment, the conductive contact liners (86A, 8PA) and the conductive edge seal liner 92A have a first conductive composition (i.e., the material composition of the conductive nitride liner material) and have a same thickness, and the conductive edge seal fill material portions 92B and the conductive fill material portion (86B, 8PB) have a second conductive composition (i.e., the material composition of the conductive fill material).

In one embodiment, an inner dielectric material portion 65I laterally surrounds the semiconductor devices of each semiconductor die 900. Each conductive edge seal structure 92 laterally surrounds the inner dielectric material portion 65I, vertically extends from the semiconductor substrate (9, 10) at least to a horizontal plane including a topmost surface of the inner dielectric material portion 65I, and may have straight sidewalls that laterally extend parallel to a most proximal one of outer sidewalls of the semiconductor die 900. In one embodiment, an outer dielectric material portion 65O laterally surrounds each conductive edge seal structure 92.

In one embodiment, outer sidewalls of the outer dielectric material portion 65O are the outer sidewalls of the semiconductor die 900. In one embodiment, the outer dielectric material portion 65O is not in direct contact with any of the semiconductor devices in the semiconductor die 900.

In one embodiment, the semiconductor die 900 comprises metal interconnect structures, the outer dielectric material portion 65O is not in direct contact with any of the metal interconnect structures, and all of the metal interconnect structures are laterally surrounded by the at least one conductive edge seal structure 92. In one embodiment, the semiconductor die 900 comprises a contact-level dielectric layer 80 overlying the semiconductor devices, the inner dielectric material portion 65I, and the outer dielectric material portion 65O, wherein at least one the conductive edge seal structure 92 vertically extends through the contact-level dielectric layer 80 and the dielectric material portions (65I, 65O).

In one embodiment, the semiconductor die 900 comprises contact via structures (86, 8P) vertically extending through the contact-level dielectric layer 80 and contacting top surfaces of electrically conductive nodes of the semiconductor devices and having top surfaces that are located within a same horizontal plane as a top surface of the conductive edge seal structure 92. In one embodiment, the semiconductor devices comprise an alternating stack of insulating layers 32 and electrically conductive layers 46, and memory opening fill structures 58 located within memory openings 49 that vertically extend through the alternating stack and comprising a vertical semiconductor channel 60 and a respective vertical stack of memory elements. In one embodiment, each of the memory opening fill structures 58 comprises a NAND string, the electrically conductive layers 46 comprise word lines of the NAND strings, and the electrically conductive nodes of the semiconductor devices comprise the word lines. In some embodiments, the conductive hard mask layer 97 may be removed after the processing steps of FIGS. 18A-18E prior to, during or after formation of the at least one conductive edge seal structure 92.

Referring to FIGS. 1-11C and 15A-18E and according to various embodiments of the present disclosure, a semiconductor die 900 comprises semiconductor devices located over a semiconductor substrate (9, 10); an inner dielectric material portion 65I laterally surrounding the semiconductor devices; a contact-level dielectric layer 80 overlying the semiconductor devices and the inner dielectric material portion 65I; a conductive bridge structure (comprising a conductive plate 188) having at least one top surface located within a horizontal plane including a top surface of the contact-level dielectric layer 80; a conductive edge seal structure 92 that laterally surrounds the inner dielectric material portion 65I, vertically extends from the semiconductor substrate (9, 10) to the horizontal plane including the top surface of the contact-level dielectric layer 80, and extending over, and contacting at least one surface of the conductive bridge structure (comprising a conductive plate 188); and an outer dielectric material portion 65O laterally surrounding the conductive edge seal structure 92.

In one embodiment, the conductive edge seal structure 92 comprises: at least one wall portion (which fills a respective deep trench segment of a moat trench 91) vertically extending from the semiconductor substrate (9, 10) to the horizontal plane including the top surface of the contact-level dielectric layer 80; and a connection portion (which fills a respective shallow trench segment of the moat trench 91) overlying the conductive bridge structure (comprising a conductive plate 188). In one embodiment, a bottommost surface of the conductive bridge structure (comprising a conductive plate 188) is located above and is vertically spaced from the semiconductor substrate (9, 10).

In one embodiment, the semiconductor die 900 comprises contact via structures (88, 86, 8P) vertically extending through the contact-level dielectric layer 80 and contacting electrically conductive nodes of the semiconductor devices and having top surfaces that are located within a same horizontal plane as a top surface of the conductive edge seal structure 92. In one embodiment, the conductive edge seal structure 92 comprises a conductive edge seal liner 92A and a conductive edge seal fill material portion 92B embedded within the conductive edge seal liner 92A; each of the contact via structures (88, 86, 8P) comprises a conductive contact liner (88A, 86A, 8PA) and a conductive fill material portion (88B, 86B, 8PB) embedded within the conductive contact liner (88A, 86A, 8PA); the conductive contact liner (88A, 86A, 8PA) and the conductive edge seal liner 92A have a first conductive composition and have a same thickness; and the conductive edge seal fill material portion 92B and the conductive fill material portion (88B, 86B, 8PB) have a second conductive composition.

In one embodiment, the semiconductor devices comprise: an alternating stack of insulating layers 32 and electrically conductive layers 46; and memory opening fill structures 58 located within memory openings 49 that vertically extend through the alternating stack and comprising a respective vertical semiconductor channel 60 and vertical stack of memory elements (e.g., portions of layer 54). In one embodiment, each of the memory opening fill structures 58 comprises a NAND string; the electrically conductive layers 46 comprise word lines of the NAND strings; and the electrically conductive nodes of the semiconductor devices comprise the word lines.

Figure 19A:
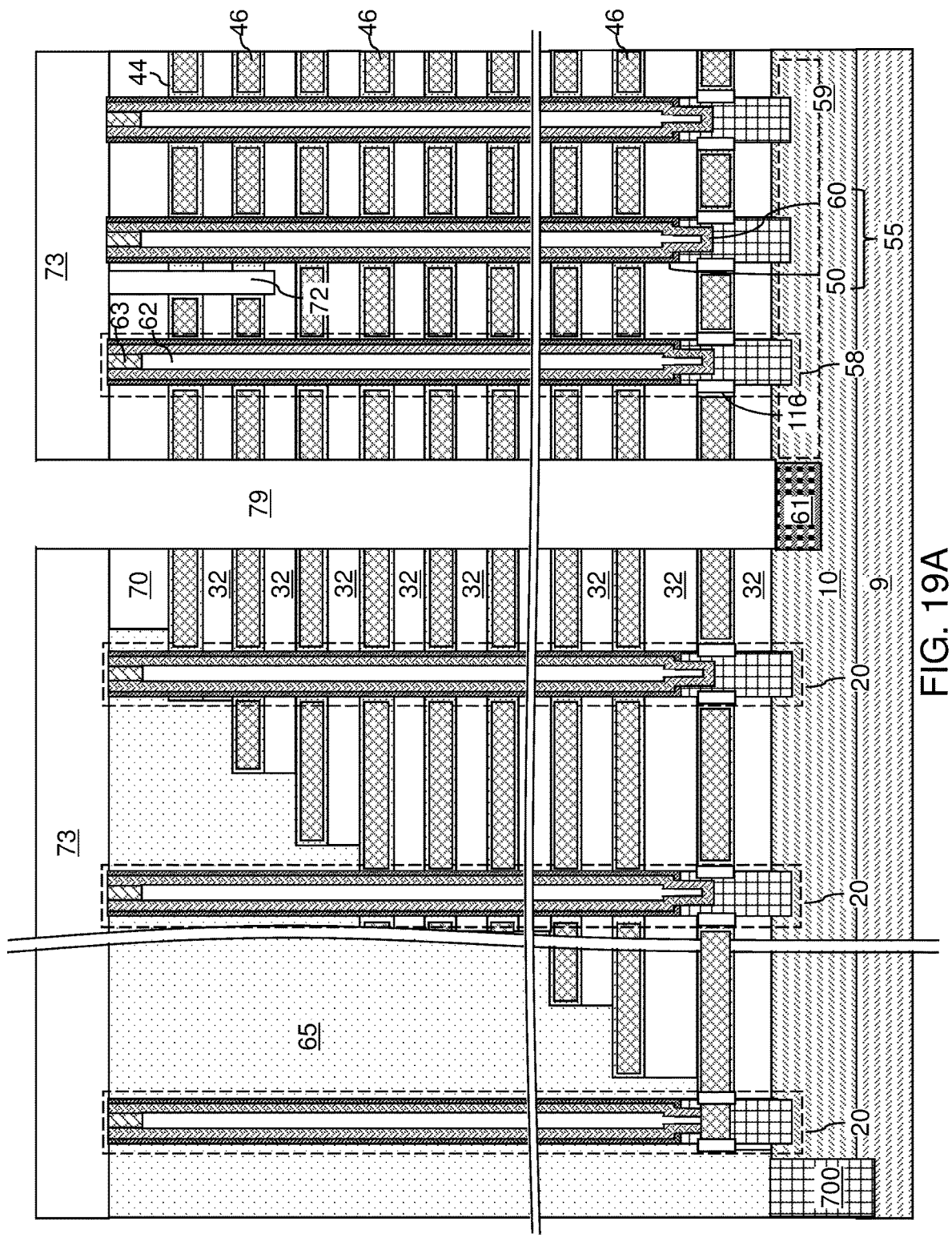
FIG. 19A is a vertical cross-sectional view of a third exemplary structure after formation of backside trenches, pillar cavities, and electrically conductive layers according to an embodiment of the present disclosure.
Figure 19B:
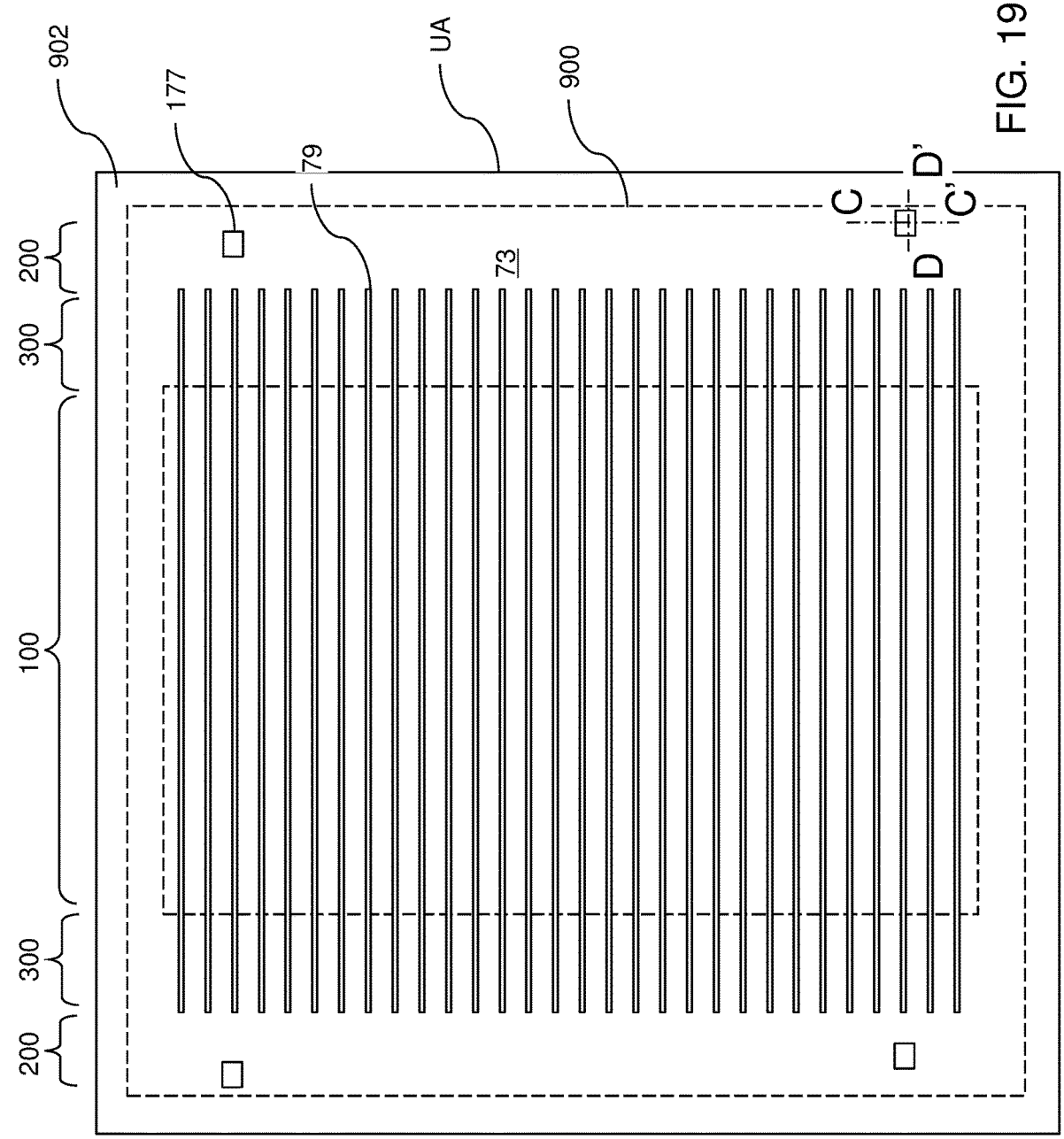
FIG. 19B is a top-down view of a unit area of a wafer including the third exemplary structure of FIG. 19A.
Figure 19C:
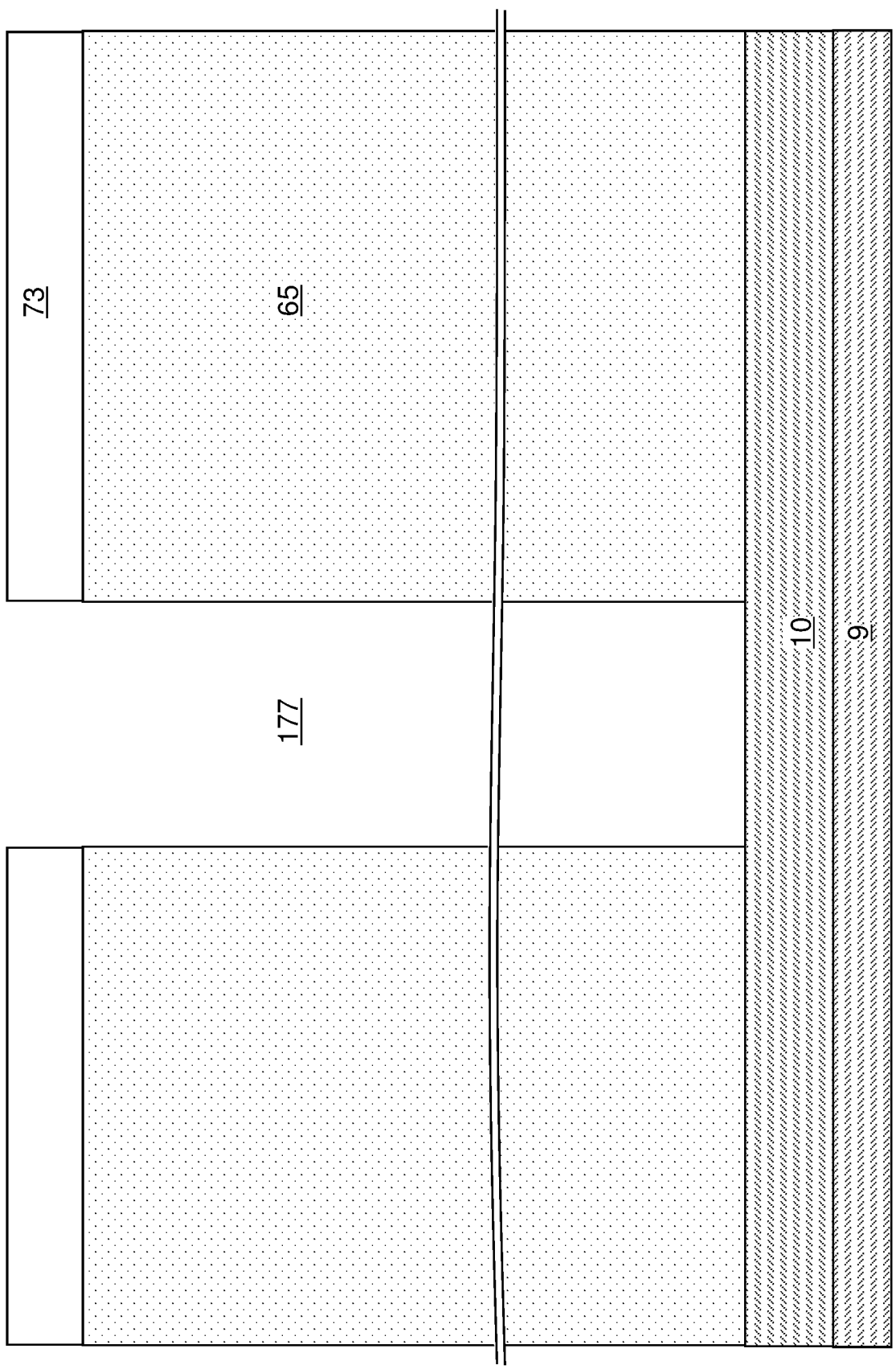
FIG. 19C is a vertical cross-sectional view of the third exemplary structure along the vertical plane C-C' of FIG. 19B.

Referring to FIGS. 19A-19D, a third exemplary structure according to an embodiment of the present disclosure is illustrated. FIG. 19A is a vertical cross-sectional view of a third exemplary structure after formation of backside trenches 79, pillar cavities 177, and electrically conductive layers 46 according to an embodiment of the present disclosure. FIG. 19B is a top-down view of a unit area UA of a wafer 1000 including the third exemplary structure of FIG. 19A. FIG. 19C is a vertical cross-sectional view of the third exemplary structure along the vertical plane C-C' of FIG. 19B. FIG. 19D is a vertical cross-sectional view of the third exemplary structure along the vertical plane D-D' of FIG. 19B.

The third exemplary structure can be derived from the first exemplary structure illustrated in FIGS. 7A-7C by modifying a pattern of a photoresist layer that is employed to define the pattern of the backside trenches 79. Specifically, the photoresist layer is patterned with additional openings in areas that are proximal to edges of a respective semiconductor die 900 within each unit area UA. The additional openings are formed as discrete openings within areas of peripheral portions of the dielectric material portion 65 in a respective semiconductor die 900.

Pillar cavities 177 are formed concurrently with formation of the backside trenches 79. Each pillar cavity 177 vertically extends from a top surface of the capping dielectric layer 73 to a top surface of the semiconductor substrate (9, 10) through the dielectric material portion 65. In one embodiment, each sidewall of a pillar cavity 177 may consist of dielectric surfaces. Subsequently, the source regions 61 may be formed underneath each backside trench 79. In one embodiment, dummy source regions (not shown) having a same material composition as the source regions 61 may be formed underneath each pillar cavity 177 within the semiconductor substrate (9, 10).

Subsequently, the processing steps described with reference to FIGS. 8 and 9A-9D, and 10A-10D may be performed to replace the sacrificial material layers 42 with electrically conductive layers 46.

Figure 20A:
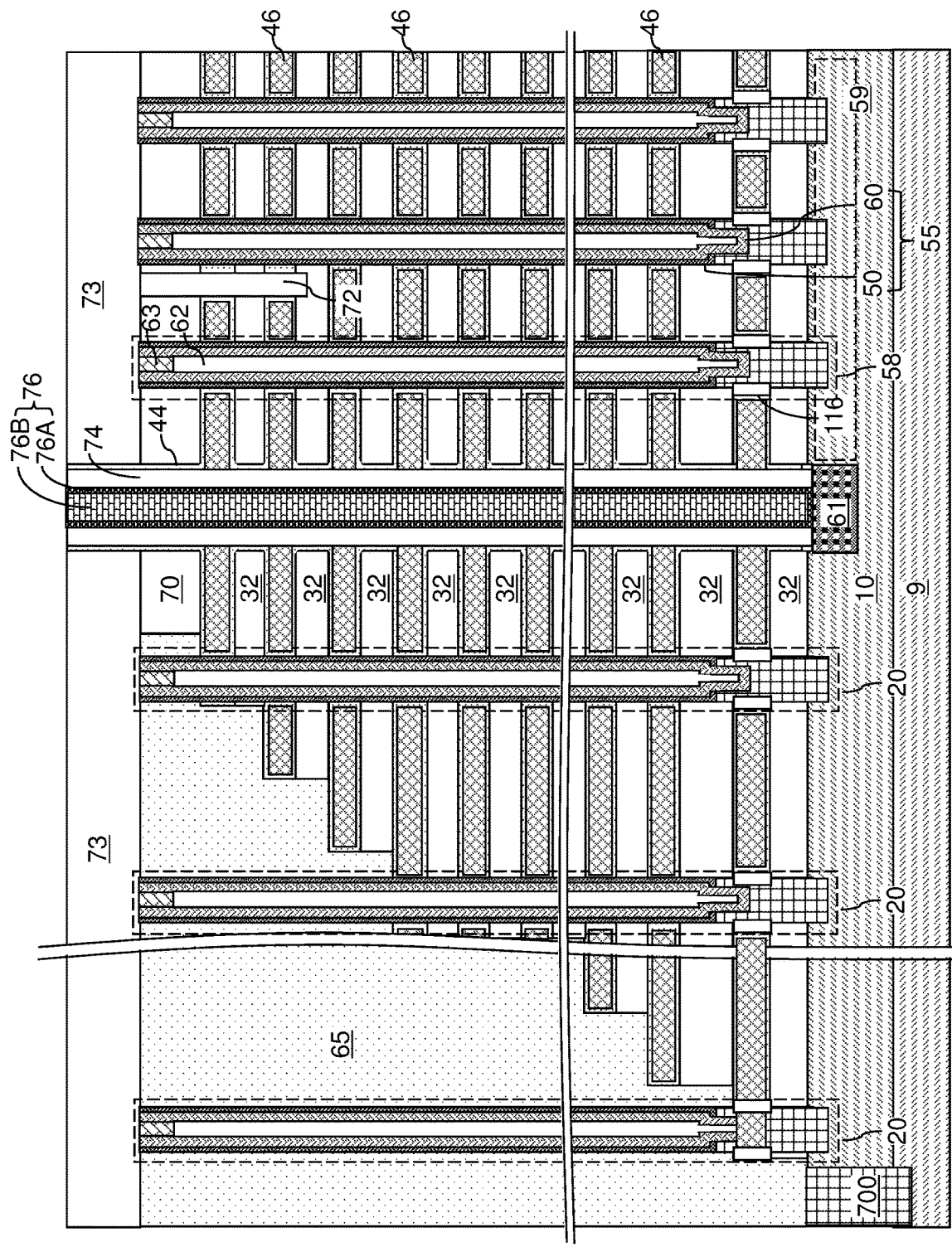
FIG. 20A is a vertical cross-sectional view of a third exemplary structure after formation of backside trench fill structures and metal pillar structures according to an embodiment of the present disclosure.
Figure 20B:
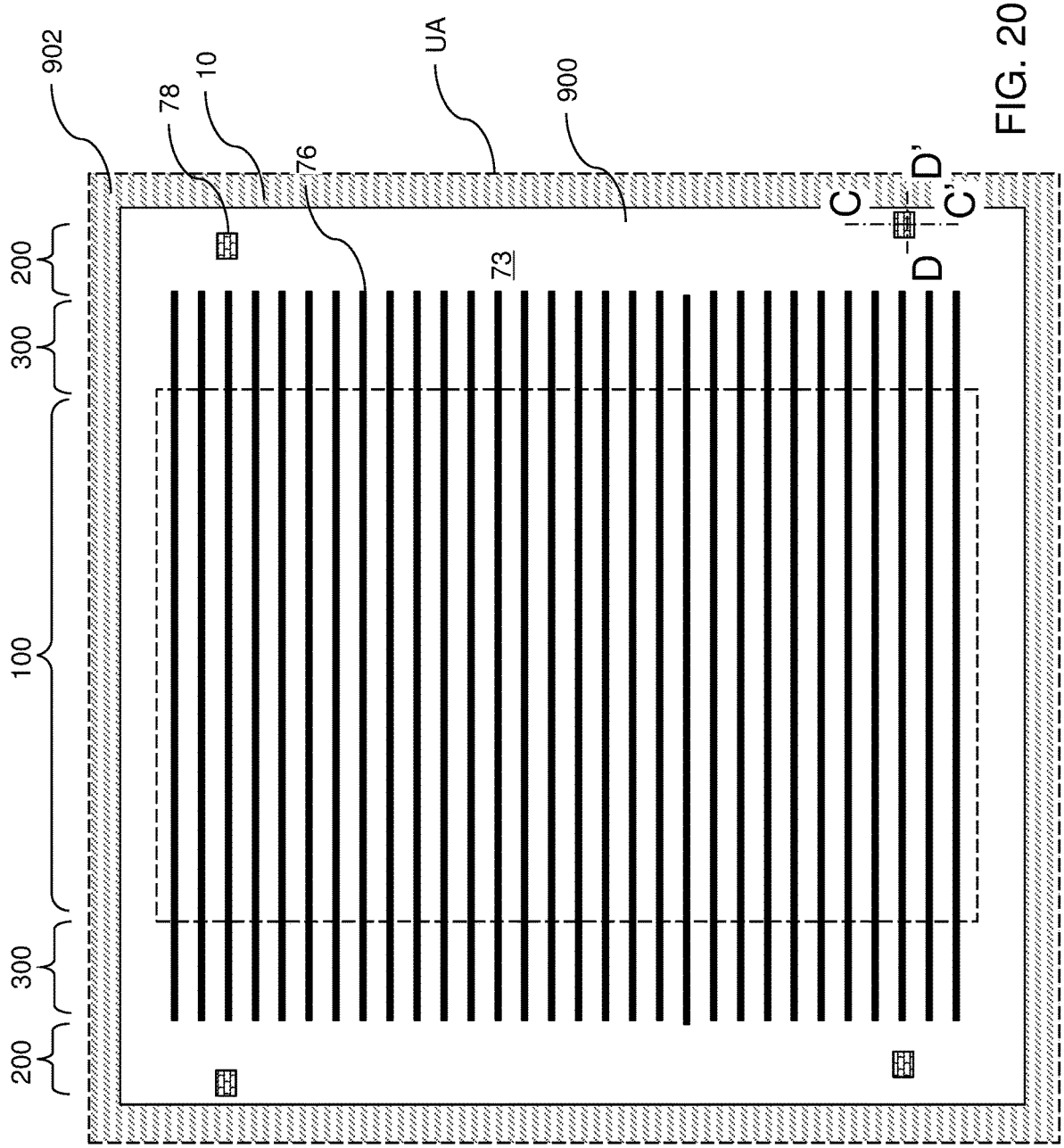
FIG. 20B is a top-down view of a unit area of a wafer including the third exemplary structure of FIG. 20A.
Figure 20C:
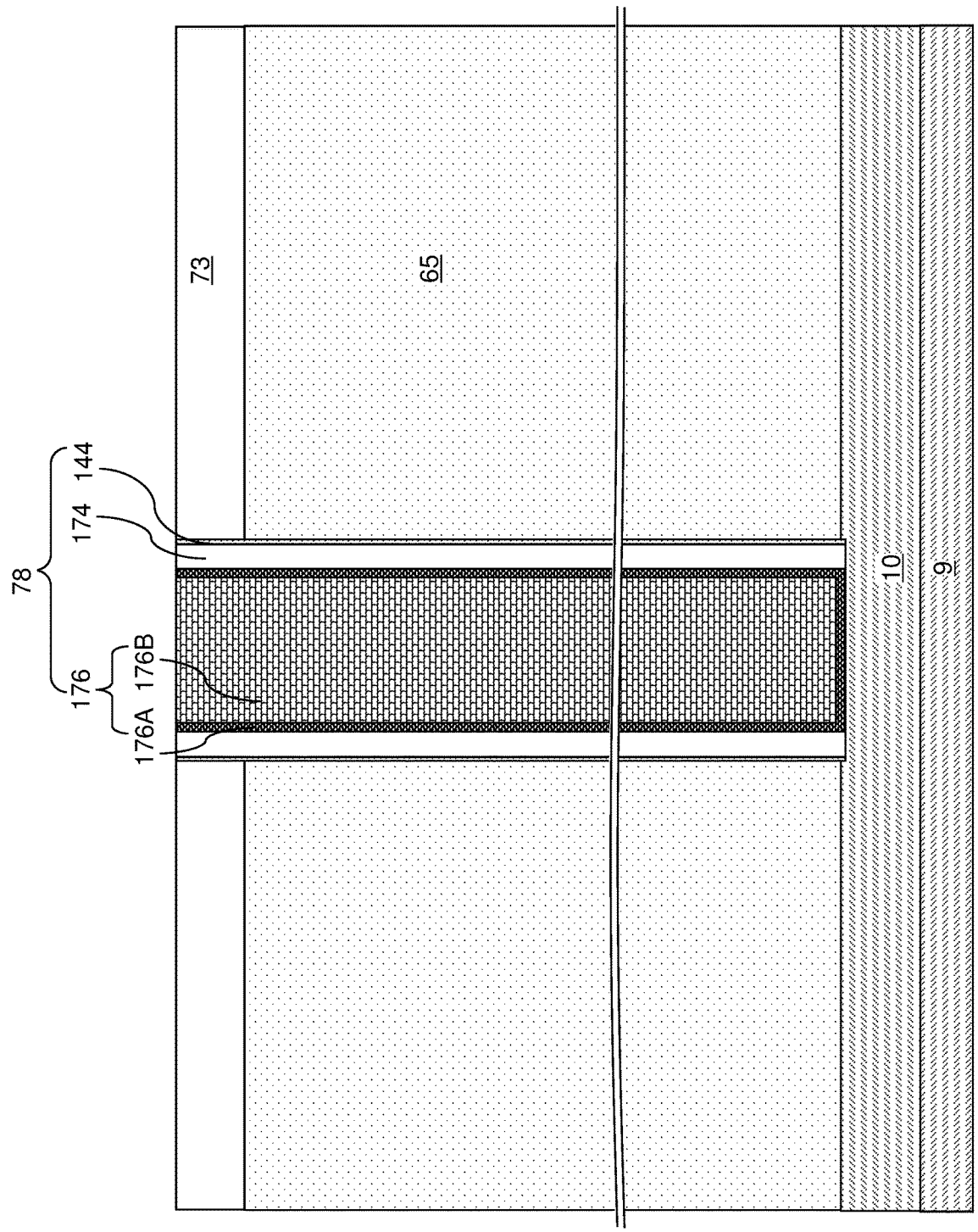
FIG. 20C is a vertical cross-sectional view of the third exemplary structure along the vertical plane C-C' of FIG. 20B.
Figure 20D:
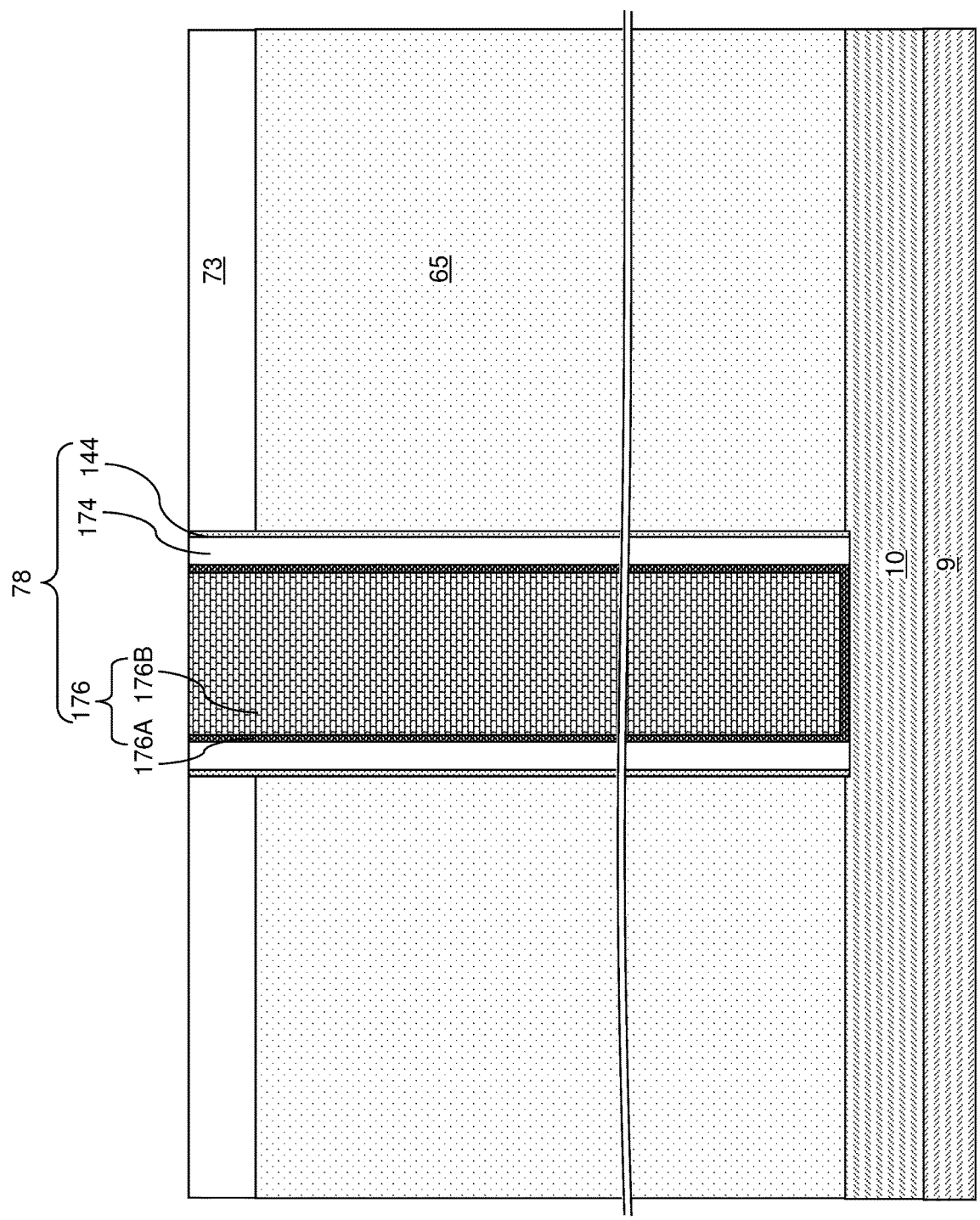
FIG. 20D is a vertical cross-sectional view of the third exemplary structure along the vertical plane D-D' of FIG. 20B.

Referring to FIGS. 20A-20D, the processing steps described with reference to FIGS. 10A-10D can be performed to form a backside trench fill structure (74, 76) within each backside trench 79. FIG. 20A is a vertical cross-sectional view of a third exemplary structure after formation of backside trench fill structures (74, 76) and conductive pillar structures 176 according to an embodiment of the present disclosure. FIG. 20B is a top-down view of a unit area UA of a wafer 1000 including the third exemplary structure of FIG. 20A. FIG. 20C is a vertical cross-sectional view of the third exemplary structure along the vertical plane C-C' of FIG. 20B. FIG. 20D is a vertical cross-sectional view of the third exemplary structure along the vertical plane D-D' of FIG. 20B.

Pillar cavity fill structures 78 can be collaterally formed in the pillar cavities 177 concurrently with formation of the backside trench fill structures (74, 76). In other words, the set of processing steps employed to form the backside trench fill structures (74, 76) forms the pillar cavity fill structures 78 as byproducts without use of any additional processing steps. Each pillar cavity fill structure 78 may comprise an optional dielectric liner 144 having a same material composition as the backside blocking dielectric layers 44, a pillar insulating spacer 174 having a same lateral thickness and a same material composition as the insulating spacers 74, and a conductive pillar structure 176. Each conductive pillar structure 176 may comprises a pillar conductive liner 176A having a same material composition and a same thickness as the conductive liners 76A of backside contact via structures 76, and a pillar conductive fill material portion 176B having a same material composition as the conductive fill material portions 76B of the backside contact via structures 76. Top surfaces of the conductive pillar structures 176 may be formed within a horizontal plane including the top surface of the capping dielectric layer 73.

Figure 21A:
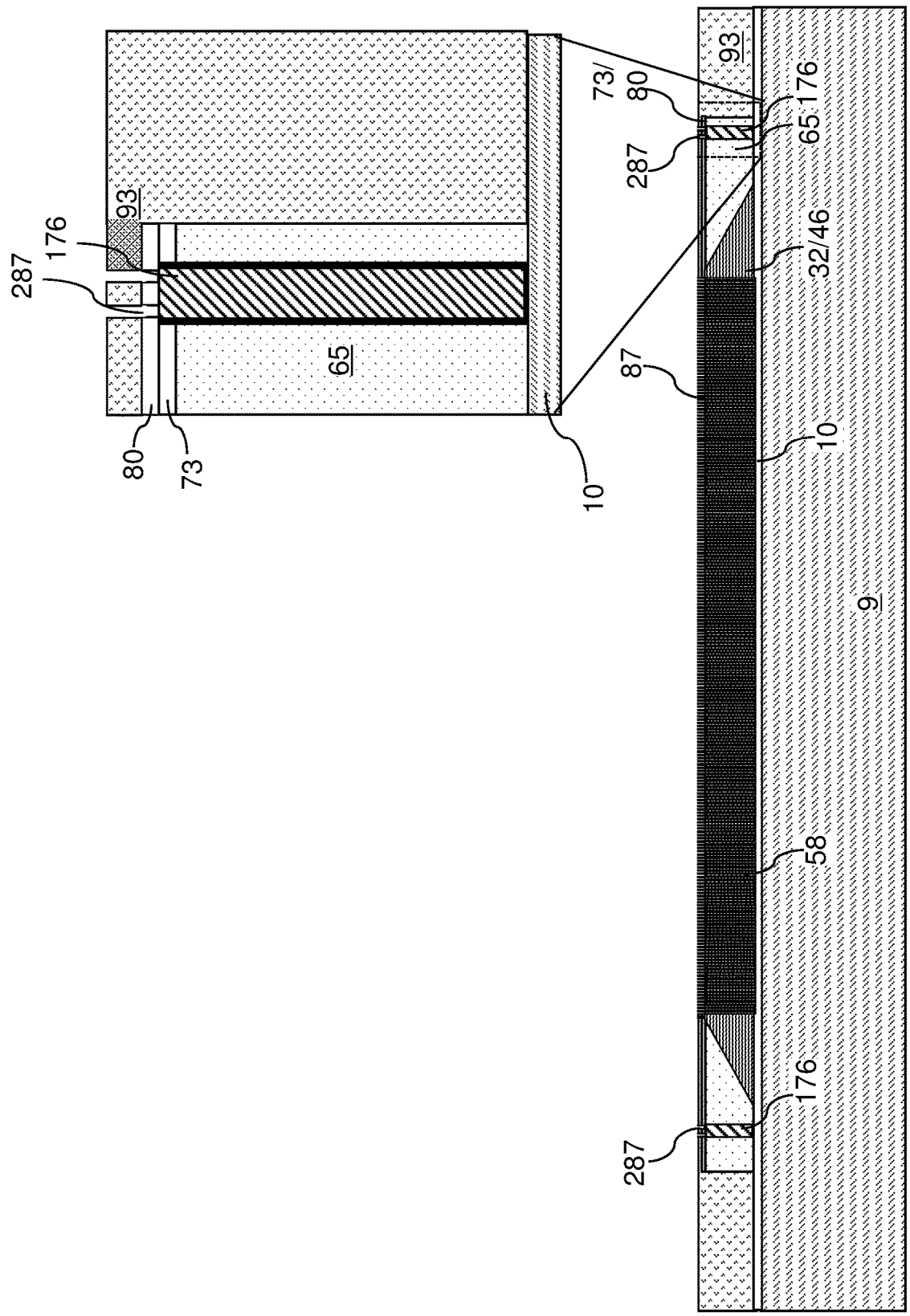
FIG. 21A is a vertical cross-sectional view of a unit area of a wafer including the third exemplary structure after formation of a contact-level dielectric layer, removal of material portions above the substrate from kerf areas, formation of a patterned conductive hard mask layer, and formation of drain-contact via cavities including contact-level via cavities according to an embodiment of the present disclosure. Various insets provide magnified views within a die.
Figure 21B:
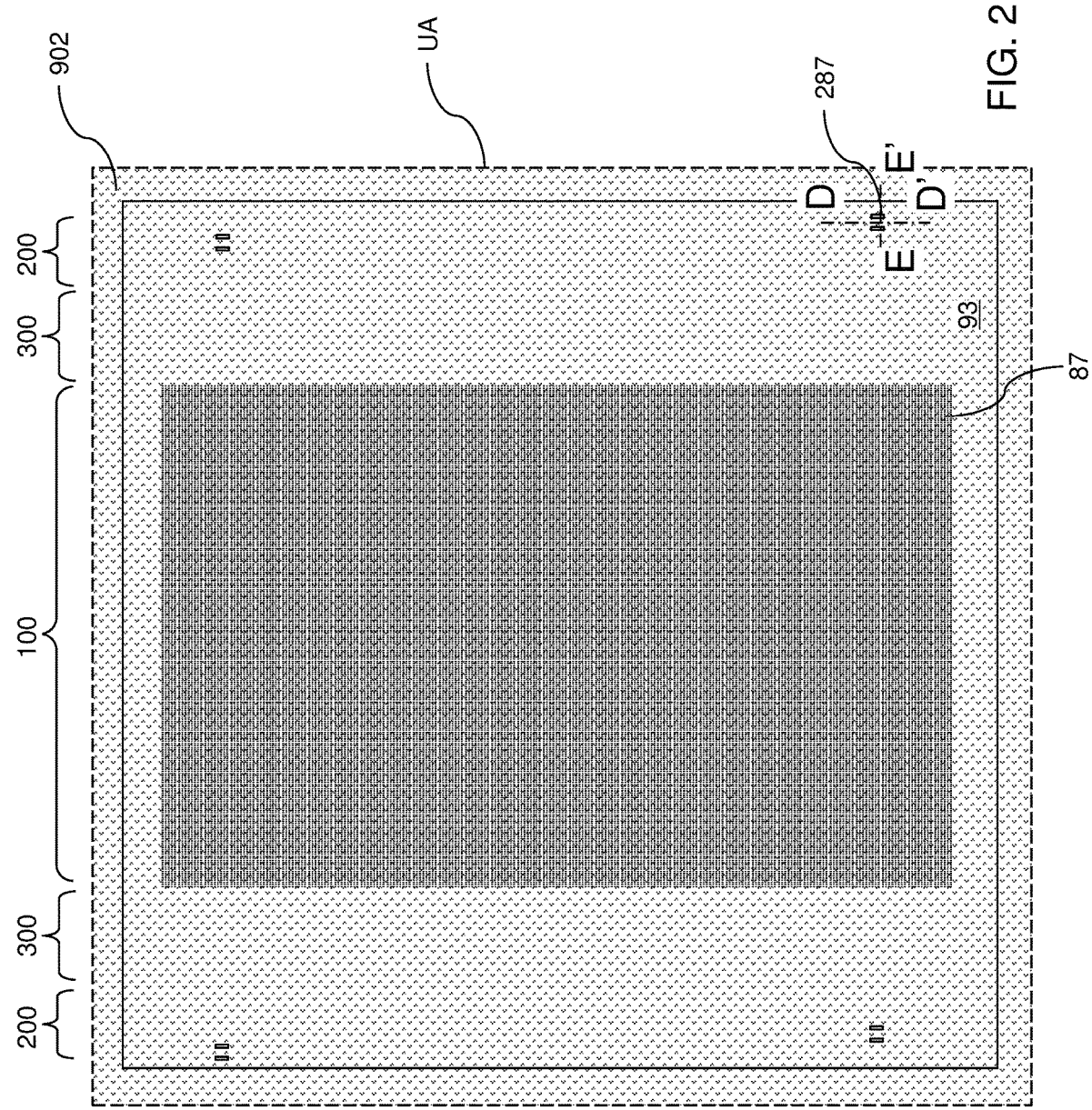
FIG. 21B is a top-down view of the unit area of the wafer of FIG. 21A.
Figure 21C:
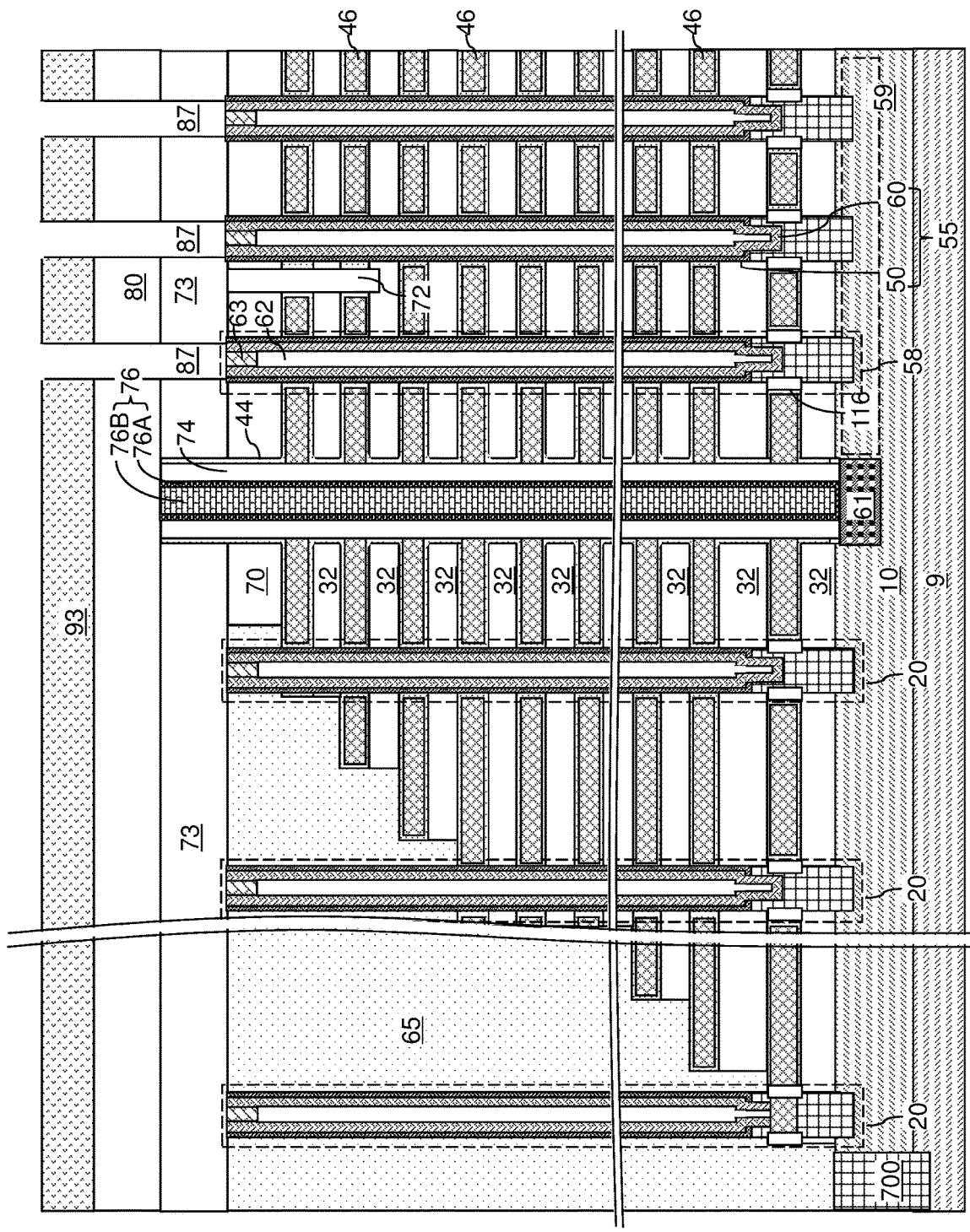
FIG. 21C is a vertical cross-sectional view of a region of the third exemplary structure within the die illustrated in FIGS. 21A and 21B.
Figure 21D:
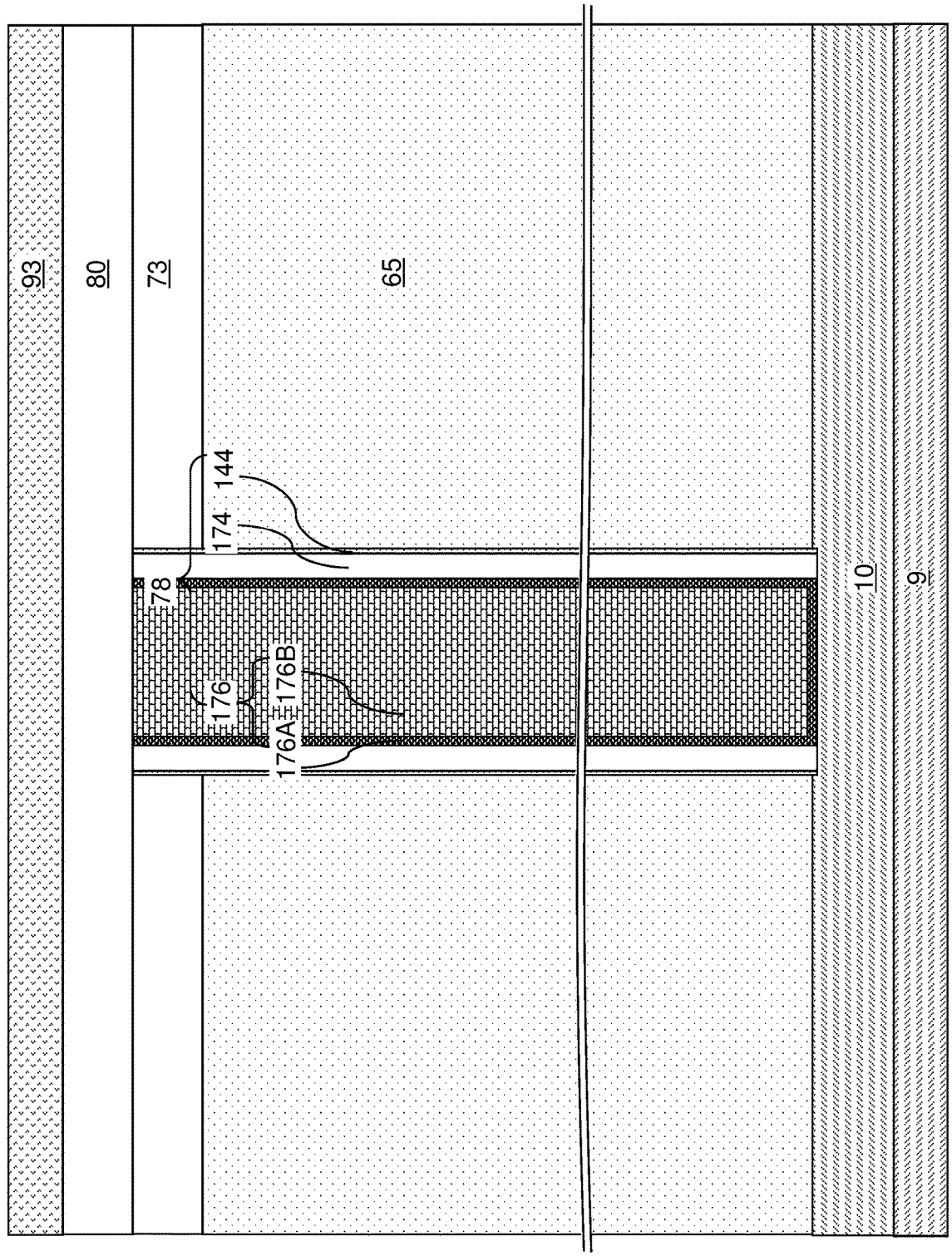
FIG. 21D is a vertical cross-sectional view of the third exemplary structure along the vertical plane D-D' of FIG. 21B.
Figure 21E:
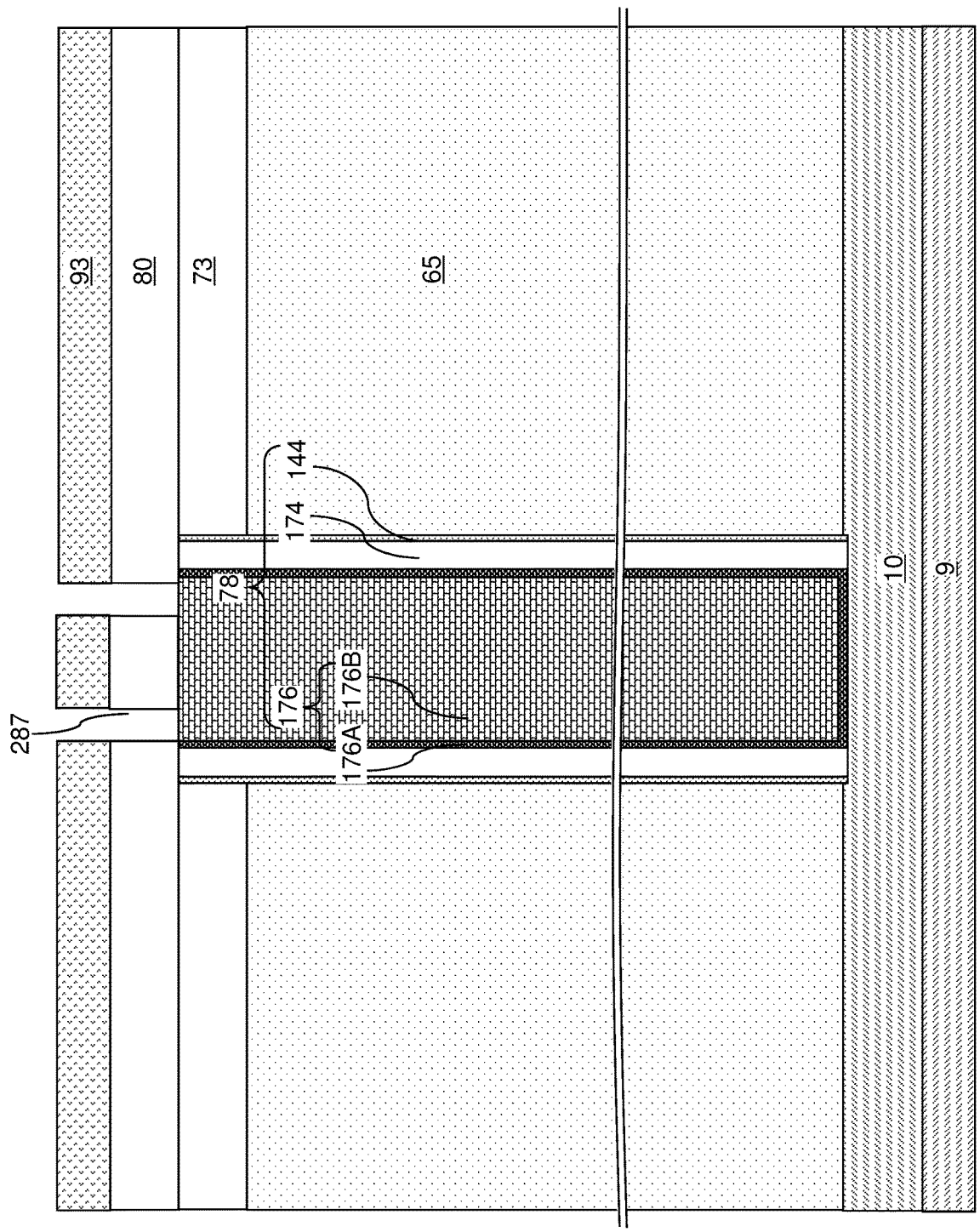
FIG. 21E is a vertical cross-sectional view of the third exemplary structure along the vertical plane E-E' of FIG. 21B.

Referring to FIGS. 21A-21E, additional processing steps described with reference to FIGS. 10A-10D may be performed, and processing steps described with reference to FIGS. 15A-14C may be performed with modifications in the pattern of the openings in the photoresist layer 93. FIG. 21A is a vertical cross-sectional view of a unit area UA of a wafer 1000 including the third exemplary structure after formation of a contact-level dielectric layer 80, removal of material portions above the substrate (9, 10) from kerf areas, formation of a patterned conductive hard mask layer 97, and formation of drain-contact via cavities 87 including contact-level via cavities 287 according to an embodiment of the present disclosure. Various insets provide magnified views within a semiconductor die 900. FIG. 21B is a top-down view of the unit area UA of the wafer 1000 of FIG. 21A. FIG. 21C is a vertical cross-sectional view of a region of the third exemplary structure within the die illustrated in FIGS. 21A and 21B. FIG. 21D is a vertical cross-sectional view of the third exemplary structure along the vertical plane D-D' of FIG. 21B. FIG. 21E is a vertical cross-sectional view of the third exemplary structure along the vertical plane E-E' of FIG. 21B.

Specifically, a contact-level dielectric layer 80 can be formed over the semiconductor devices on the semiconductor substrate (9, 10) and over the dielectric material portion 65. The contact-level dielectric layer 80 comprises a dielectric material such as silicon oxide, silicon nitride or silicon oxynitride, and may have a thickness in a range from 100 nm to 600 nm, although lesser and greater thicknesses may also be employed.

A photoresist layer (not shown) can be applied over the contact-level dielectric layer 80, and can be lithographically patterned to cover areas of the semiconductor dies 900 without covering the kerf regions 902. An etch process, such as an anisotropic etch process can be performed to remove material portions in the kerf regions 902 in the wafer 1000. The semiconductor dies 900 can be separated above the horizontal plane including the top surface of the semiconductor substrate (9, 10). The photoresist layer can be subsequently removed, for example, by ashing. Each semiconductor die 900 may comprise a respective dielectric material portion which is patterned remaining portion of the dielectric material portion 65 as formed at the processing steps of FIGS. 3A-3C.

Generally, at least one conductive structure (such as at least one conductive pillar structures 176) may be formed through underneath the contact-level dielectric layer 80 in a peripheral region of the semiconductor die 900. In one embodiment, the at least one conductive structure comprises at least one conductive pillar structure 176 contacting a top surface of the semiconductor substrate (9, 10). In one embodiment, the at least one conductive pillar structure 176 is formed prior to formation of the contact-level dielectric layer 80. The contact-level dielectric layer 80 is formed on the at least one conductive pillar structure 176.

Subsequently, a photoresist layer 93 can be formed over the two-dimensional array of semiconductor dies 900, and can be lithographically patterned to form various discrete openings therein. The pattern of the openings in the photoresist layer 93 can be transferred through the contact-level dielectric layer 80 and the capping dielectric layer 73, if present, underneath the openings in the photoresist layer 93. At least one pair of contact-level via cavities 287 can be formed through the contact-level dielectric layer 80 directly on a top surface of each conductive pillar structure 176. Each pair of contact-level via cavities 287 can be spaced from a most proximal sidewall of a semiconductor die 900 (which can be a sidewall of a dielectric material portion 65) by different lateral distances. Drain-contact via cavities 87 are formed through the contact-level dielectric layer 80 and the capping dielectric layer 73 above the top surfaces of the drain regions 63 during the same etching step as the contact-level via cavities 287. The drain-contact via cavities 87 extend through the contact-level dielectric layer 80 down to top surfaces of the drain regions 63. A top surface of a drain region 63 may be physically exposed at the bottom of each drain-contact via cavity 87. The photoresist layer 93 can be subsequently removed, for example, by ashing.

Figure 22A:
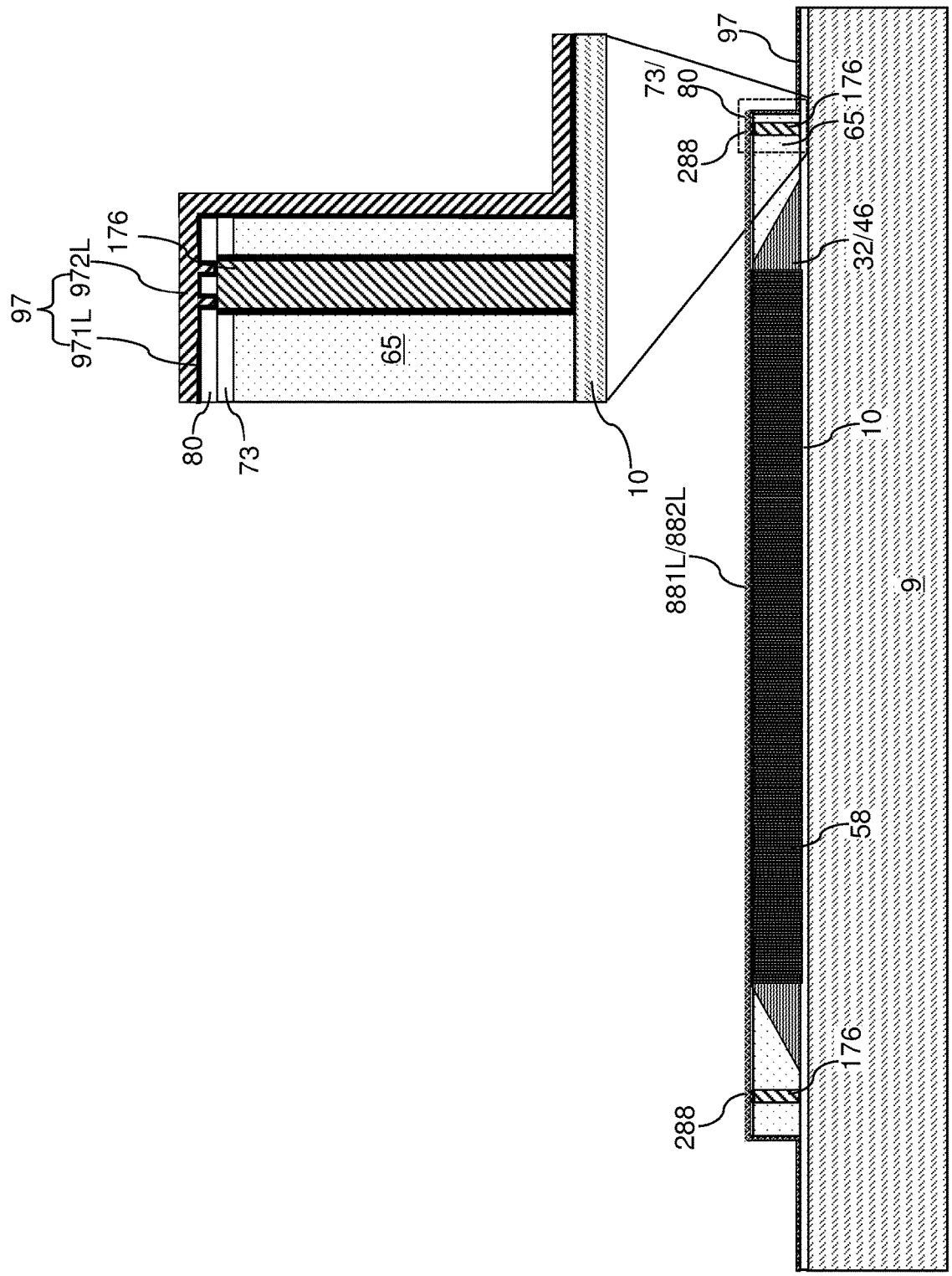
FIG. 22A is a vertical cross-sectional view of the unit area of the wafer including the third exemplary structure after formation of a conductive hard mask layer by deposition of at least one conductive material in the drain-contact via cavities and the contact-level via cavities according to an embodiment of the present disclosure. Various insets provide magnified views within a die.
Figure 22B:
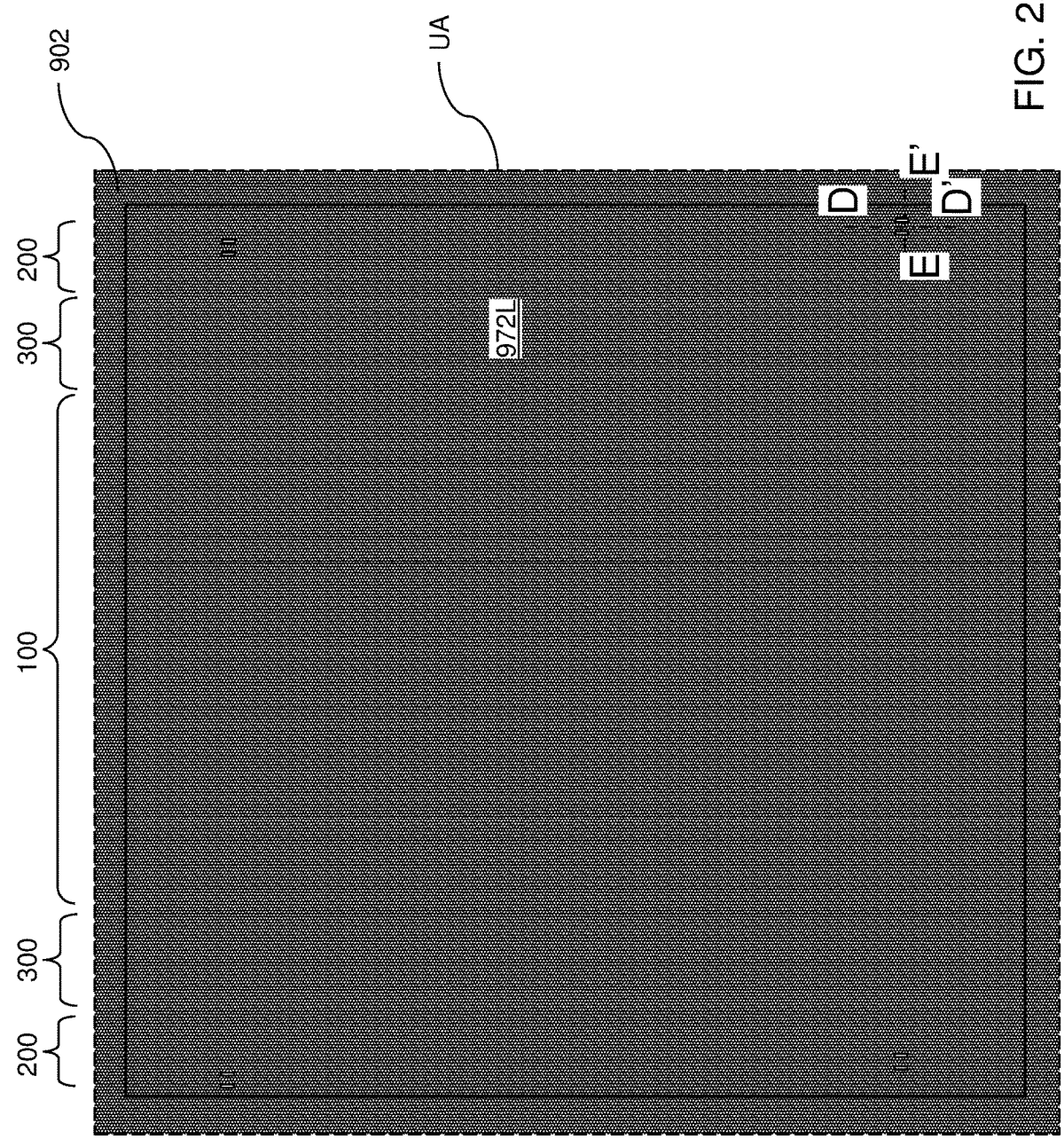
FIG. 22B is a top-down view of the unit area of the wafer of FIG. 22A.
Figure 22C:
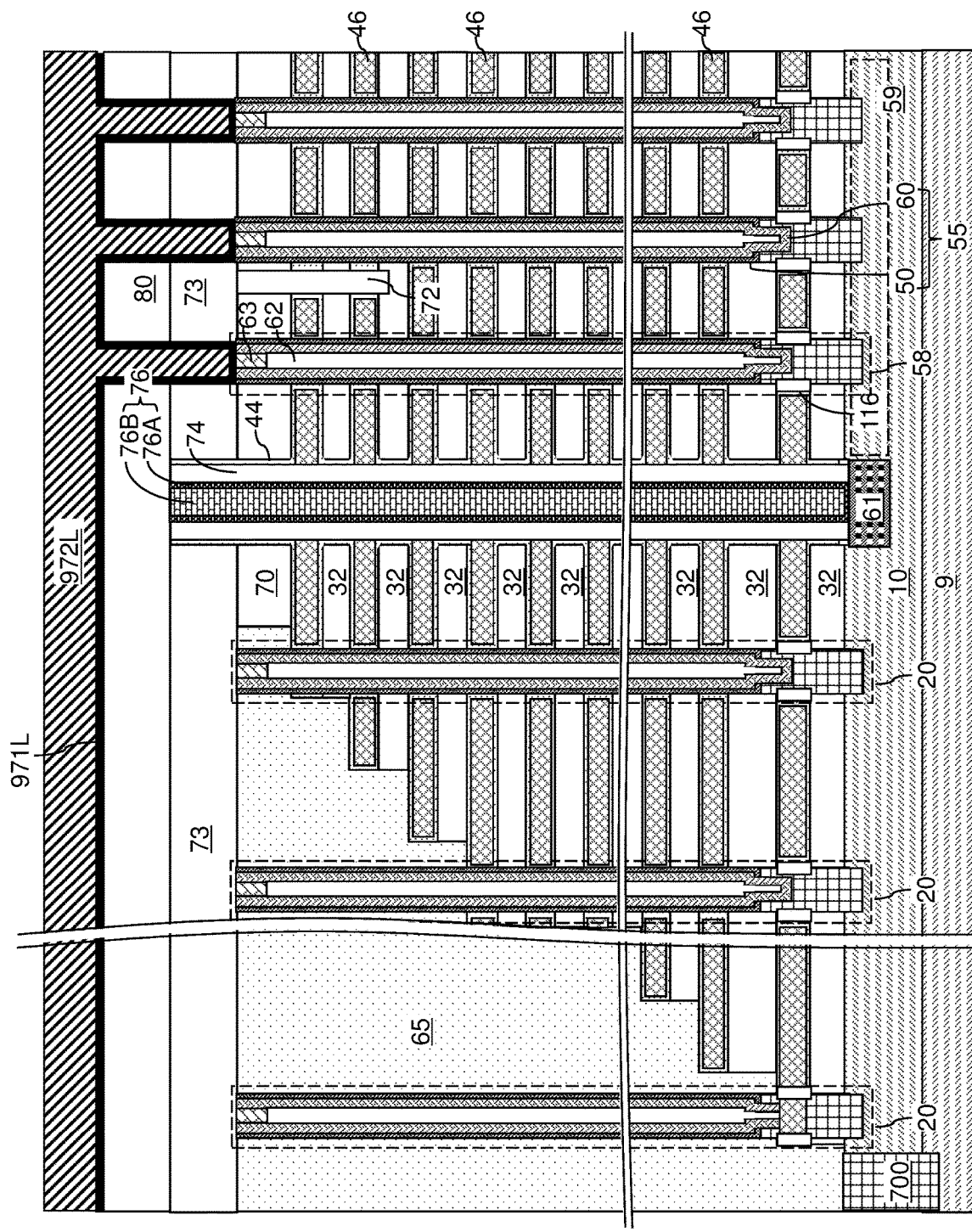
FIG. 22C is a vertical cross-sectional view of a region of the third exemplary structure within the die illustrated in FIGS. 22A and 22B.
Figure 22D:
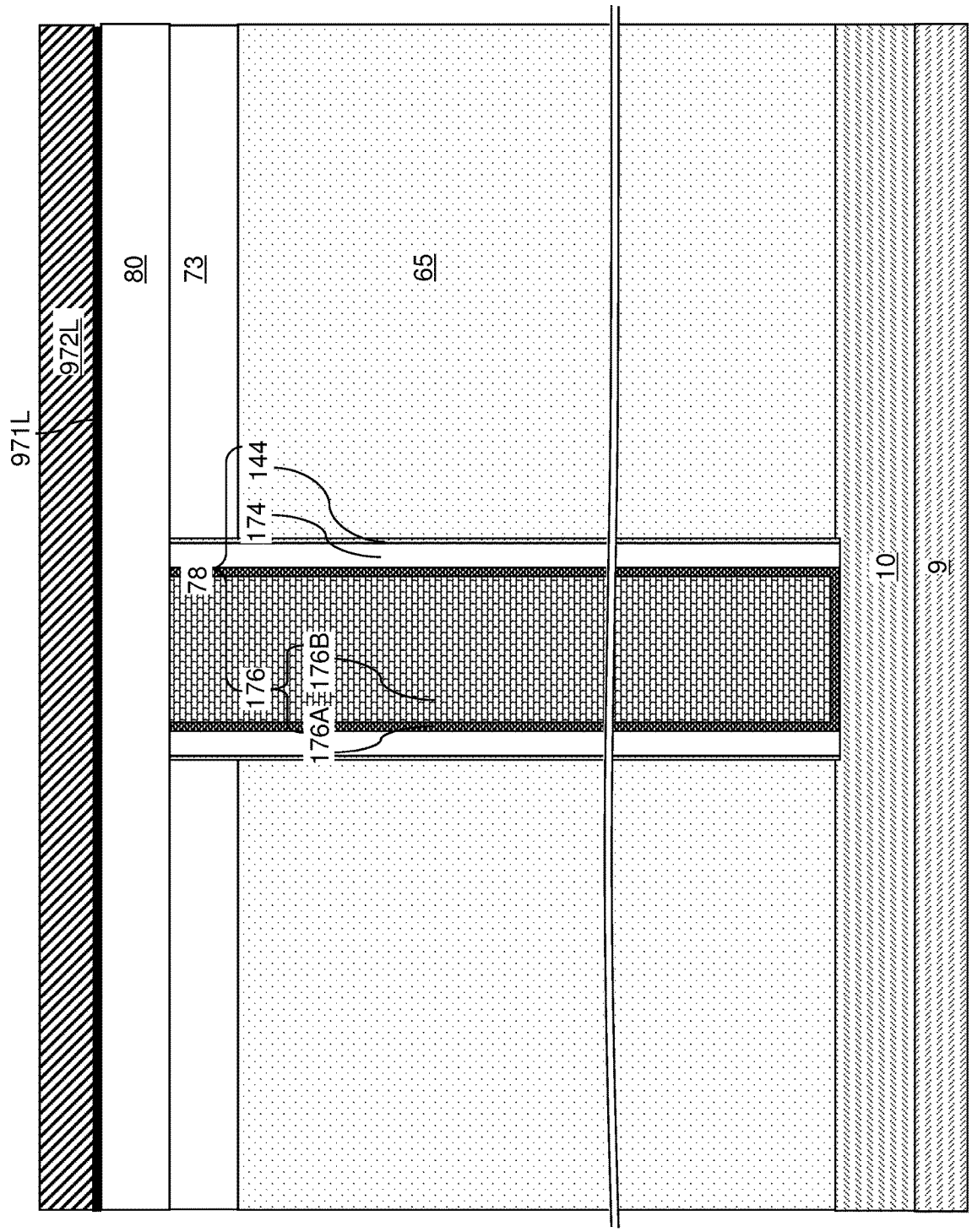
FIG. 22D is a vertical cross-sectional view of the third exemplary structure along the vertical plane D-D' of FIG. 22B.
Figure 22E:
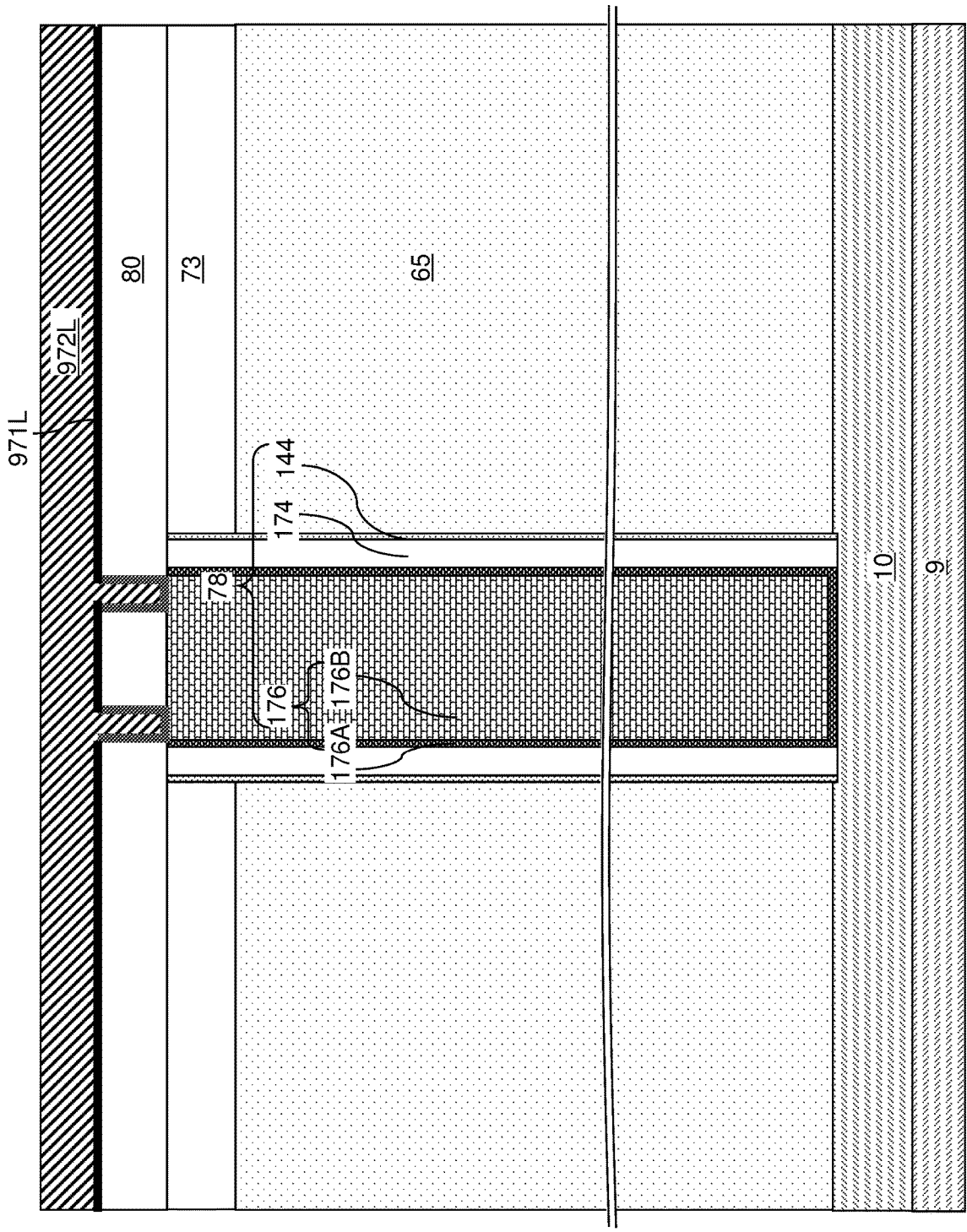
FIG. 22E is a vertical cross-sectional view of the third exemplary structure along the vertical plane E-E' of FIG. 22B.

Referring to FIGS. 22A-22E, a conductive hard mask layer 97 can be formed over the contact-level dielectric layer, on sidewalls of the dielectric material portions 65, on physically exposed surface segments of the semiconductor substrate (9, 10) in the kerf regions 902, and within each of the drain-contact via cavities 87 and the contact-level via cavities 287. FIG. 22A is a vertical cross-sectional view of the unit area UA of the wafer 1000 including the third exemplary structure after formation of a conductive hard mask layer 97 by deposition of at least one conductive material in the drain-contact via cavities 87 and the contact-level via cavities 287 according to an embodiment of the present disclosure. Various insets provide magnified views within a die. FIG. 22B is a top-down view of the unit area UA of the wafer 1000 of FIG. 22A. FIG. 22C is a vertical cross-sectional view of a region of the third exemplary structure within the die illustrated in FIGS. 22A and 22B. FIG. 22D is a vertical cross-sectional view of the third exemplary structure along the vertical plane D-D' of FIG. 22B. FIG. 22E is a vertical cross-sectional view of the third exemplary structure along the vertical plane E-E' of FIG. 22B.

Specifically, the conductive hard mask layer 97 can be formed over the semiconductor devices and the dielectric material portion 65 over the entire area of the wafer 1000. The conductive hard mask layer 97 may comprise a conductive nitride liner 971L including a conductive nitride material (such as TiN, TaN, WN, and/or MoN) and a metal layer 972L including a metal (such as W, Ti, Ta, W, Co, Ru, etc.) and/or a metal alloy. The conductive hard mask layer 97 may be deposited by a conformal or non-conformal deposition process provided that the top horizontal portions of the conductive hard mask layer 97 overlying the contact-level dielectric layer 80 is connected to bottom horizontal portions of the conductive hard mask layer 97 formed in the kerf regions 902 and contacting the top surface of the semiconductor substrate (9, 10) by vertically-extending portions of the conductive hard mask layer 97 located on sidewalls of the semiconductor dies 900 (which comprise sidewalls of the dielectric material portions 65). For example, the conductive hard mask layer 97 may be formed by chemical vapor deposition, physical vapor deposition, electroplating, and/or electroless plating. In one embodiment, the top horizontal portions of the conductive hard mask layer 97 overlying the contact-level dielectric layers 80 of the semiconductor dies 900 may have a thickness in a range from 20 nm to 400 nm, such as from 40 nm to 200 nm, although lesser and greater thicknesses may also be employed. In one embodiment, the conductive hard mask layer 97 continuously extends over sidewalls of the dielectric material portion 65 of each semiconductor die 900, and contacts a segment of a top surface of the semiconductor substrate (9, 10) located in a kerf region 902 that is located between the semiconductor die 900 and additional semiconductor dies 900 located on the semiconductor substrate (9, 10).

Figure 23A:
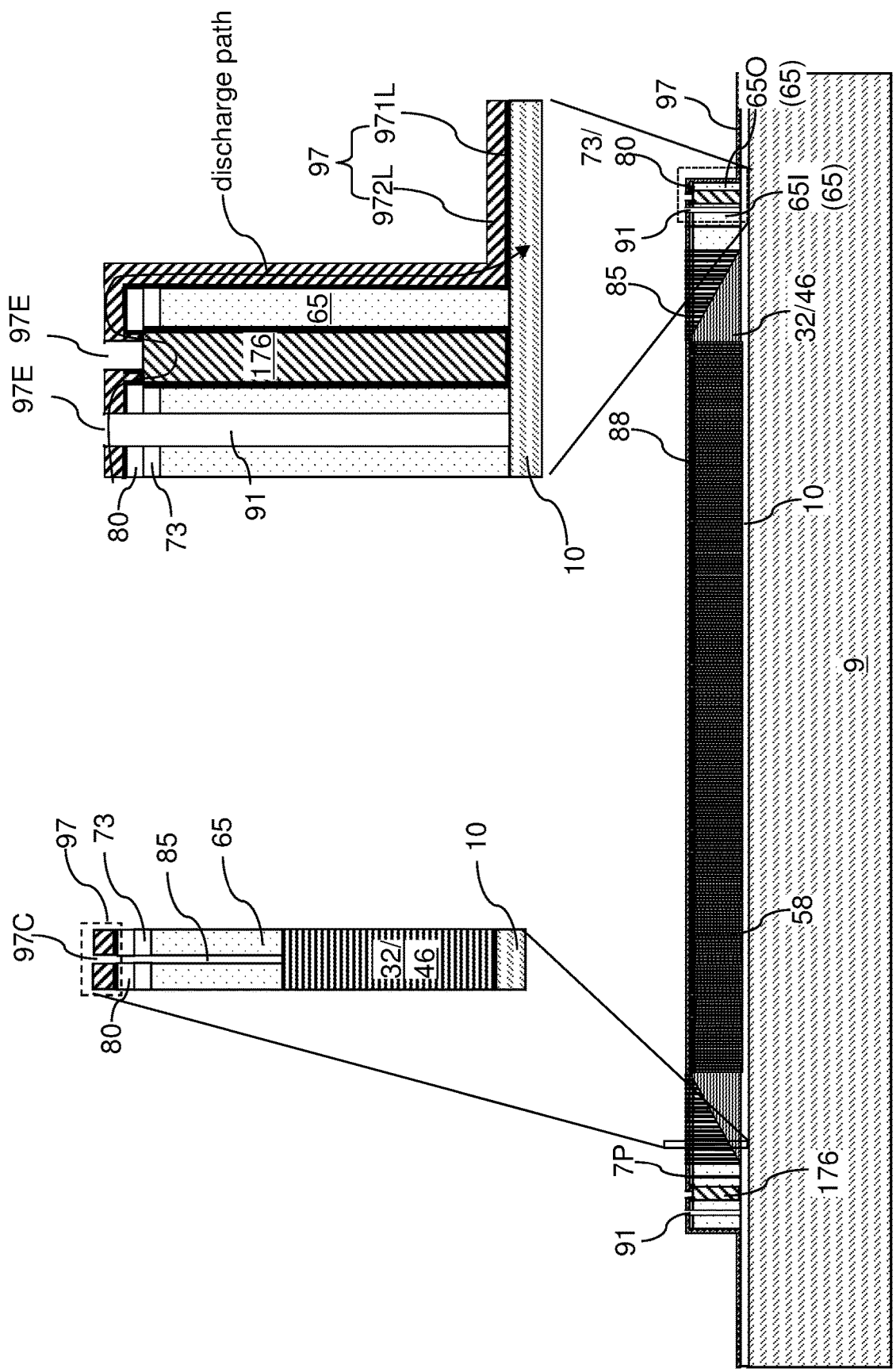
FIG. 23A is a vertical cross-sectional view of the unit area of the wafer including the third exemplary structure after patterning the conductive hard mask layer and by forming various via cavities and moat trenches according to an embodiment of the present disclosure. Various insets provide magnified views within a die.
Figure 23B:
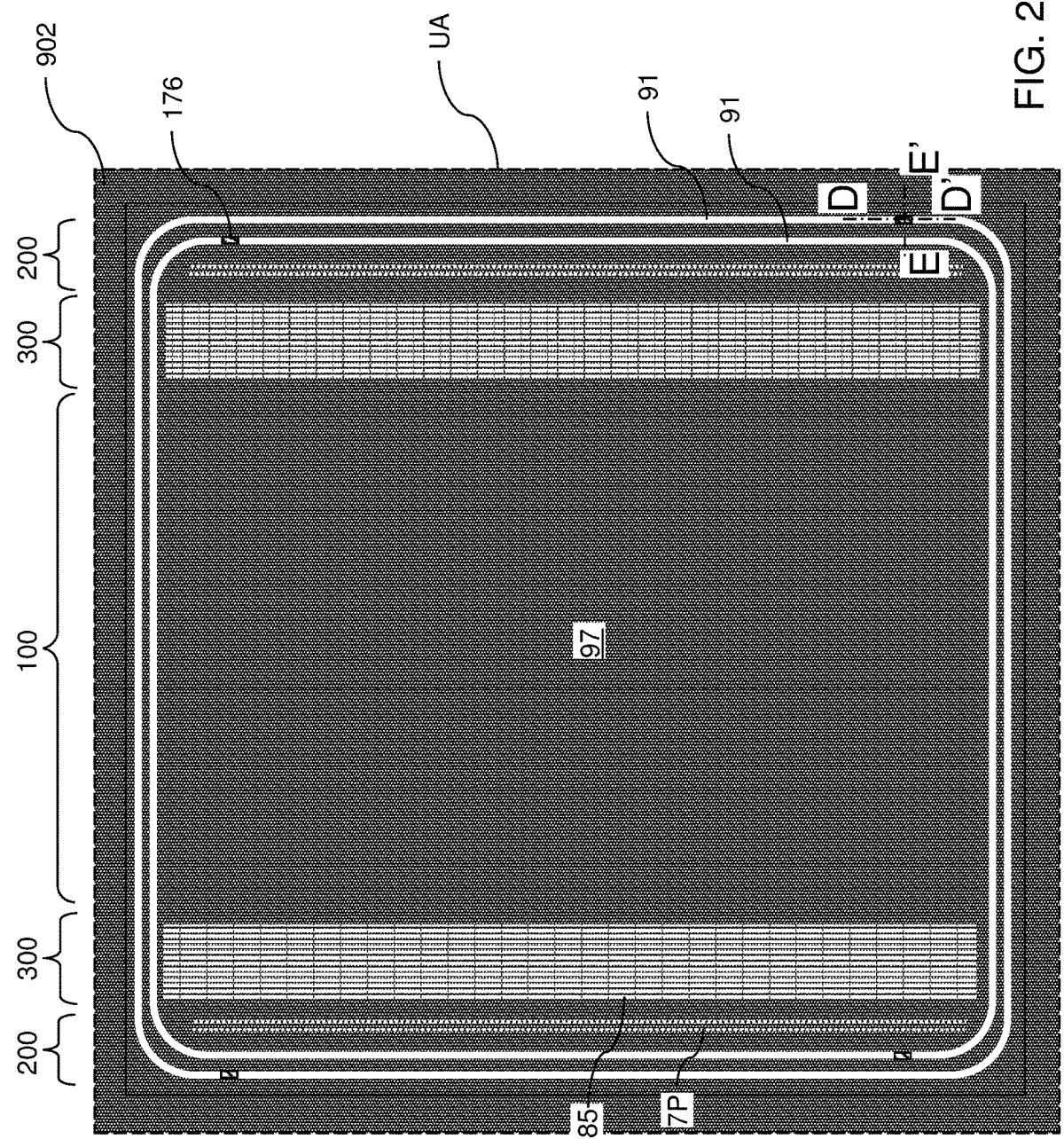
FIG. 23B is a top-down view of the unit area of the wafer of FIG. 23A.
Figure 23C:
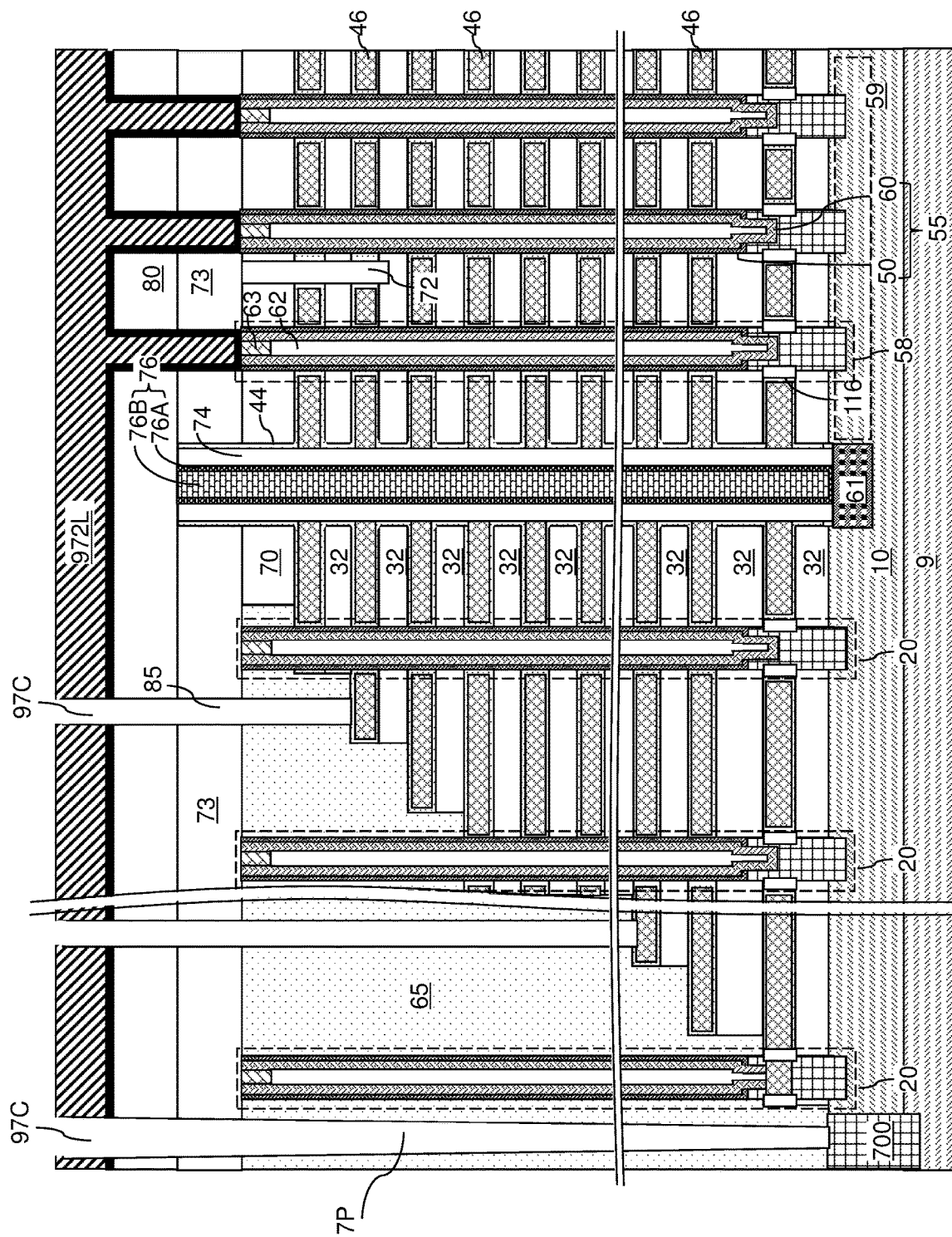
FIG. 23C is a vertical cross-sectional view of a region of the third exemplary structure within the die illustrated in FIGS. 23A and 23B.
Figure 23D:
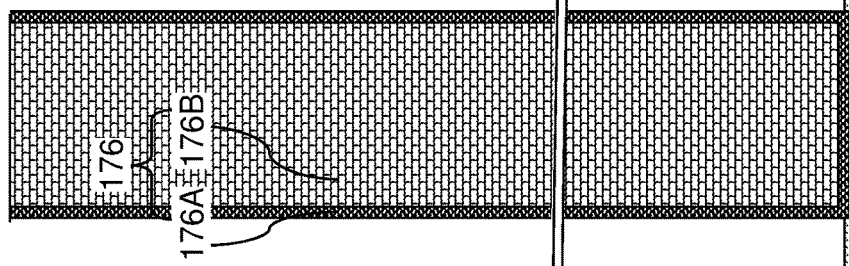
FIG. 23D is a vertical cross-sectional view of the third exemplary structure along the vertical plane D-D' of FIG. 23B.
Figure 23D:
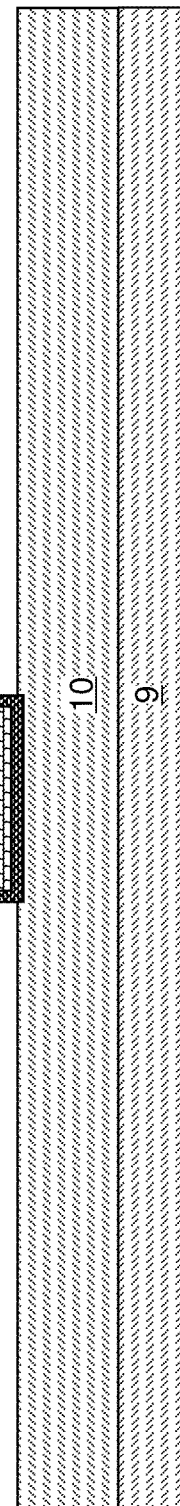
Figure 23E:
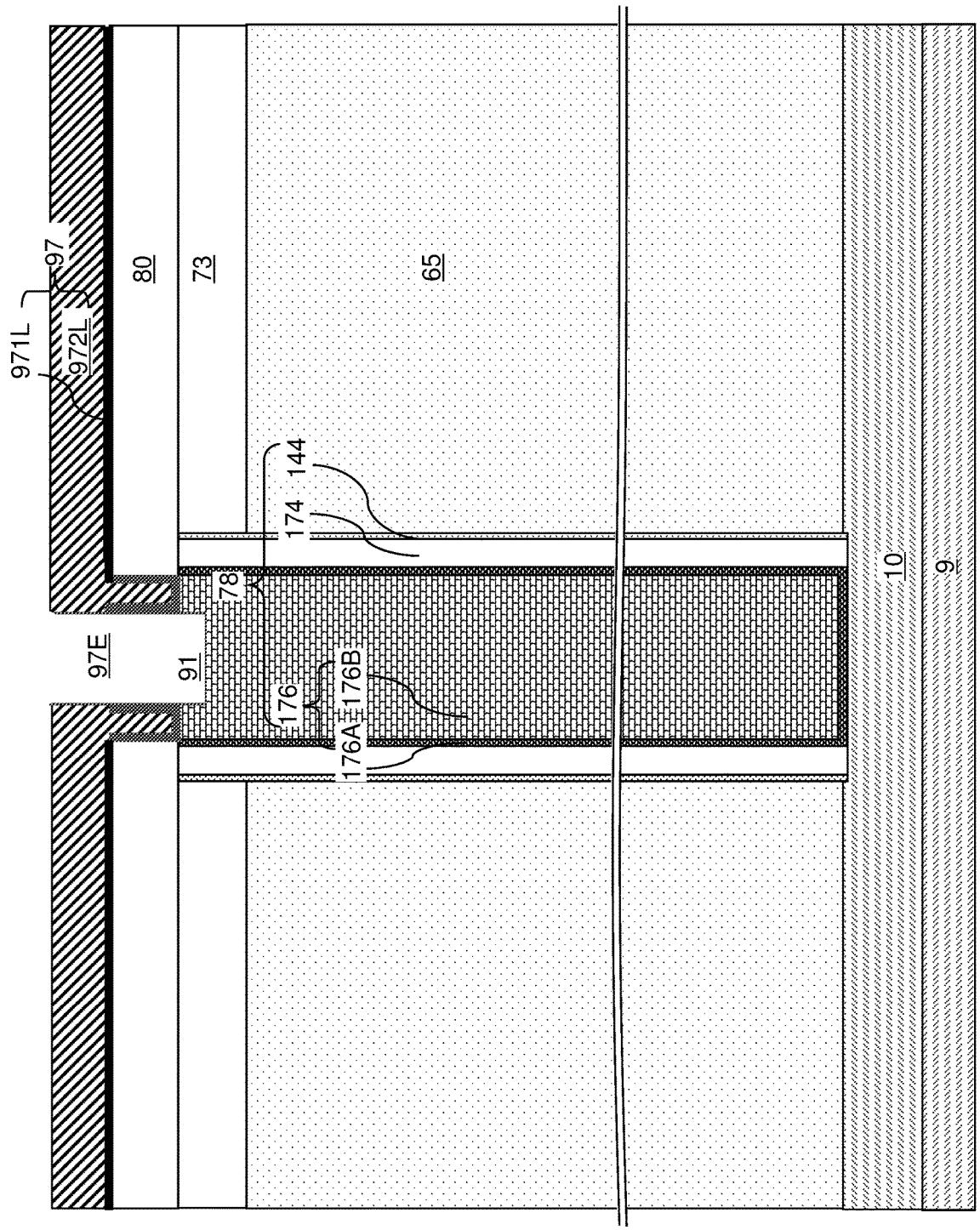
FIG. 23E is a vertical cross-sectional view of the third exemplary structure along the vertical plane E-E' of FIG. 23B.

Referring to FIGS. 23A-23E, the conductive hard mask layer 97 is patterned with openings, and the pattern of openings in the conductive hard mask layer 97 can be transferred into underlying dielectric material portions to form various via cavities (85, 7P) and moat trenches 91. FIG. 23A is a vertical cross-sectional view of the unit area UA of the wafer 1000 including the third exemplary structure after patterning the conductive hard mask layer 97 and by forming various via cavities and moat trenches according to an embodiment of the present disclosure. Various insets provide magnified views within a die. FIG. 23B is a top-down view of the unit area UA of the wafer 1000 of FIG. 23A. FIG. 23C is a vertical cross-sectional view of a region of the third exemplary structure within the die illustrated in FIGS. 23A and 23B. FIG. 23D is a vertical cross-sectional view of the third exemplary structure along the vertical plane D-D' of FIG. 23B. FIG. 23E is a vertical cross-sectional view of the third exemplary structure along the vertical plane E-E' of FIG. 23B.

A photoresist layer (not shown) may be applied over the conductive hard mask layer 97, and may be lithographically patterned to form various openings therein. The various openings in the photoresist layer may comprise discrete contact openings 97C overlying the stepped surfaces of the electrically conductive layers 46, and optionally also overlying the peripheral devices 700. According to an aspect of the present disclosure, at least one moat-shaped opening 97E can be formed in the photoresist layer along the entire periphery of the top surface of a respective horizontal top portion of the conductive hard mask layer 97. In one embodiment, the at least one moat-shaped opening may comprise a plurality of moat-shaped openings 97E that are nested among one another. A first anisotropic etch process may be performed to transfer the pattern of the openings (97C, 97E) in the photoresist layer through the conductive hard mask layer 97.

Openings can be formed through the conductive hard mask layer 97 underneath the openings (97C, 97E) in the photoresist layer. A subset of the contact openings 97C in the conductive hard mask layer 97 is formed over the stepped surfaces of the electrically conductive layers 46 and the peripheral devices 700. At least one moat-shaped opening 97E can be formed through the conductive hard mask layer 97 along a periphery of the dielectric material portion 65 in each semiconductor die 900. The at least one moat-shaped opening 97E is subsequently employed to define the area(s) of at least one edge seal structure, and thus, is herein referred to as at least one edge seal opening 97E. In one embodiment, each edge seal opening 97E encloses an inner region of the dielectric material portion 65 and overlies a respective conductive bridge structure (comprising a conductive pillar structure 176). According to an aspect of the present disclosure, each edge seal opening 97E within the conductive hard mask layer 97 extends between at least one pair of contact-level via cavities 287 that are filled with the conductive hard mask layer 97 (as illustrated in FIG. 23E). The set of contact openings 97C through the conductive hard mask layer 97 can be formed within an area surrounded by the at least one moat-shaped opening 97E in the conductive hard mask layer 97. Optionally, the photoresist layer may be removed, for example, by ashing.

The pattern of the openings (97C, 97E) in the conductive hard mask layer 97 can be transferred through underlying dielectric material portions by performing at least one second anisotropic etch process. In one embodiment, the pattern of all of the openings in the conductive hard mask layer 97 can be transferred through underlying material portions by a single second anisotropic etch process. Alternatively, at least one patterned photoresist layer may be employed to cover a respective subset of the openings in the conductive hard mask layer 97, and a plurality of second anisotropic etch processes may be performed to form a respective set of via cavities underneath a respective subset of the openings in the conductive hard mask layer 97 that is not masked by a respective patterned photoresist layer.

In an illustrative example, the various via cavities that are formed by the at least one second anisotropic etch process may comprise layer contact via cavities 85, peripheral contact via cavities 7P, and at least one moat trench 91. The drain-contact via cavities 87 are formed through the contact-level dielectric layer 80 and the capping dielectric layer 73 over a physically exposed top surface of a respective drain region 63. The layer contact via structures 85 are formed through the contact-level dielectric layer 80, the insulating cap layer 70, and the dielectric material portion 65 over a top surface of a respective electrically conductive layer 46. The peripheral contact via cavities 87 are formed through the contact-level dielectric layer 80, the insulating cap layer 70, and the dielectric material portion 65 over a physically exposed top surface of a respective node of the peripheral devices 700. The at least one moat trench 91 is formed through the contact-level dielectric layer 80, the insulating cap layer 70, and the dielectric material portion 65 over a physically exposed top surface of the semiconductor substrate (9, 10) and over at least one conductive pillar structure 176. A horizontal surface segment of each conductive pillar structure 176 may be vertically recessed relative to a horizontal plane including a bottom surface of the contact-level dielectric layer 80.

A set of contact via cavities (85, 7P) can be formed through the contact-level dielectric layer 80 down to top surfaces of electrically conductive nodes of the semiconductor devices in the semiconductor die 900 by performing the at least one second anisotropic etch process. The at least one second anisotropic etch process may etch materials of the contact-level dielectric layer 80, the insulating cap layer 70, and the dielectric material portion 65 selective to the semiconductor devices. According to an aspect of the present disclosure, at least one moat trench 91 can be formed through the dielectric material portion 65 within each semiconductor die 900 down to a top surface of the semiconductor substrate (9, 10) by performing an anisotropic etch process that etches a material of the dielectric material portion 65 underneath the moat-shaped openings 97E in the conductive hard mask layer 97. The width of each moat trench 91 may be in a range from 0.5 micron to 30 microns, such as from 1 micron to 15 microns, although lesser and greater lateral offset distances may also be employed. In on embodiment, the entirety of a region of the dielectric material portion 65 between the innermost one of the at least one moat trench 91 and the sidewalls of the semiconductor die 900 may be free of any semiconductor device.

According to an aspect of the present disclosure, each point within the conductive hard mask layer 97 is electrically connected to a surface a segment of the top surface of the semiconductor substrate (9, 10) through a respective electrically conductive discharge path located underneath the conductive hard mask layer 97 and forms a conductive bridge structure. For example, each point within a portion of the conductive hard mask layer 97 located within an area enclosed by the at least one moat-shaped opening in the conductive hard mask layer 97 is electrically connected to the semiconductor substrate (9, 10) through at least one conductive bridge structure comprising at least one conductive pillar structure 176. Thus, any electrical charge (e.g., electrons) that accumulates in the conductive hard mask layer 97 during the anisotropic etch process can be drained through a respective electric discharge path to the semiconductor substrate (9, 10). Therefore, arcing can be reduced or avoided during the one or more anisotropic etch processes that form the contact via cavities (85, 7P) and the at least one moat trench 91 in each memory die 900. Electrical grounding of the conductive hard mask layer 97 is provided throughout the entirety of the conductive hard mask layer 97 according to an aspect of the present disclosure, and as such, arcing can be entirely prevented during the at least one second anisotropic etch process.

A top portion of each conductive pillar structure 176 may be collaterally recessed between neighboring portions of a respective moat trench 91. As described above with respect to the prior embodiment, each moat trench 91 may comprise at least one deep trench section vertically extending from a top surface of the contact-level dielectric layer 80 to a top surface of the semiconductor substrate (9, 10) and at least one shallow trench section overlying a recessed top surface of a respective conductive pillar structure 176. Thus, each moat trench 91 may continuously extend around, and encircle, an area of a semiconductor die 900 without a gap. As such, each moat trench 91 may be a continuous moat trench comprising at least one deep trench section that vertically extends down to a top surface of the semiconductor substrate (9, 10) and at least one shallow trench section that overlie a horizontal surface of the conductive bridge structure (comprising a conductive pillar structure 176) that is recessed below a horizontal plane including a top surface of the contact-level dielectric layer 80.

Generally, each of the at least one conductive bridge structure (such as the at least one conductive pillar structure 176) is electrically isolated from the semiconductor substrate (9, 10) prior to formation of the conductive hard mask layer 97, and is then electrically connected to the semiconductor substrate (9, 10) through the conductive hard mask layer 97 upon formation of the conductive hard mask layer 97 throughout each of the at least one second anisotropic etch process. Electrical charges are discharged from each portion in the conductive hard mask layer 97 into the semiconductor substrate (9, 10) during each of the at least one second anisotropic etch process. In one embodiment, the conductive hard mask layer 97 is formed over sidewalls of the dielectric material portion 65 and on a top surface of the semiconductor substrate (9, 10). In one embodiment, the at least one second anisotropic etch process etches a material of the dielectric material portion 65 selective to materials of the conductive bridge structure (comprising a conductive pillar structure 176), the conductive hard mask layer 97, and the semiconductor substrate (9, 10). Portions of the conductive pillar structures 176 that are not masked by the conductive hard mask layer 97 may be collaterally recessed during the at least one second anisotropic etch process. The recess depth of the vertically recesses top surfaces of the conductive plates 188 may be in a range from 1% to 50%, such as from 5% to 25%, of the sum of the thicknesses of the capping dielectric layer 73 and the contact-level dielectric layer 80. The conductive hard mask layer 97 may be collaterally partially removed during the at least one second anisotropic etch process.

Each conductive bridge structure (comprising a conductive pillar structure 176) connects the inner portion of the conductive hard mask layer 97 located inside an inner periphery of the at least one edge seal opening 97E to an outer portion of the conductive hard mask layer 97 located outside an outer periphery of the at least one edge seal opening 97E during and after the anisotropic etch process. The conductive hard mask layer 97 may be subsequently removed, for example, by a selective isotropic recess etch process, such as a wet etch process.

Figure 24A:
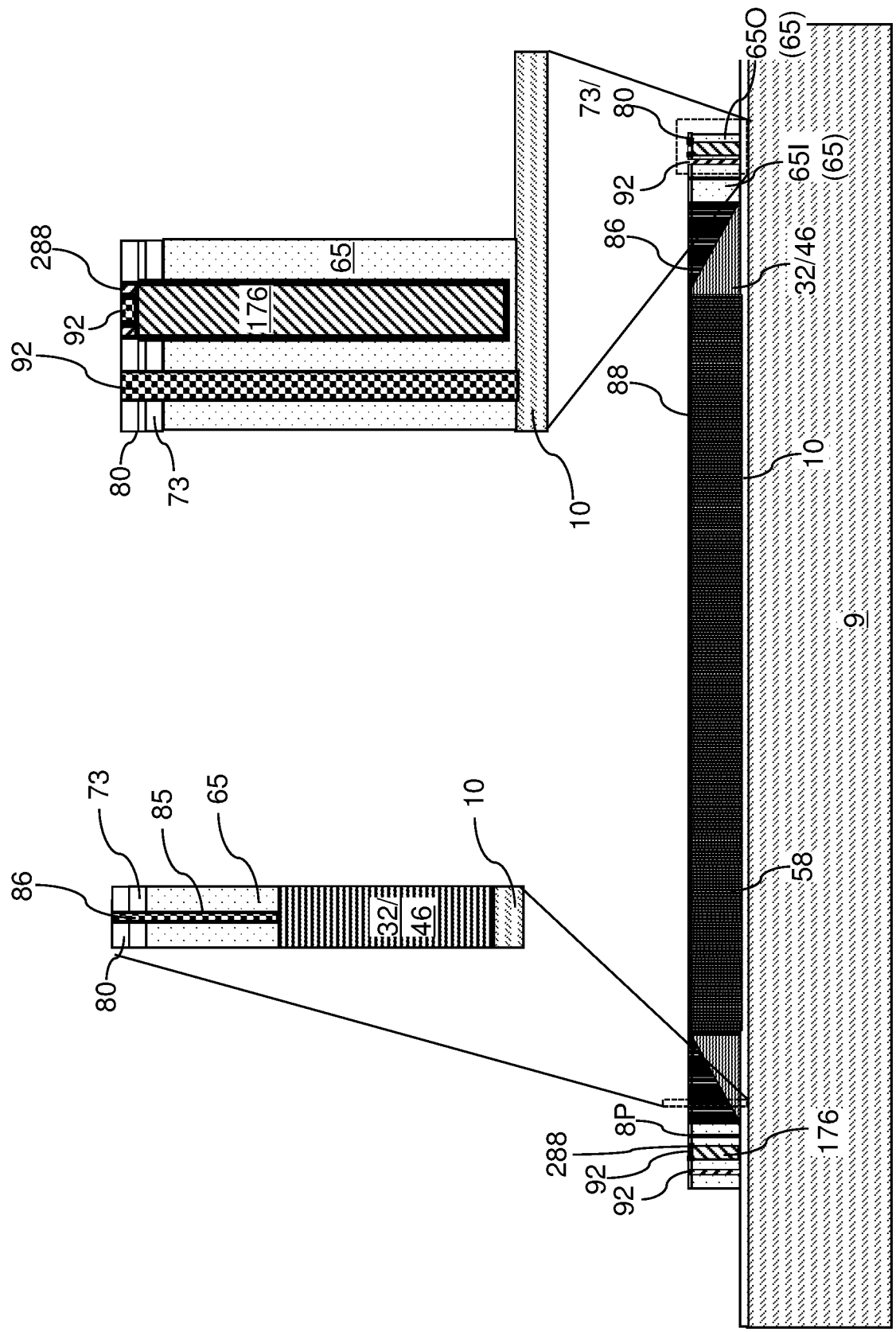
FIG. 24A is a vertical cross-sectional view of the unit area of the wafer including the third exemplary structure after formation various metal via structures and conductive edge seal structures according to an embodiment of the present disclosure. Various insets provide magnified views within a die.
Figure 24B:
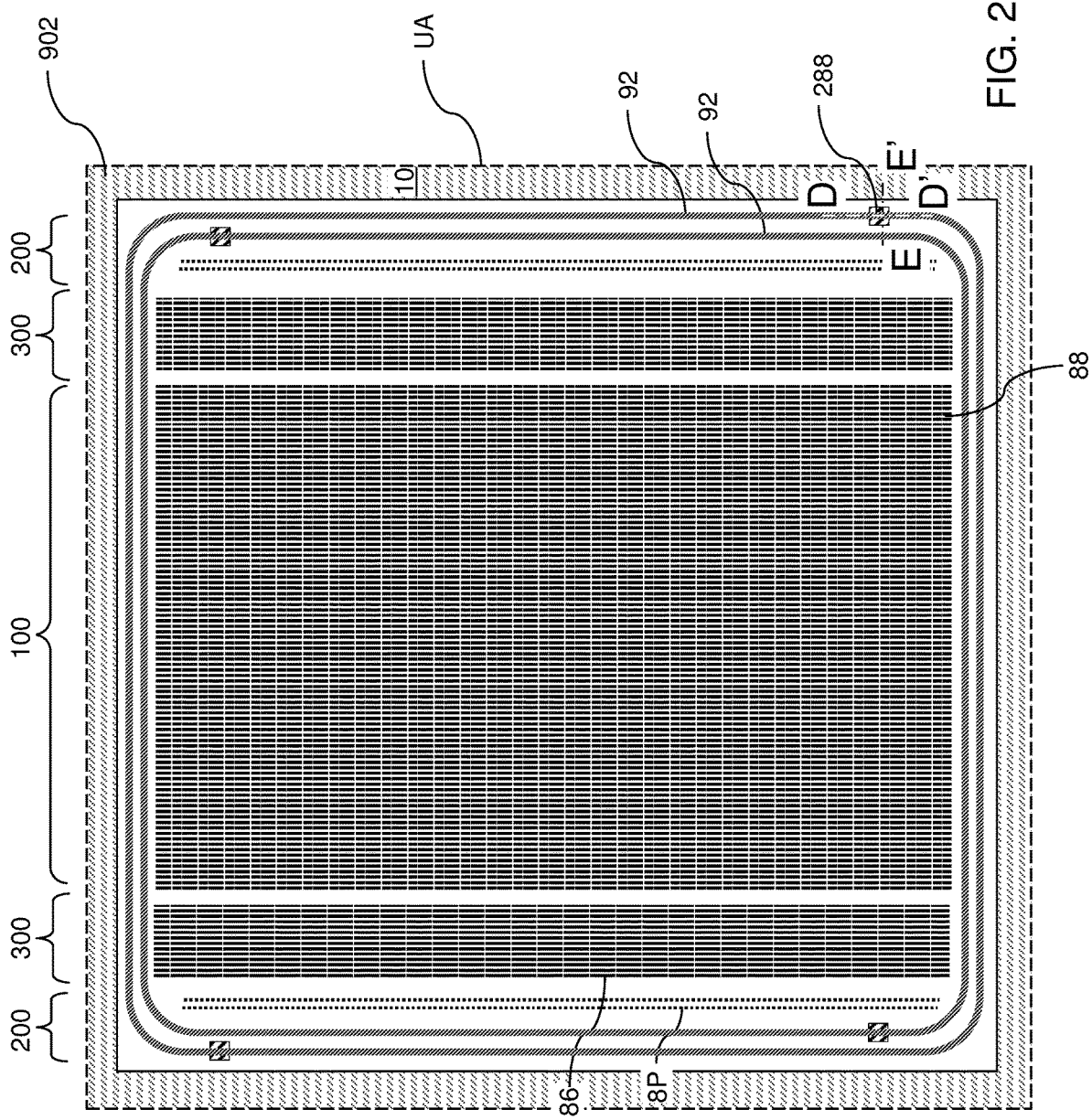
FIG. 24B is a top-down view of the unit area of the wafer of FIG. 24A.
Figure 24C:
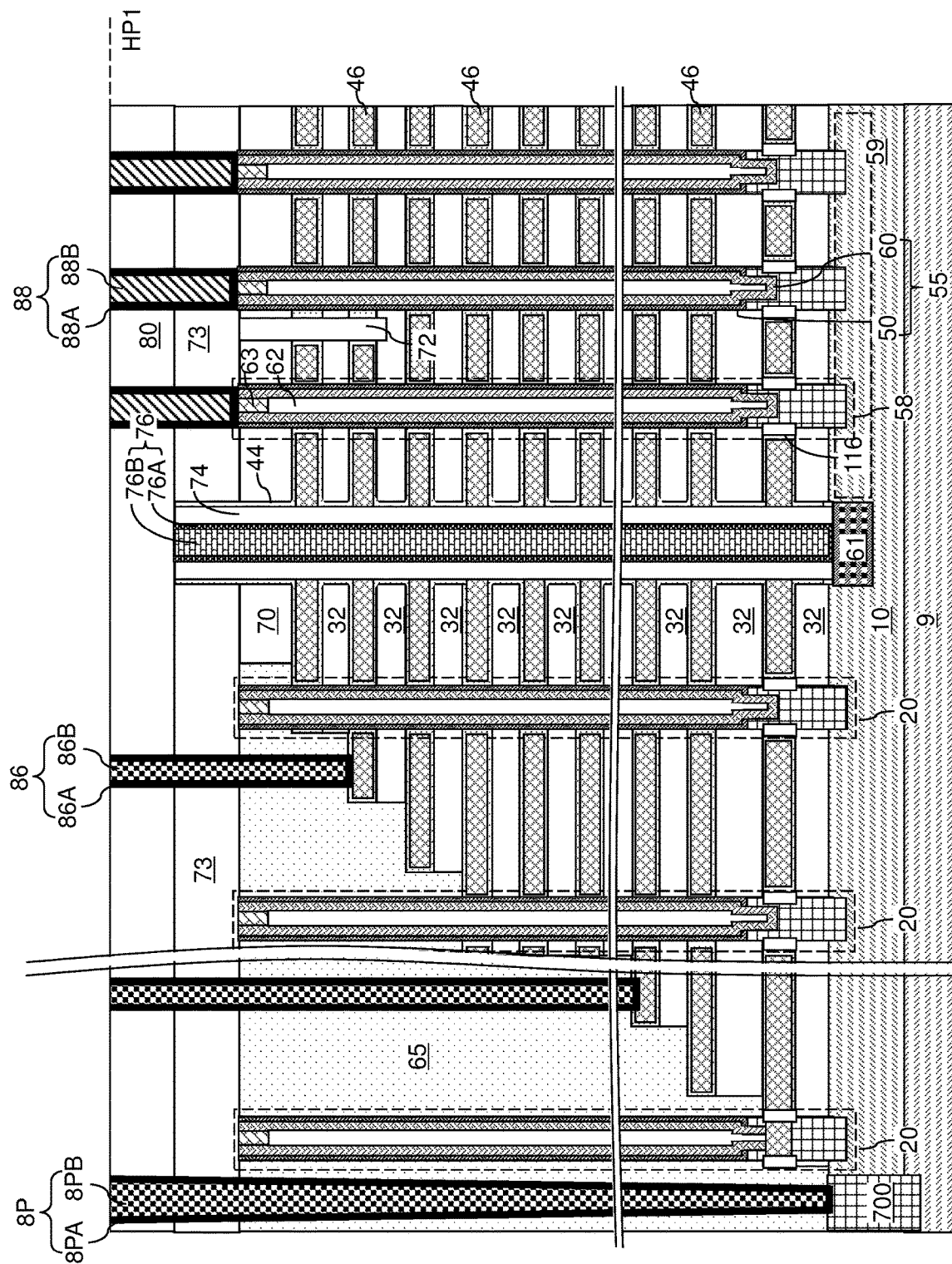
FIG. 24C is a vertical cross-sectional view of a region of the third exemplary structure within the die illustrated in FIGS. 24A and 24B.
Figure 24D:
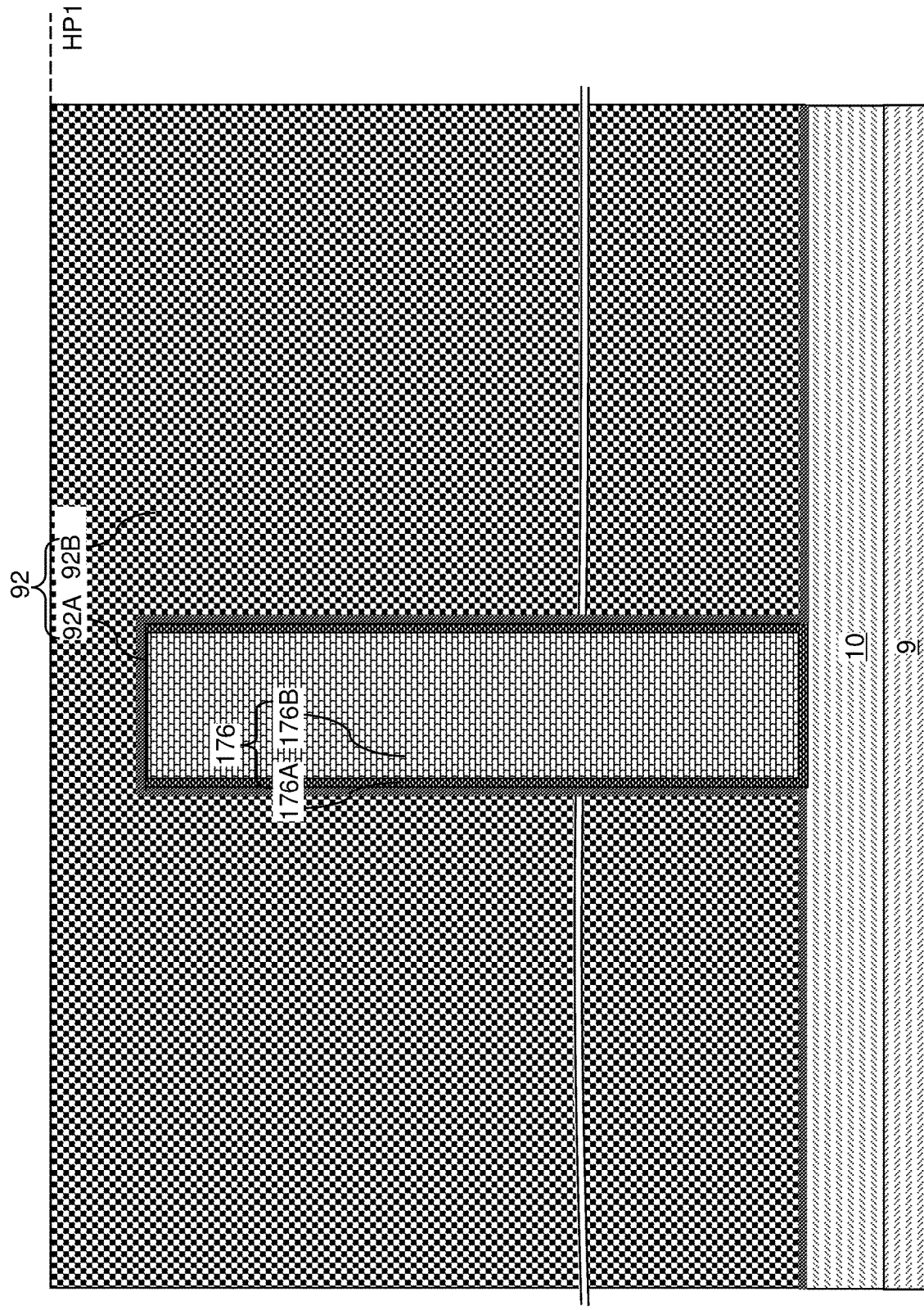
FIG. 24D is a vertical cross-sectional view of the third exemplary structure along the vertical plane D-D' of FIG. 24B.
Figure 24E:
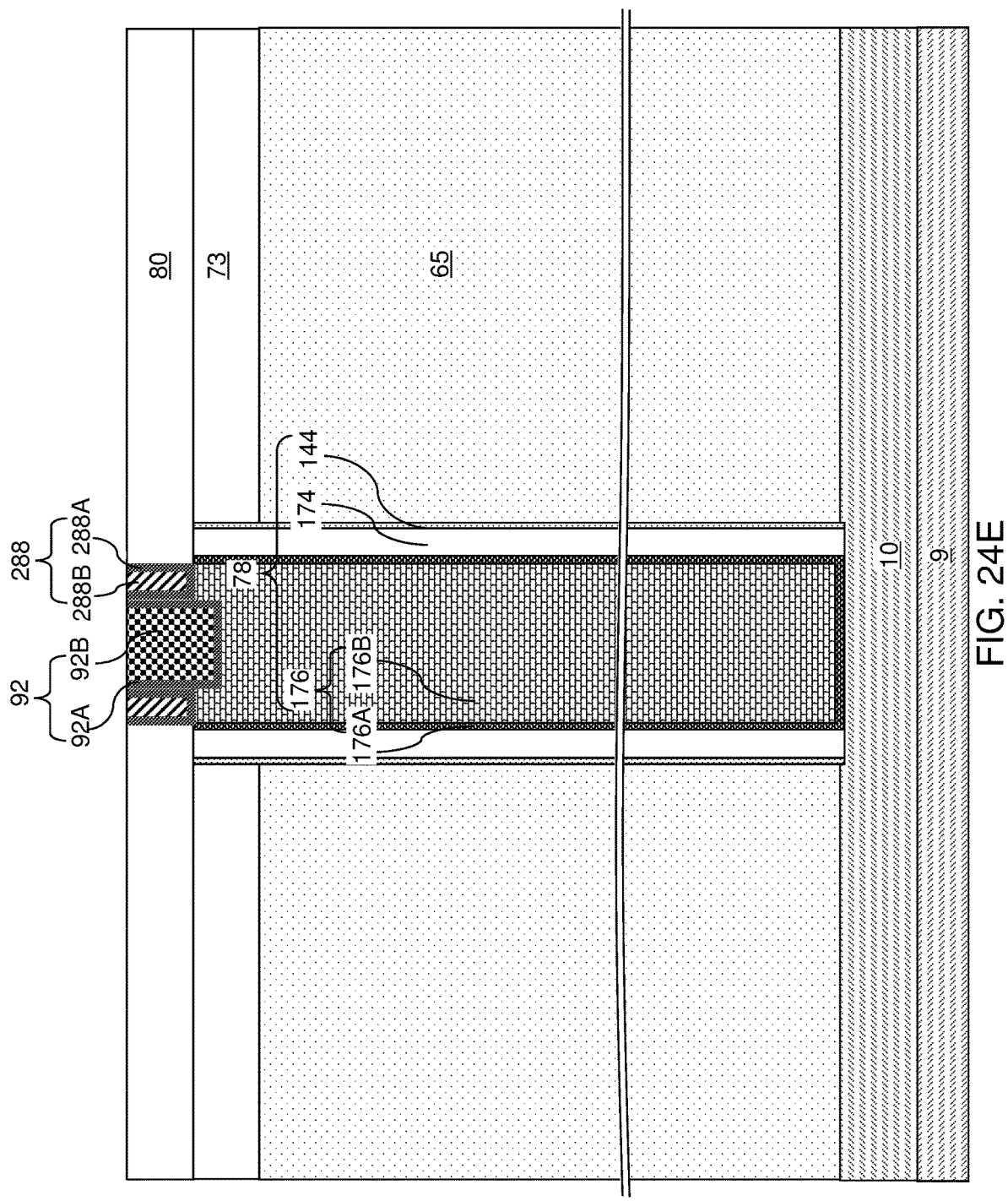
FIG. 24E is a vertical cross-sectional view of the third exemplary structure along the vertical plane E-E' of FIG. 24B.

Referring to FIGS. 24A-24E, various contact via structures (86, 8P) and at least one conductive edge seal structure 92 can be formed in the various contact via cavities (85, 7P) and the at least one moat trench 91. FIG. 24A is a vertical cross-sectional view of the unit area UA of the wafer 1000 including the third exemplary structure after formation various metal via structures (86, 8P) and conductive edge seal structures 92 according to an embodiment of the present disclosure. Various insets provide magnified views within a semiconductor die. FIG. 24B is a top-down view of the unit area UA of the wafer 1000 of FIG. 24A. FIG. 24C is a vertical cross-sectional view of a region of the third exemplary structure within the die illustrated in FIGS. 24A and 24B. FIG. 24D is a vertical cross-sectional view of the third exemplary structure along the vertical plane D-D' of FIG. 24B. FIG. 24E is a vertical cross-sectional view of the third exemplary structure along the vertical plane E-E' of FIG. 24B.

Specifically, at least one conductive material is deposited in the various contact via cavities (85, 7P) and the at least one moat trench 91. In one embodiment, the at least one conductive material may comprise a conductive nitride liner material and a conductive fill material which may be a metal or an intermetallic alloy. For example, the conductive nitride liner material may comprise TiN, TaN, WN, and/or MoN. The conductive fill material may comprise W, Ti, Ta, Mo, Ru, Co, Cu, or alloys thereof. The at least one conductive material may be deposited, for example, by chemical vapor deposition, physical vapor deposition, electroplating, and/or electroless plating. Excess portions of the at least one conductive material and the metal layer 97 may be removed from above the horizontal plane including the top surface of the contact-level dielectric layer 80 by a planarization process, which may employ a recess etch process and/or a chemical mechanical polishing process.

Each remaining portion of the at least one conductive material filling a layer contact via cavity 85 constitutes a layer contact via structure 86. Each remaining portion of the at least one conductive material filling a peripheral contact via cavity 7P constitutes an optional peripheral contact via structure 8P. Each remaining portion of the at least one conductive material filling a moat trench 91 constitutes a conductive edge seal structure 92. Each remaining portion of the metal layer 97 filling the contact-level via cavities 287 constitute contact-level via structures 288 contacting a respective one of the conductive pillar structures 176. Each remaining portion of the metal layer 97 filling the drain-contact via cavities 87 constitute drain-contact via structures 88.

In one embodiment, each of the contact via structures (86, 8P) comprises a conductive contact liner (86A, 8PA) and a conductive fill material portion (86B, 8PB) embedded within the conductive contact liner (86A, 8PA). Each conductive edge seal structure 92 comprises a conductive edge seal liner 92A and a conductive edge seal fill material portion 92B embedded within the conductive edge seal liner 92A. In one embodiment, the conductive contact liners (86A, 8PA) and the conductive edge seal liner 92A have a first conductive composition (i.e., the material composition of the conductive nitride liner material) and have a same thickness, and the conductive edge seal fill material portions 92B and the conductive fill material portion (86B, 8PB) have a second conductive composition (i.e., the material composition of the conductive fill material).

In one embodiment, an inner dielectric material portion 65I laterally surrounds the semiconductor devices of each semiconductor die 900. Each conductive edge seal structure 92 laterally surrounds the inner dielectric material portion 65I, vertically extends from the semiconductor substrate (9, 10) at least to a horizontal plane including a topmost surface of the inner dielectric material portion 65I, and may have straight sidewalls that laterally extend parallel to a most proximal one of outer sidewalls of the semiconductor die 900. In one embodiment, an outer dielectric material portion 65O laterally surrounds each conductive edge seal structure 92.

In one embodiment, outer sidewalls of the outer dielectric material portion 65O are the outer sidewalls of the semiconductor die 900. In one embodiment, the outer dielectric material portion 65O is not in direct contact with any of the semiconductor devices in the semiconductor die 900.

In one embodiment, the semiconductor die 900 comprises metal interconnect structures, the outer dielectric material portion 65O is not in direct contact with any of the metal interconnect structures, and all of the metal interconnect structures are laterally surrounded by the at least one conductive edge seal structure 92. In one embodiment, the semiconductor die 900 comprises a contact-level dielectric layer 80 overlying the semiconductor devices, the inner dielectric material portion 65I, and the outer dielectric material portion 65O, wherein at least one the conductive edge seal structure 92 vertically extends through the contact-level dielectric layer 80 and the dielectric material portions (65I, 65O).

In one embodiment, the semiconductor die 900 comprises contact via structures (88, 86, 8P) vertically extending through the contact-level dielectric layer 80 and contacting top surfaces of electrically conductive nodes of the semiconductor devices and having top surfaces that are located within a same horizontal plane as a top surface of the conductive edge seal structure 92. In one embodiment, the semiconductor devices comprise an alternating stack of insulating layers 32 and electrically conductive layers 46, and memory opening fill structures 58 located within memory openings 49 that vertically extend through the alternating stack and comprising a vertical semiconductor channel 60 and a respective vertical stack of memory elements. In one embodiment, each of the memory opening fill structures 58 comprises a NAND string, the electrically conductive layers 46 comprise word lines of the NAND strings, and the electrically conductive nodes of the semiconductor devices comprise the word lines. In some embodiments, the conductive hard mask layer 97 may be removed after the processing steps of FIGS. 24A-24E during formation of the at least one conductive edge seal structure 92.

Referring to FIGS. 1-11C and 19A-24E and according to various embodiments of the present disclosure, a semiconductor die 900 is provided, which comprises: semiconductor devices located over a semiconductor substrate (9, 10); an inner dielectric material portion 65I laterally surrounding the semiconductor devices; a contact-level dielectric layer 80 overlying the semiconductor devices and the inner dielectric material portion 65I; a conductive bridge structure (comprising a conductive pillar structure 176 and contact-level via structures 288) having at least one top surface located within a horizontal plane including a top surface of the contact-level dielectric layer 80; a conductive edge seal structure 92 that laterally surrounds the inner dielectric material portion 65I, vertically extends from the semiconductor substrate (9, 10) to the horizontal plane including the top surface of the contact-level dielectric layer 80, and extending over and contacting at least one surface of the conductive bridge structure (176, 288); and an outer dielectric material portion 65O laterally surrounding the conductive edge seal structure 92.

In one embodiment, the conductive edge seal structure 92 comprises: at least one wall portion (which fills a respective deep trench segment of a moat trench 91) vertically extending from the semiconductor substrate (9, 10) to the horizontal plane including the top surface of the contact-level dielectric layer 80; and a connection portion (which fills a respective shallow trench segment of the moat trench 91) overlying the conductive bridge structure (comprising a conductive pillar structure 176).

In one embodiment, the semiconductor die 900 comprises contact via structures (88, 86, 8P) vertically extending through the contact-level dielectric layer 80 and contacting electrically conductive nodes of the semiconductor devices and having top surfaces that are located within a same horizontal plane as a top surface of the conductive edge seal structure 92. In one embodiment, the conductive edge seal structure 92 comprises a conductive edge seal liner 92A and a conductive edge seal fill material portion 92B embedded within the conductive edge seal liner 92A; each of the contact via structures (88, 86, 8P) comprises a conductive contact liner (88A, 86A, 8PA) and a conductive fill material portion (88B, 86B, 8PB) embedded within the conductive contact liner (88A, 86A, 8PA); the conductive contact liner (88A, 86A, 8PA) and the conductive edge seal liner 92A have a first conductive composition and have a same thickness; and the conductive edge seal fill material portion 92B and the conductive fill material portion (88B, 86B, 8PB) have a second conductive composition.

In one embodiment, the semiconductor devices comprise: an alternating stack of insulating layers 32 and electrically conductive layers 46; and memory opening fill structures 58 located within memory openings 49 that vertically extend through the alternating stack and comprising a respective vertical semiconductor channel 60 and a vertical stack of memory elements (e.g., portions of layer 54). In one embodiment, each of the memory opening fill structures 58 comprises a NAND string; the electrically conductive layers 46 comprise word lines of the NAND strings; and the electrically conductive nodes of the semiconductor devices comprise the word lines.

The various embodiments of the present disclosure may be employed to reduce or eliminate arcing during at least one anisotropic etch process that employs a conductive hard mask layer 97 as an etch mask to form various via cavities in semiconductor dies 900 by providing electrically conductive paths to a semiconductor substrate (9, 10).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of making a semiconductor structure, comprising:
    forming a semiconductor die including semiconductor devices and a dielectric material portion over a semiconductor substrate, wherein the dielectric material portion laterally surrounds the semiconductor devices;
    forming a conductive hard mask layer over the semiconductor devices and the dielectric material portion;
    forming a set of peripheral discrete openings through the conductive hard mask layer along a periphery of the dielectric material portion;
    forming a set of peripheral discrete via cavities through the dielectric material portion down to a top surface of the semiconductor substrate by performing an anisotropic etch process that etches a material of the dielectric material portion underneath the set of peripheral discrete openings, wherein the peripheral discrete via cavities are laterally spaced apart from each other by an unetched portion of the dielectric material portion;
    forming a continuous moat trench that laterally surrounds an inner region of the dielectric material portion by isotropically expanding the set of peripheral discrete via cavities and merging the set of peripheral discrete via cavities into the continuous moat trench; and
    forming a conductive edge seal structure by filling the continuous moat trench with at least one conductive material.

2. The method of claim 1, wherein:
    sidewalls of the semiconductor die comprise sidewalls of the dielectric material portion that are exposed to a kerf region located between the semiconductor die and at least one of an edge of the semiconductor substrate or an additional semiconductor die located over the semiconductor substrate; and
    a region of the dielectric material portion located between the continuous moat trench and the sidewalls of the semiconductor die is free of any semiconductor device.

3. The method of claim 1, wherein all sidewall surfaces of the set of peripheral discrete via cavities are dielectric surfaces.

4. The method of claim 1, further comprising forming a contact-level dielectric layer over the semiconductor devices and the dielectric material portion, wherein the set of peripheral discrete via cavities is formed through the contact-level dielectric layer.

5. The method of claim 4, further comprising:
    forming a set of contact openings through the conductive hard mask layer within an area surrounded by the set of peripheral discrete openings; and
    forming a set of contact via cavities through the set of contact openings and the contact-level dielectric layer down to top surfaces of electrically conductive nodes of the semiconductor devices by performing the anisotropic etch process, wherein the anisotropic etch process etches a material of the contact-level dielectric layer selective to the semiconductor devices.

6. The method of claim 5, wherein the semiconductor devices comprise:
    an alternating stack of insulating layers and electrically conductive layers; and
    memory opening fill structures located within memory openings that vertically extend through the alternating stack and comprising a respective vertical semiconductor channel and a respective vertical stack of memory elements.

7. The method of claim 6, wherein:
    each of the memory opening fill structures comprises a NAND string;
    the electrically conductive layers comprise word lines of the NAND strings; and
    the electrically conductive nodes of the semiconductor devices comprise the word lines.

8. The method of claim 1, wherein a maximum nearest neighbor distance within the peripheral discrete via cavities is less than a maximum lateral dimension of each peripheral discrete via cavity within the set of peripheral discrete via cavities.

9. The method of claim 1, wherein the continuous moat trench comprises:
    a laterally-undulating outer sidewall having horizontally-concave outer surface segments that are adjoined to each other; and
    a laterally-undulating inner sidewall having horizontally-concave inner surface segments that are adjoined to each other.

10. The method of claim 1, wherein the conductive hard mask layer continuously extends over sidewalls of the dielectric material portion and contacts a segment of a top surface of the semiconductor substrate located in a kerf region that is located between the semiconductor die and at least one of an edge of the semiconductor substrate or an additional semiconductor die located on the semiconductor substrate.

11. The method of claim 10, wherein each point within the conductive hard mask layer is electrically connected to a surface the segment of the top surface of the semiconductor substrate through a respective electrically conductor path located entirely within the conductive hard mask layer.

12. The method of claim 1, further comprising removing the conductive hard mask layer prior to, during or after formation of the conductive edge seal structure.

* * * * *